United States Patent

Toda

[11] Patent Number: 5,867,432
[45] Date of Patent: Feb. 2, 1999

[54] CLOCK CONTROL CIRCUIT

[75] Inventor: Haruki Toda, Yokohama, Japan

[73] Assignee: Kabushiki Kaisha Toshiba, Tokyo, Japan

[21] Appl. No.: 839,037

[22] Filed: Apr. 23, 1997

[51] Int. Cl.[6] ................................................. G11C 7/00
[52] U.S. Cl. ............. 365/194; 365/189.04; 365/189.05; 327/276; 327/278; 327/292
[58] Field of Search ............................... 365/194, 189.04, 365/189.05, 189.08; 327/176, 270, 276, 278, 286, 290, 292, 293, 297

[56] References Cited

U.S. PATENT DOCUMENTS

| | | | |
|---|---|---|---|
| 5,361,277 | 11/1994 | Grover | 375/107 |
| 5,367,490 | 11/1994 | Akimoto et al. | 365/194 |
| 5,376,849 | 12/1994 | Dickol et al. | 327/278 |
| 5,566,129 | 10/1996 | Nakashima et al. | 365/233.5 |
| 5,602,798 | 2/1997 | Sato et al. | 365/233 |
| 5,684,424 | 11/1997 | Felix et al. | 327/293 |

*Primary Examiner*—David Nelms
*Assistant Examiner*—Hien Nguyen
*Attorney, Agent, or Firm*—Loeb & Loeb LLP

[57] ABSTRACT

An external clock signal CK is input to a buffer, which generates an internal clock signal CLK having a skew of D1 with respect to the external clock signal CK. The internal clock signal is input first to a delay circuit which has a delay time A, then to a delay array which provides a delay time D2, and finally to a delay circuit which has a delay time of D2. The delay circuit generates a corrected internal clock signal CK' which is synchronous with the external clock signal CK. The delay array is composed of delay units, each having a state-holding section. The state-holding section of any delay unit that has passed a forward pulse is set in a predetermined state. Once its state-holding section is set in the predetermined state, the delay unit provides a correct delay time of $2 \times \Delta$.

26 Claims, 32 Drawing Sheets

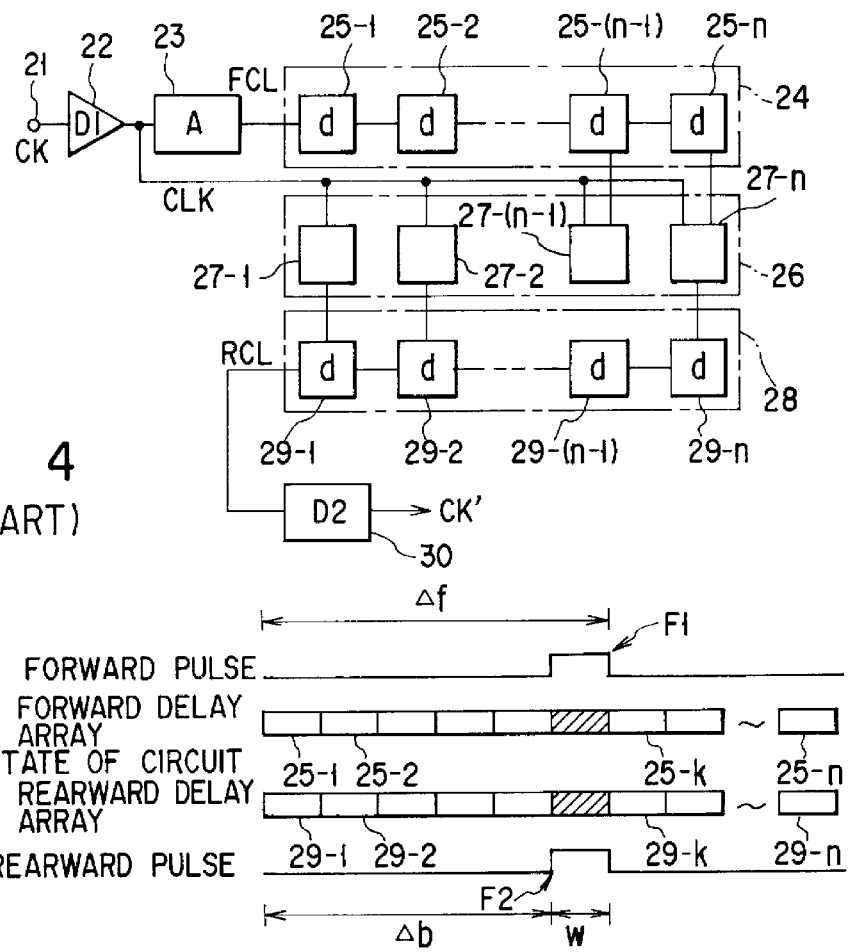
FIG. 4
(PRIOR ART)
FIG. 5
(PRIOR ART)
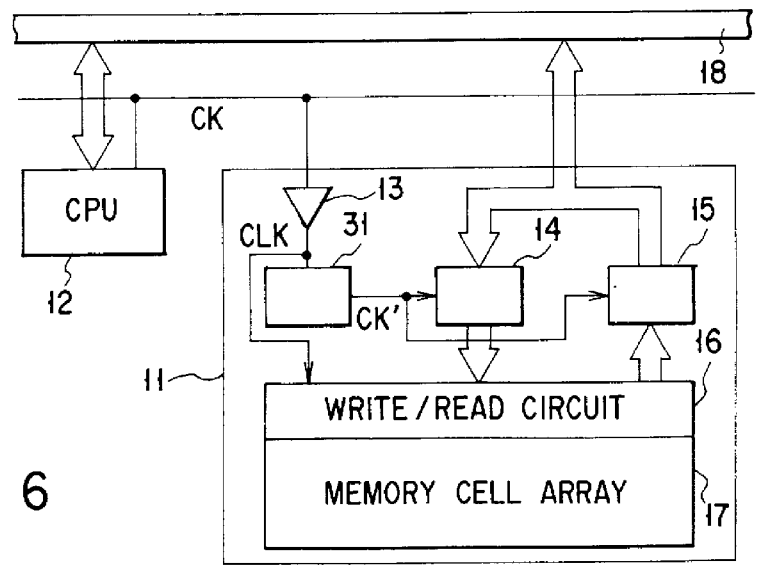
FIG. 6

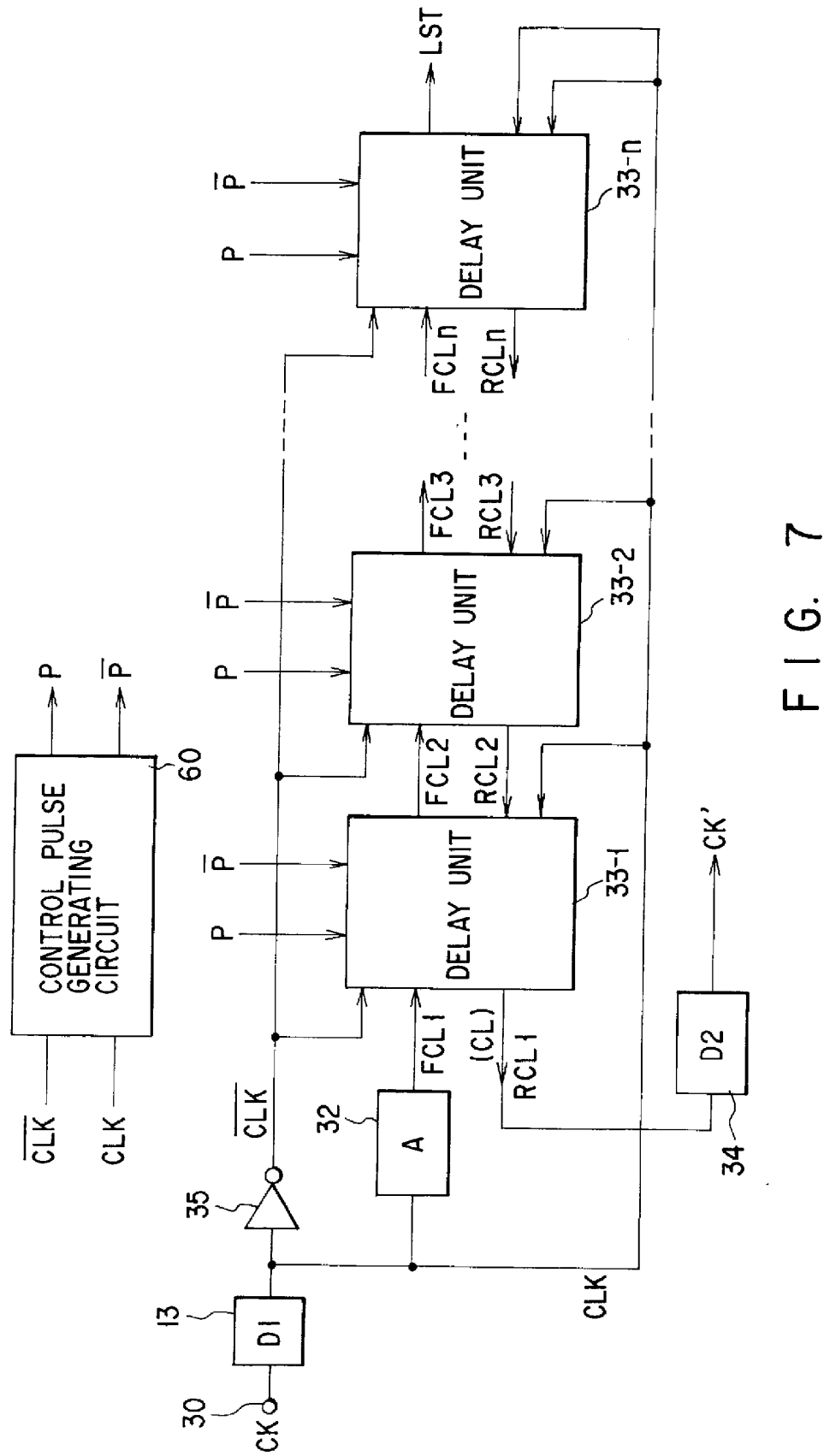
F I G. 7

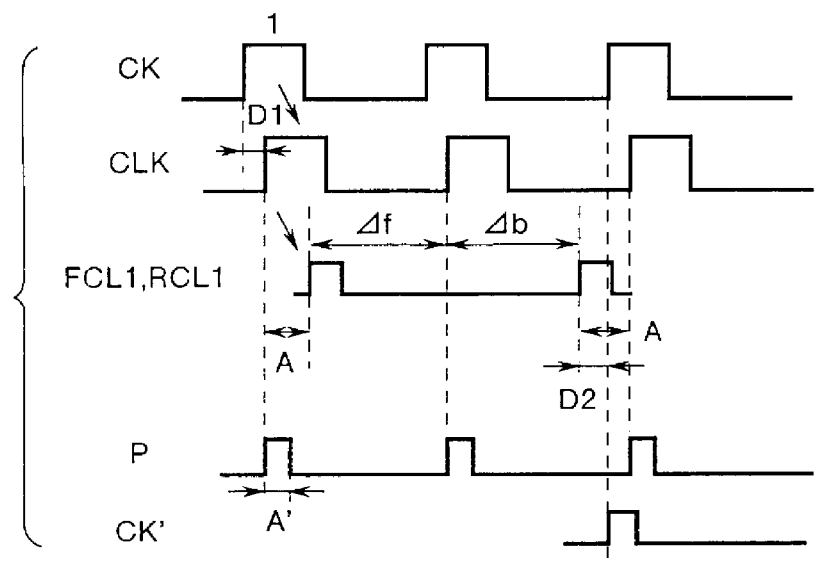
F I G. 11
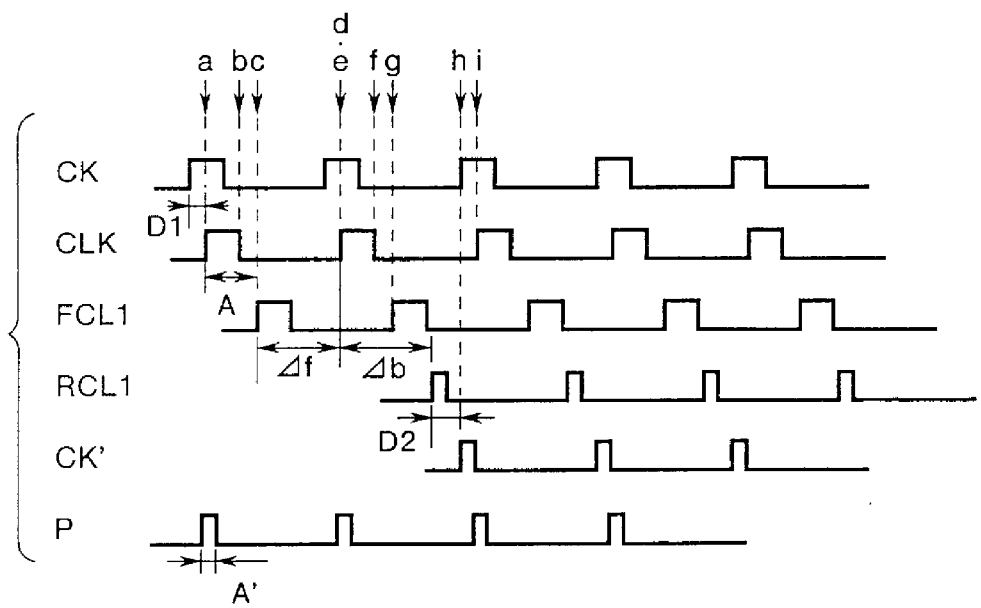
F I G. 12

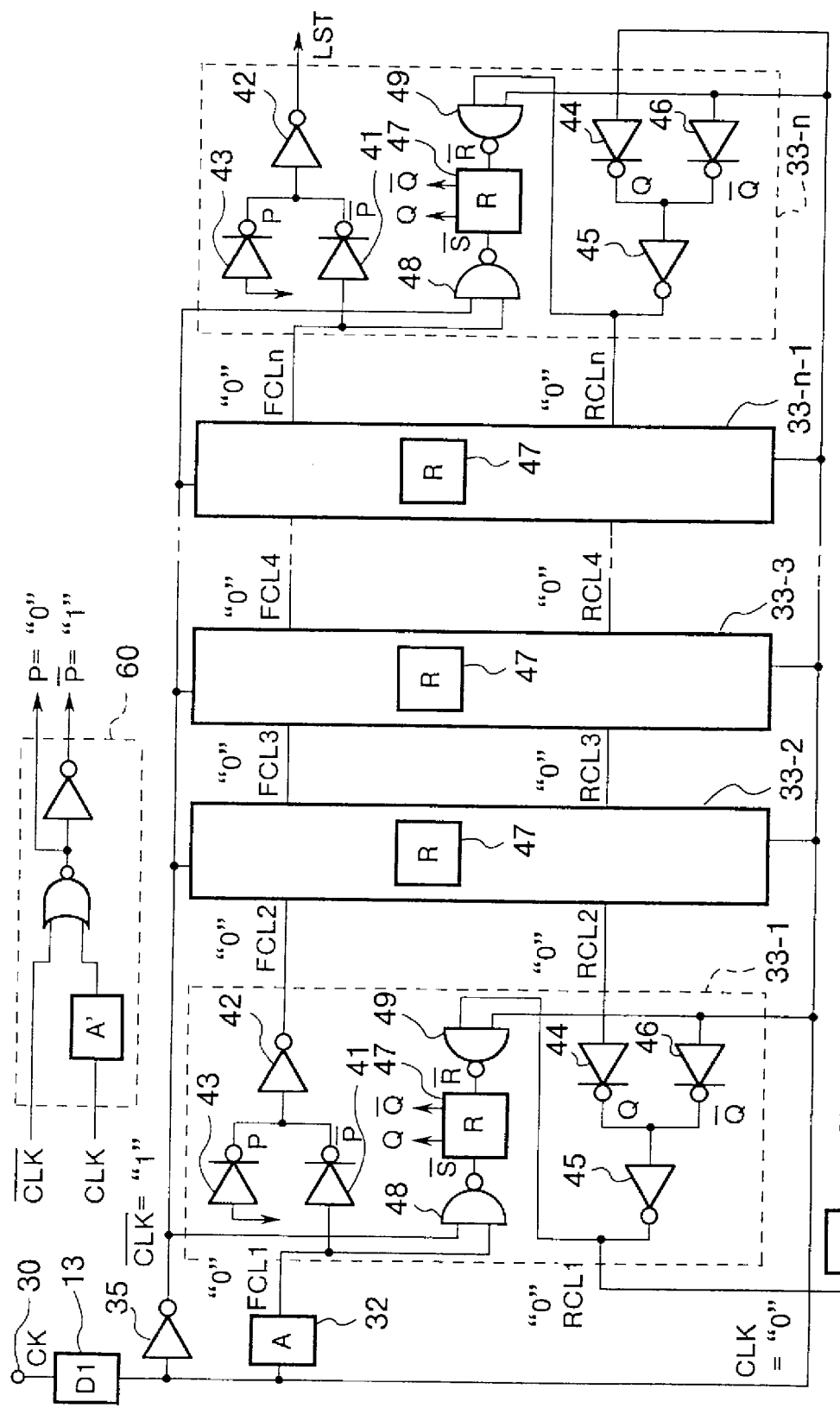
F I G. 14

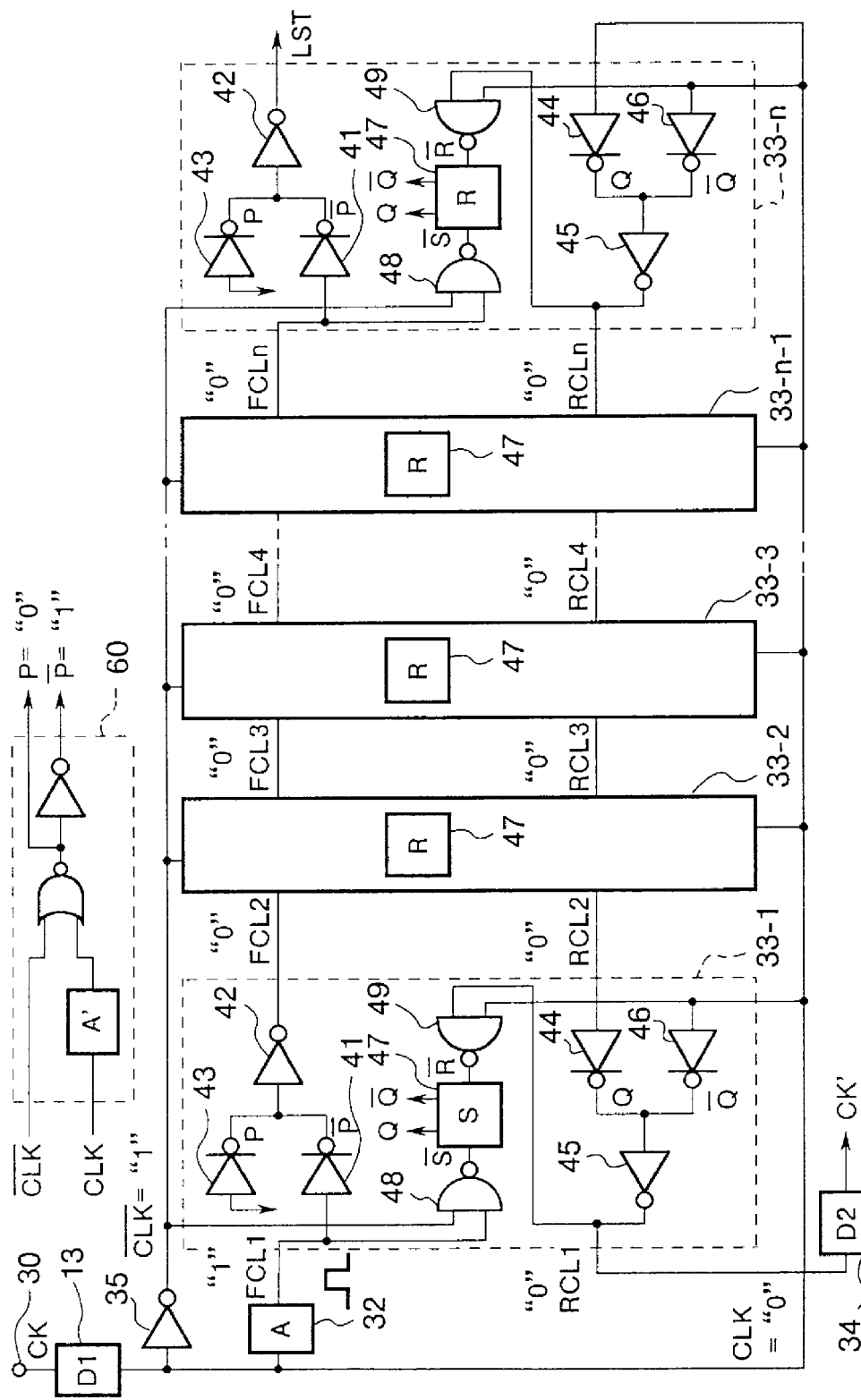
F I G. 15

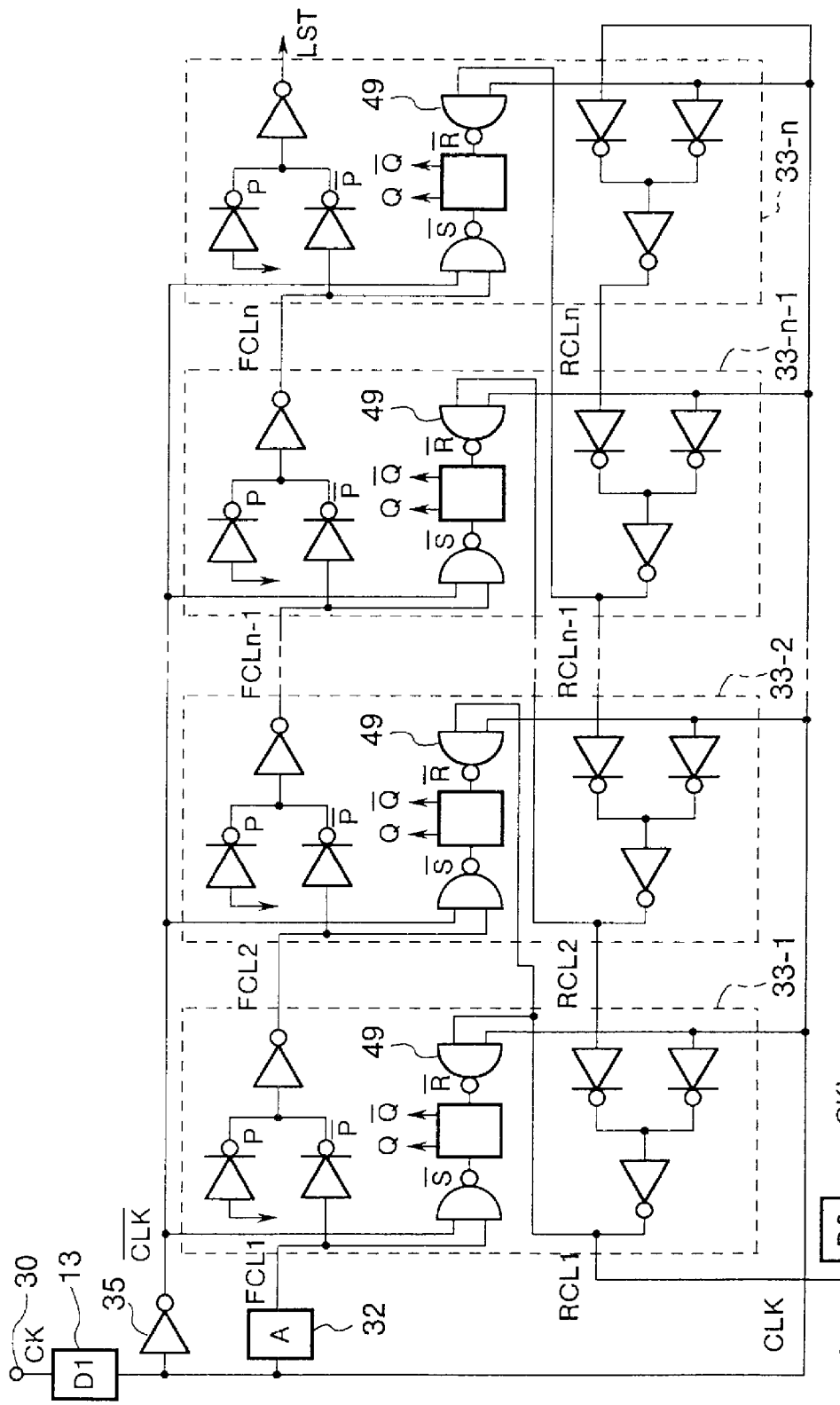
F I G. 22

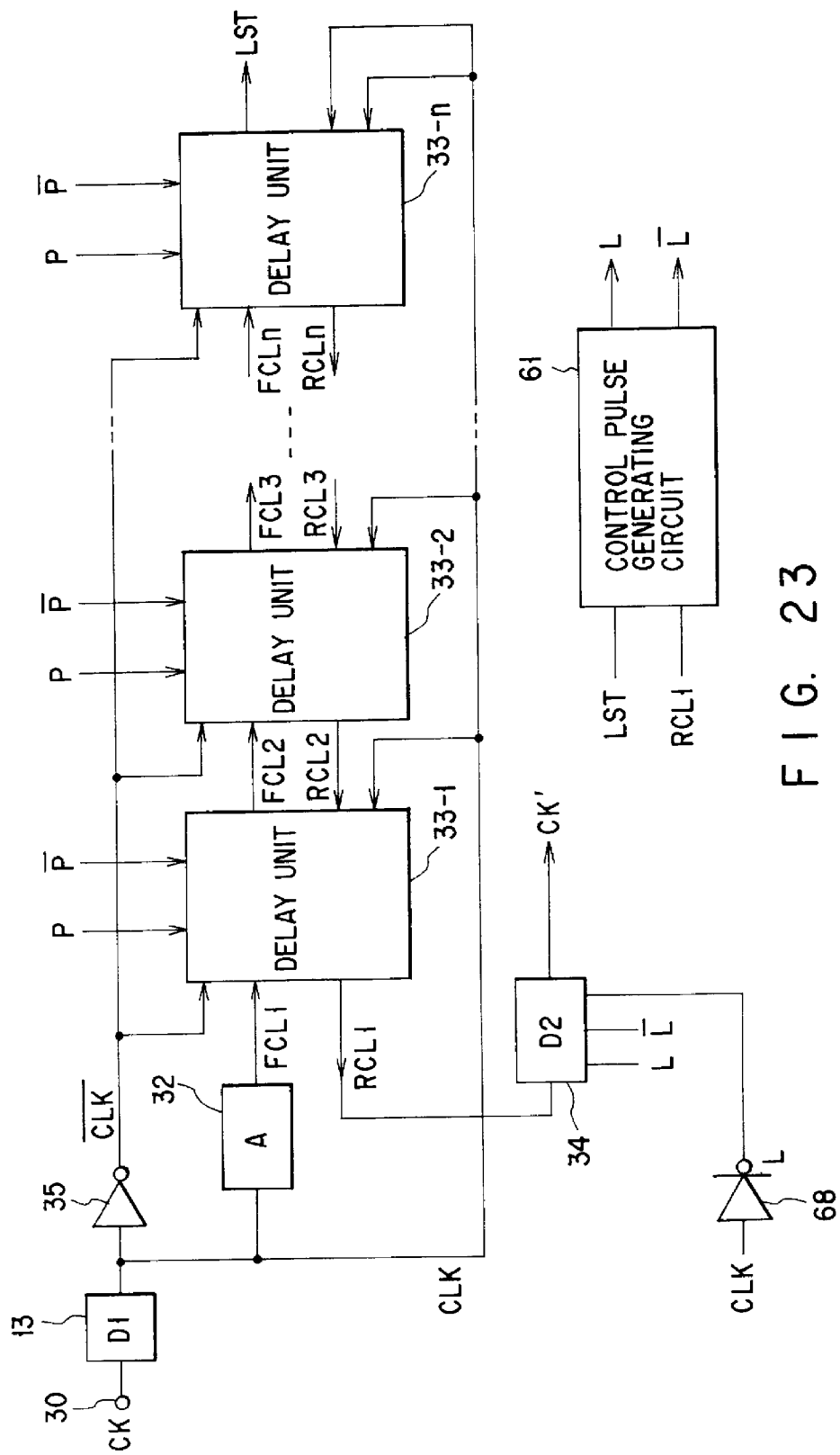
F I G. 23

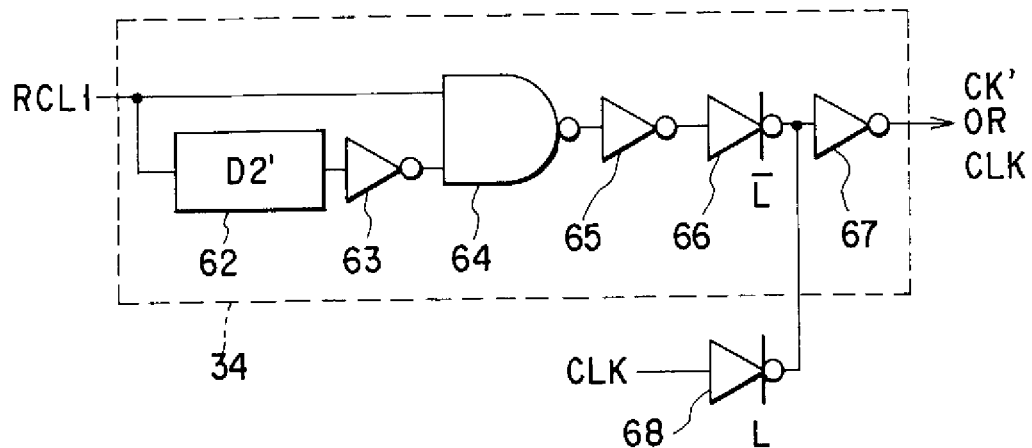
F I G. 24
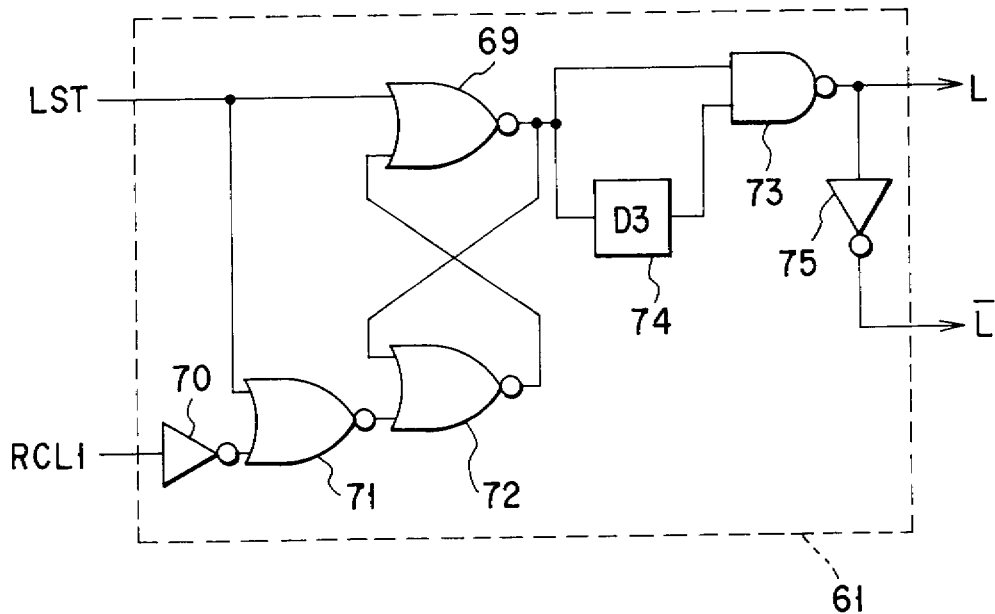
F I G. 25

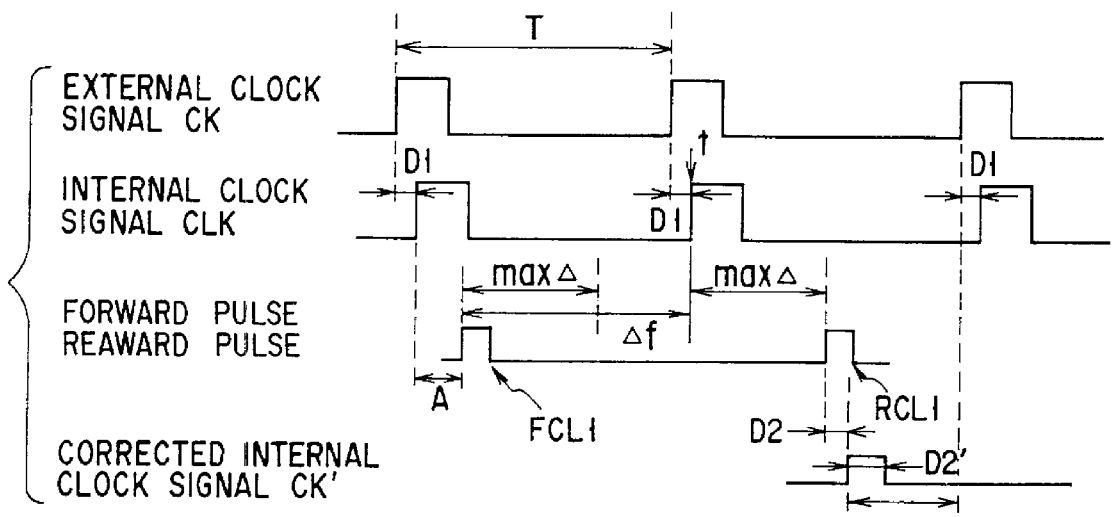
F I G. 26
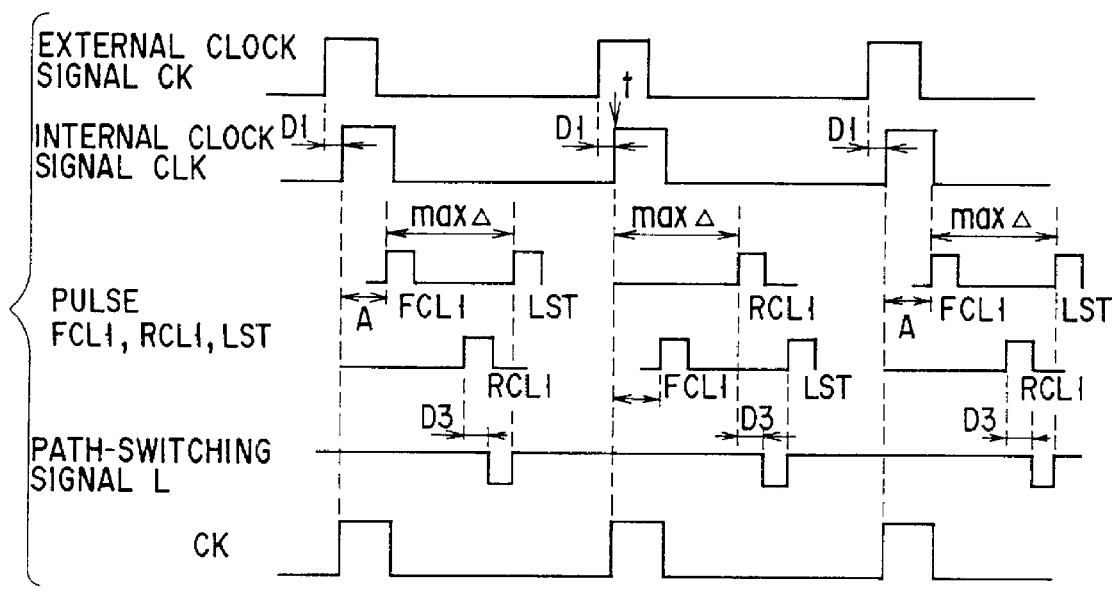
F I G. 27
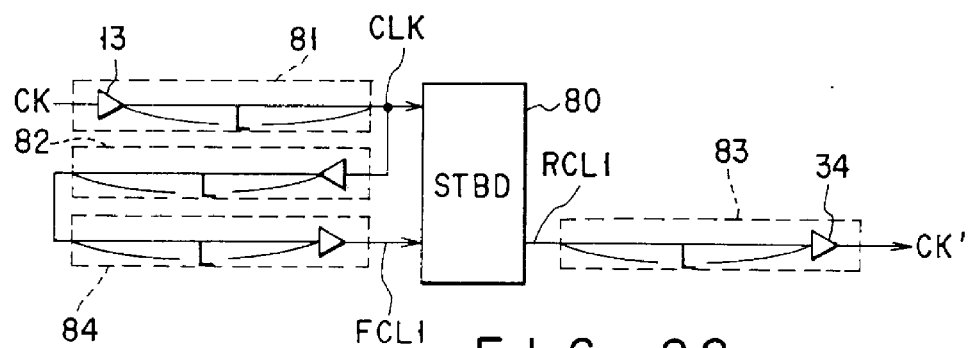
F I G. 28

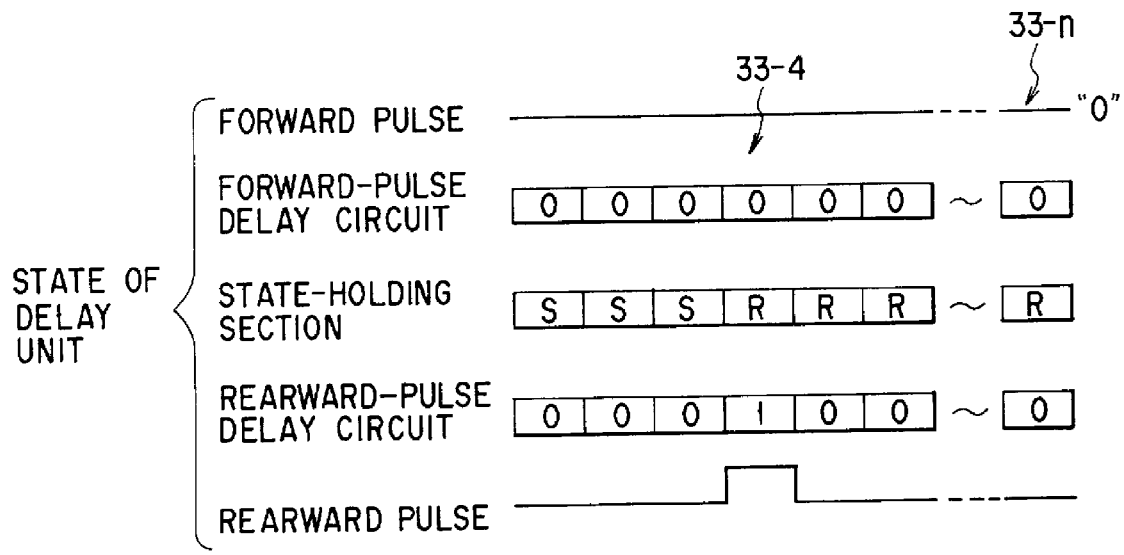
F I G. 31
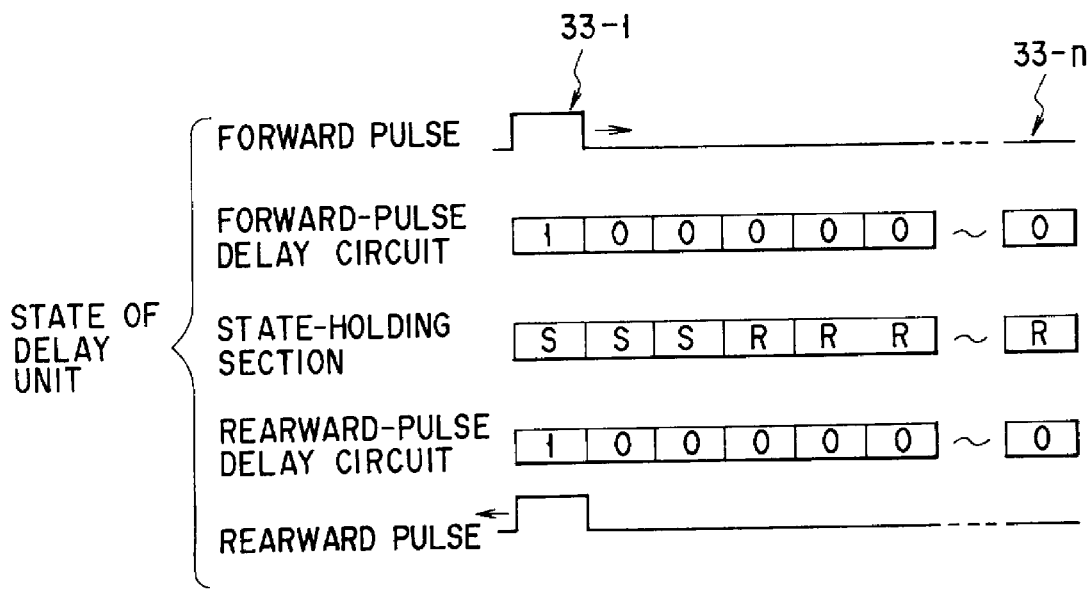
F I G. 32

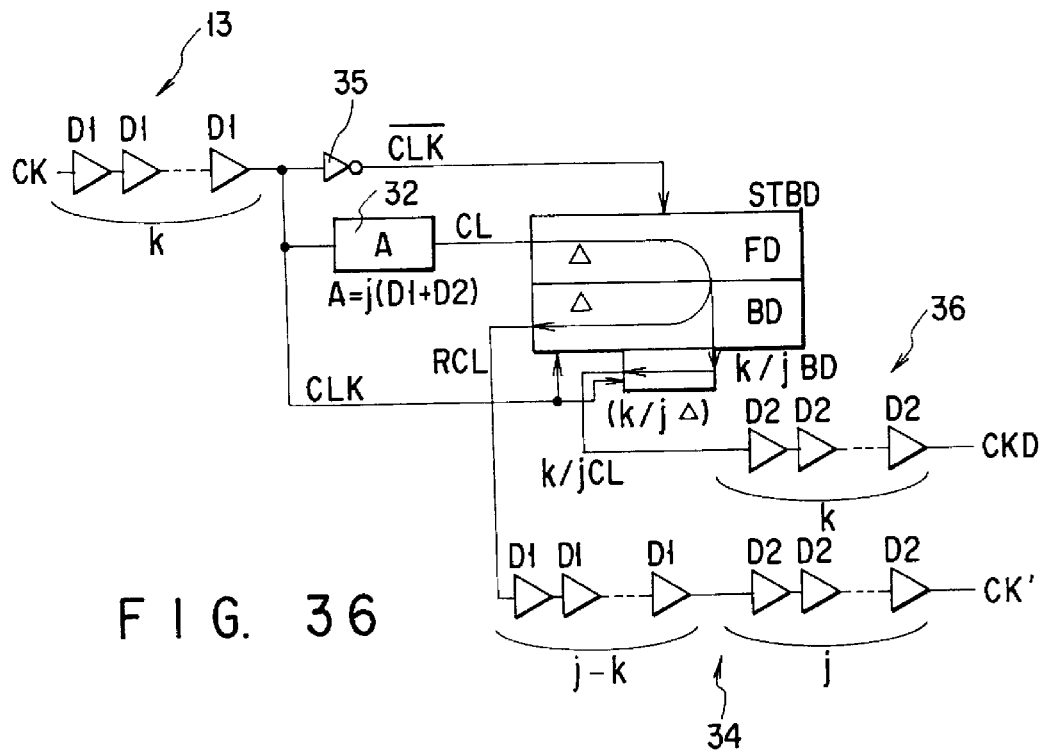
F I G. 36
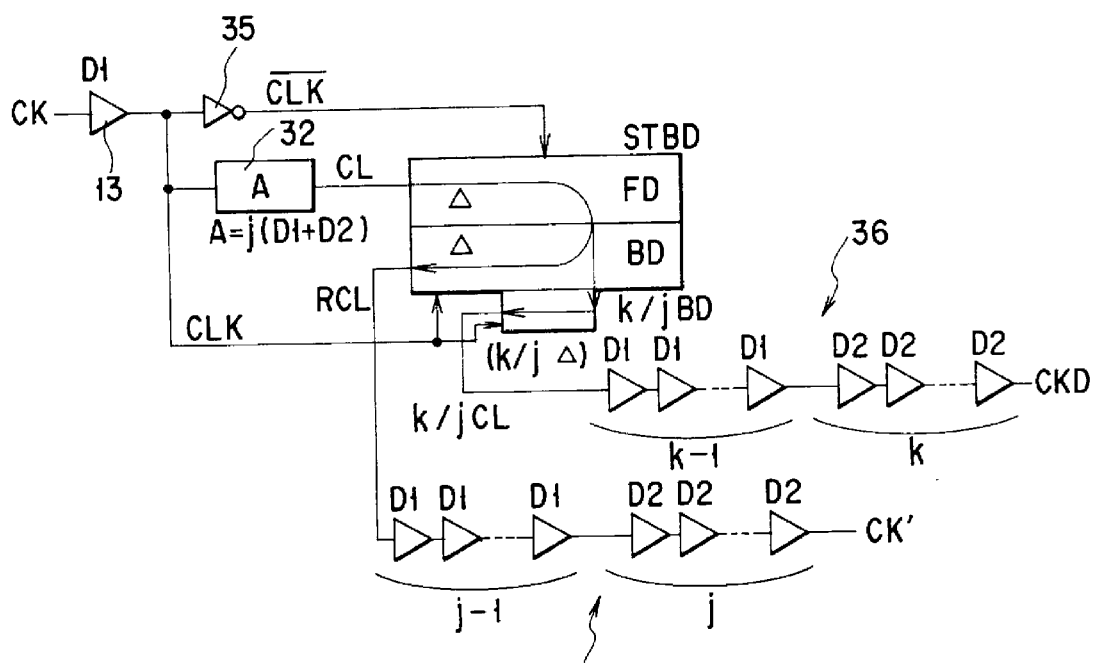
F I G. 37

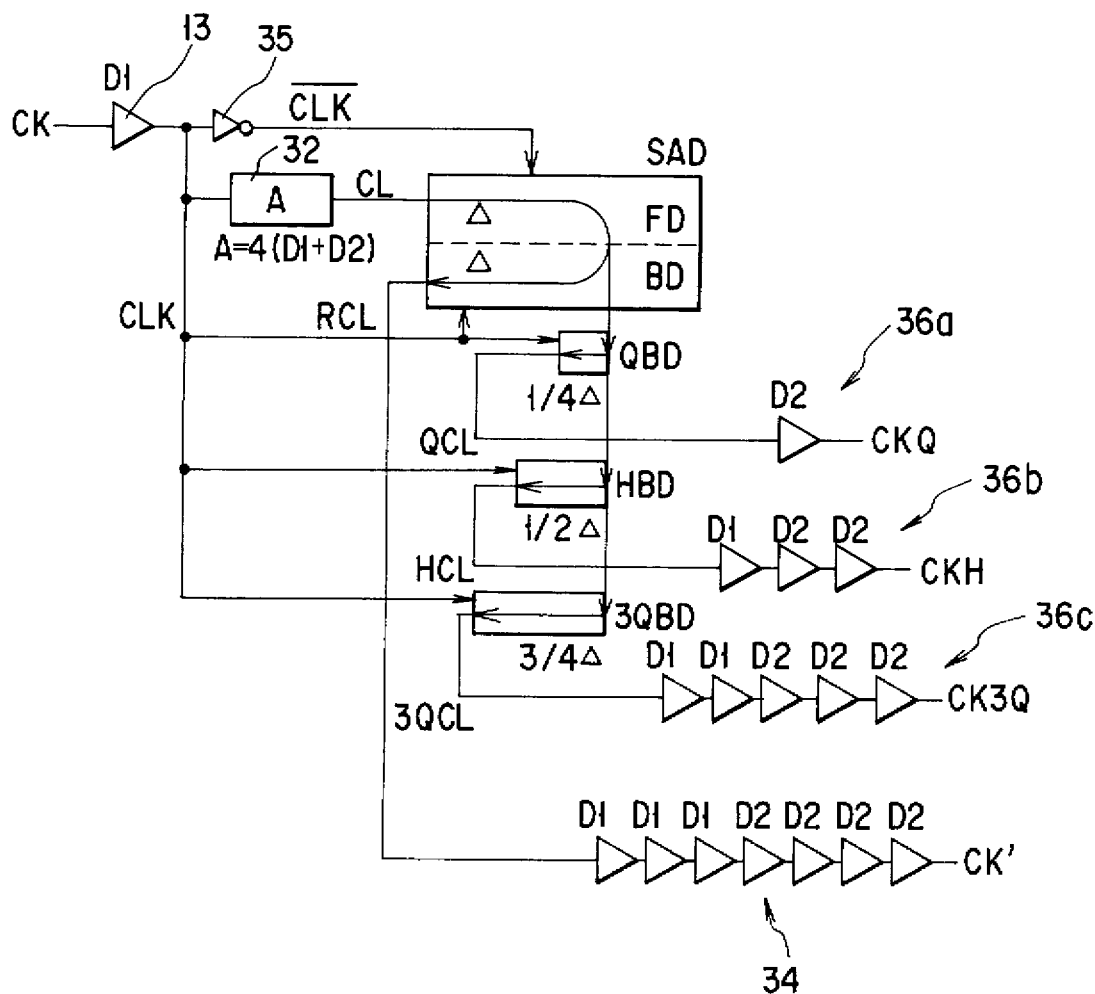
F I G. 38

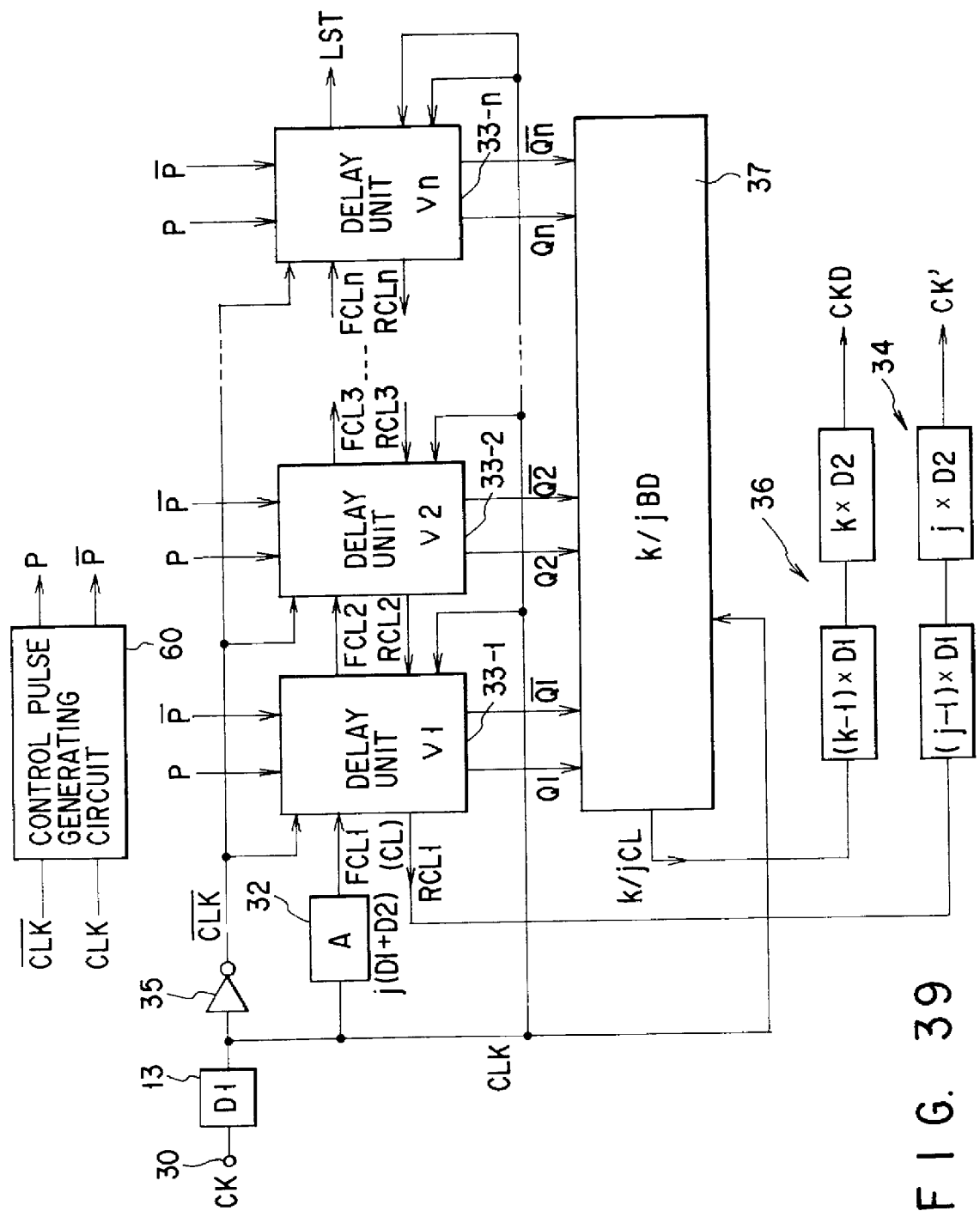
F I G. 39

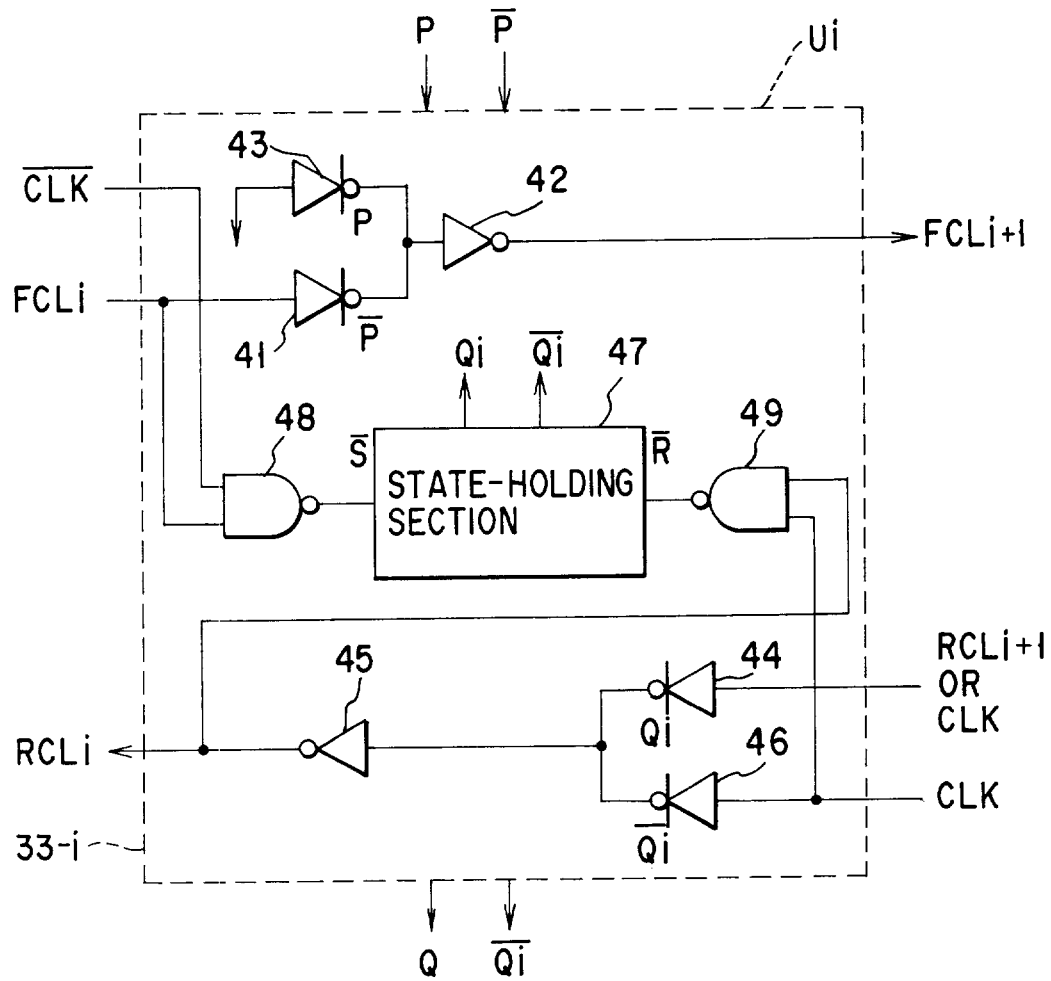
F I G. 40

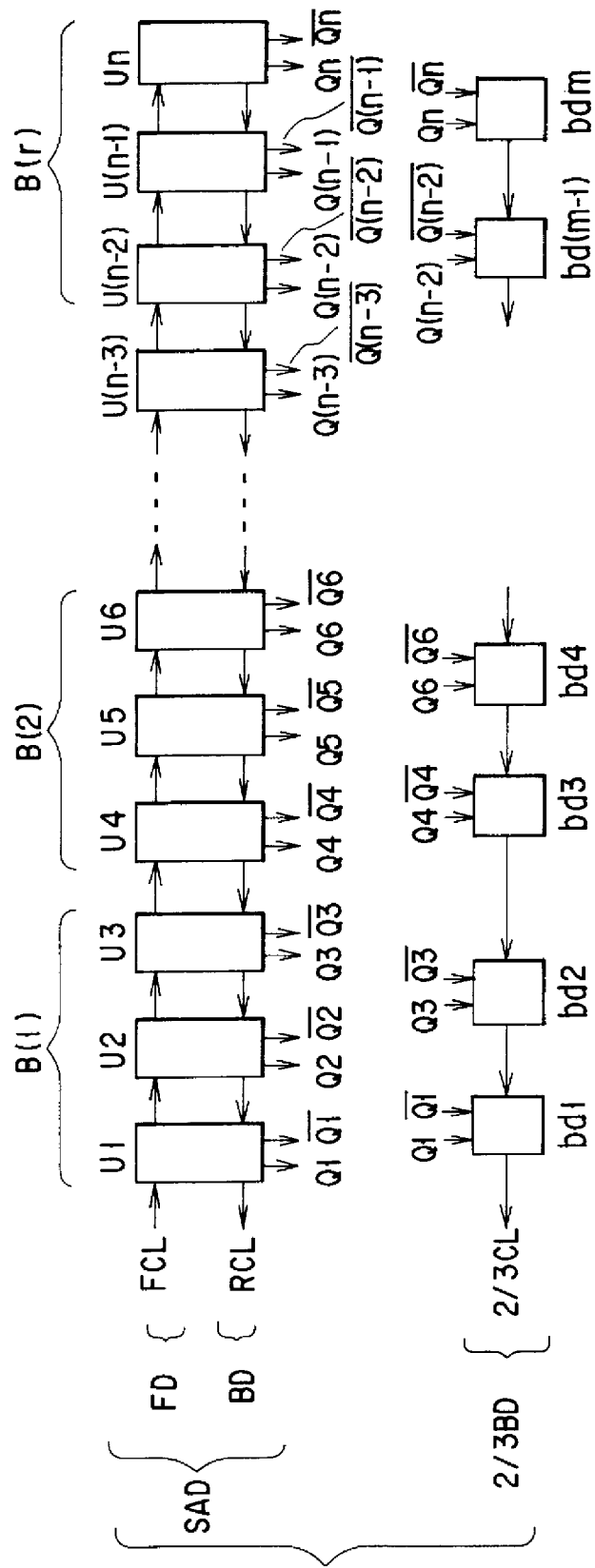
F I G. 47

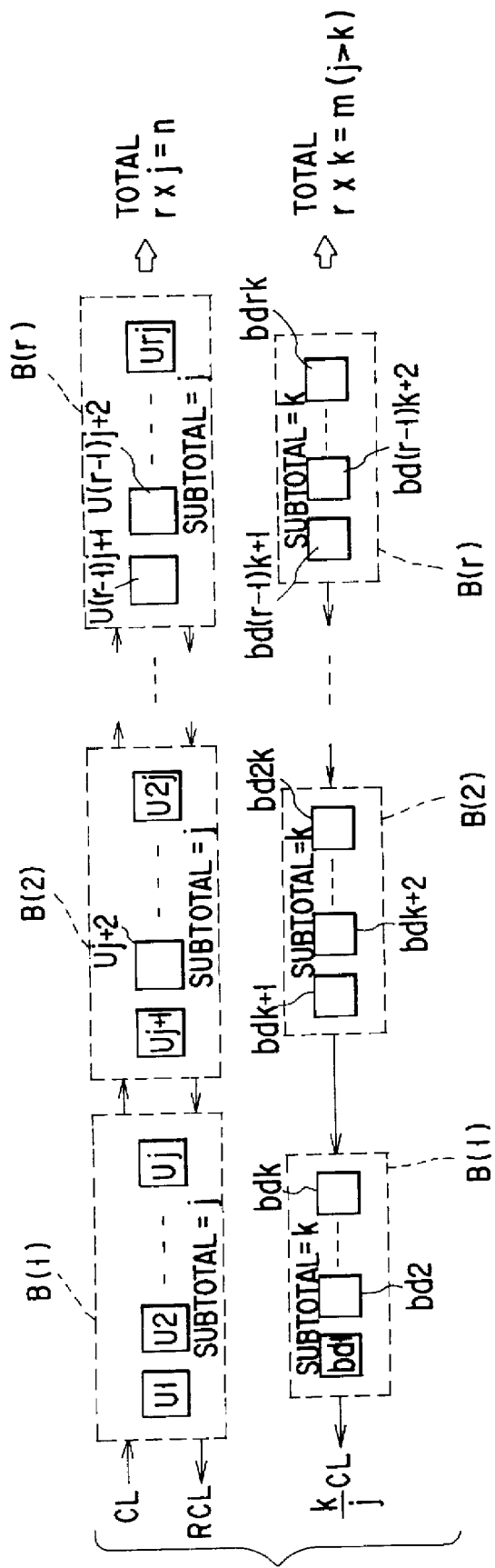
F I G. 48
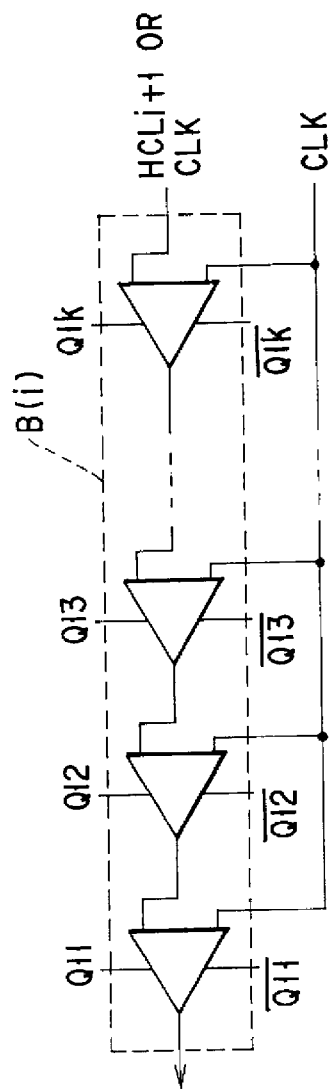
F I G. 49

CLOCK CONTROL CIRCUIT

BACKGROUND OF THE INVENTION

The present invention relates to a clock control circuit which has a delay array and which is designed to control the timing of an external clock generated by a CPU and the timing of an internal clock signal used in a memory (IC).

Most of the memories recently developed are of the type which transfers data at high speed in synchronism with clock signals. A synchronous DRAM (namely, a synchronous type DRAM), for example, transfers data to a function block such as a CPU in synchronism with a clock signal (100 MHz and 250 MHz), and receives data therefrom in synchronism with a clock signal.

The internal clock signal generated in the memory has a skew with, i.e., a small delay, with respect to the external clock signal supplied from the CPU to the memory. The skew causes a problem. Assume the external clock signal is a clock signal (100 MHz) which has a cycle of 10 nanosecond (nsec), and that the internal clock signal has a skew of 1 nsec with respect to the external clock signal. The skew amounts to 10% of the cycle of the external clock signal. Obviously, the skew of this value disables the memory from transferring data at high speed in synchronism with the external clock signal. In particular, the skew greatly affects the speed of transferring data from the memory to the function block, ultimately lengthening the data-reading time of the memory.

FIG. 1 shows a system in which data is transferred between a memory 11 and a CPU 12 in synchronism with a high-frequency clock signal. FIG. 2 represents the relationship between the external clock signal and the internal clock signal, both used in the system.

The memory is a synchronous type DRAM such as a synchronous DRAM. The memory 11 comprises a buffer 13, an input circuit 14, an output circuit 15, a write/read circuit 16, and a memory cell array 15.

The CPU 12 generates the external clock signal CK, which is input to the memory 11. In the memory 11, the buffer 13 converts the external clock signal CK to an internal clock signal CLK. The signal CLK is supplied to the input circuit 14, output circuit 15 and write/read circuit 16 to control the inputting of data to the memory cell array 17 and the outputting of data therefrom.

Generated by the buffer 13 from the external clock signal CK used as a trigger signal, the internal clock signal CLK inevitably has a skew with respect to the external clock signal CK. It is the internal clock CLK that controls the circuits 14 to 16. To transfer data between the memory 11 and the CPU 12, the circuits 14 to 16 must be controlled so as to compensate for the skew the signal CLK has with respect to the signal CK. This technique, however, results in a reduction of the data transfer speed.

Recently, various methods of minimizing or eliminating the skew have been developed. Two of these methods will be described below.

The first method is to use a PLL (Phase-Lock Loop) to detect the skew, and to feed the internal clock signal CLK back to the input of the buffer 13, thereby eliminating the skew. The method works well when the external clock signal CK is continuously supplied to the memory 11 and has a constant frequency.

The second method is to use a circuit which generates a corrected internal clock signal synchronous with the external clock signal in terms of timing. This method is considered desirable since the internal clock signal can immediately become synchronous with the external clock signal when the external clock signal changes in frequency or breaks off.

The principle of the second method will be explained, with reference to the timing chart of FIG. 3.

Assume the internal clock signal CLK has a skew D1 (delay) with respect to the external clock signal CK as shown in FIG. 3, and that both signals CLK and CK have a cycle T. A forward clock FCL is generated upon lapse of a period A from the leading edge of the first pulse of the internal clock signal CLK. Time Δ elapses from the leading edge of the forward clock FCL to the leading edge of the second pulse of the internal clock signal CLK. Upon lapse of 2Δ from the leading edge of the pulse FCL, a forward clock RCL is generated. Then, the period A starting from the leading edge of the pulse RCL terminates at the leading edge of the third pulse of the internal clock signal CLK, provided that (A+W)<T, where W is the width of the forward clocks FCL and RCL.

Time D2 elapses from the leading edge of the forward clock RCL to the leading edge of the third pulse of the external clock signal CK. The forward clock RCL is delayed by the time D2, obtaining a corrected internal clock signal CK' which is synchronous with the external clock signal CK.

That is, the second method uses three delay circuits which provides the delay times A, 2Δ and D2, respectively. The internal clock signal CLK is delayed by A+2Δ+D2, thereby generating a corrected internal clock signal CK' which is synchronous with the external clock signal CK.

As can be understood from FIG. 3, A=D1+D2. The delay time D2 can be computed from the period A and the delay time D1. Since the cycle T of the external and internal clock signals CK and CLK is not constant, the time Δ is not constant, either. One of the three delay circuits must therefore be designed to provide an accurate delay time 2Δ in accordance with the non-constant cycle T of both clock signals CK and CLK.

The three delay circuits serve to generate a corrected internal clock signal the first pulse of which is synchronous with the third pulse of the external clock signal CK, irrespective of the cycle T of the external and internal clock signals CK and CLK. After the third pulse of the external clock signal CK, the corrected internal clock signal CK' remains synchronous with the external clock signal CK. Should the external clock signal CK break off, there can immediately be generated a corrected internal clock signal CK' which is synchronous with the external clock signal CK.

A clock control circuit which performs the second method will be described, with reference to FIG. 4.

As shown in FIG. 4, the circuit comprises an input terminal 21, a input buffer 22, a delay circuit 23, a forward delay array 24, a mirror control circuit 26, a rearward delay array 28, and a delay circuit 30. The forward delay array 24 is composed of a plurality of delay circuits 25-1, 25-2, . . . 25-n control circuit 26 has control elements 27-1, 27-2, . . . 27-n. The rearward delay array 28 is composed of a plurality of delay circuits 29-1, 29-2, . . . 29-n.

The external clock signal CK supplied to the input terminal 21 is input to the input buffer 22. The input buffer 22 outputs an internal clock signal CLK. Since the input buffer has a delay time D1, the internal clock signal CLK has a clock skew of D1 with respect to the external clock signal CK. The internal clock signal CLK is input to the forward delay array 24 through the delay circuit 23 which has a delay time A. The internal clock signal CLK is input to the mirror control circuit 26, too. The circuit 26 determines a delay time Δf of the forward delay array 24 and equalizes the delay time Δb of the rearward delay array 28 to the delay time Δf. The clock signal output from the rearward delay array 28 is supplied to the delay circuit 30 which has a delay time D2. The delay circuit 30 generates a corrected internal clock signal CK' which is synchronous with the external clock signal CK.

The forward delay array 24 and the rearward delay array 28 are identical in structure, and the delay time Δf of the array 24 is used as the delay time Δb of the array 28. Thus, the delay arrays 24 and 28 provide a delay time of 2Δ, where Δ=Δf=Δb.

In the clock control circuit of FIG. 4 it is difficult to render the delay time Δf and the delay time Δb completely the same, because forward pulses have a predetermined width. This problem will be explained below, with reference to FIG. 5.

FIG. 5 is a timing chart explaining how delay times Δf and Δb are determined at time t (FIG. 3) in the clock control circuit of FIG. 4.

As seen from FIG. 5, the forward delay array 24 remains active while a forward pulse is at "1" level; it remains inactive while the forward pulse is at "0" level. When the forward pulse is input to, for example, the delay circuit 25-k, the delay circuit 25-k is activated while all other delay circuits of the array 24 are deactivated. When a pulse of the internal clock signal CLK is generated thereafter, the kth delay circuit 29-k of the rearward delay array 28 is activated and generates a rearward pulse.

A forward pulse and a pulse of the internal clock signal CLK are input to the kth control element 27-k of the mirror control circuit 26. The control element 27-k activates the kth delay circuit 29-k of the rearward delay array 28. The delay circuit 29-k generates a rearward pulse. The control element 27-k which receives the forward pulse and the delay circuit which generates the rearward pulse assume the same place, i.e., the kth place. Therefore, the rearward pulse has its front edge F2 delayed with respect to the front edge F1 of the forward pulse by a time corresponding to the interval at which the delay circuits are arranged (for example, the width W of the forward pulse). Since the front edge F1 of the forward pulse and the front edge F2 of the rearward pulse determine the delay time Δf and the delay time Δb, respectively, the delay time Δb is shorter than the delay time Δf by, at most, the time corresponding to said interval.

As described above, the conventional clock control circuit performs the above-mentioned second method to generate a corrected internal clock signal synchronous with the external clock signal. However, none of the components of the clock control circuit can provide a predetermined delay time with accuracy. Consequently, it is difficult with the circuit to generate a corrected internal clock signal which is completely synchronous with the external clock signal.

BRIEF SUMMARY OF THE INVENTION

Accordingly it is an object of the invention to provide a clock control circuit which has components for providing a predetermined delay time with high accuracy, making it possible to generate a corrected internal clock signal completely synchronous with the external clock signal input to the circuit.

Another object of the present invention is to provide a clock control circuit which generates a corrected internal clock signal having a specific phase relation with the external clock signal, more precisely delayed in phase by a specific time with respect to the external clock signal.

To attain the objects mentioned above, there is provided a delay array having a plurality of delay units, each comprising: a forward pulse delay circuit for delaying a forward pulse by a predetermined time and supplying the forward pulse thus delayed to the succeeding delay unit; a rearward pulse delay circuit for delaying a rearward pulse by the predetermined time and supplying the rearward pulse thus delayed to the preceding delay unit; and a state-holding section which is set upon receipt of the forward pulse when no pulses of an internal clock signal are input to the delay units, and which is reset upon receipt of the rearward pulse when the pulses of the internal clock signals are input to the delay units. In the delay array, the forward pulse is input to the first delay unit, a front edge of the rearward pulse is generated by that one of the delay units whose state-holding sections are reset by the pulses of the internal clock signal, which is located most close to the first delay unit, and the rearward pulse is generated by the first delay unit.

In the delay array, an edge of the rearward pulse, other than the front edge, is generated by that one of the delay units whose state-holding sections are reset when the pulses of the internal clock signal ceases to be supplied to the delay units, which is located most close to the first delay unit.

A clock control circuit according to the invention comprises: a delay array of the type described above; a buffer having a delay time D1, for generating the internal clock signal from an external clock signal; a first delay circuit for delaying the pulses of the internal clock signal by a time A and supplying the pulses thus delayed, as forward pulses, to the first delay unit; and a second delay circuit for delaying the rearward pulses output from the first delay unit, by a time D2, and supplying the rearward pulses thus delayed, as a corrected internal clock signal. The time D1, the time D2 and the time A have the relationship of: A=D1+D2.

The clock control circuit may further comprises: a control pulse generating circuit for generating a control pulse for initializing the forward pulse delay circuit of each delay unit, within a period between the time the pulses of the internal clock signal are input to the delay units and the time the forward pulse is supplied to the first delay unit.

The clock control circuit may further comprises control means for preventing the rearward pulse output from the first delay unit from passing through the second delay circuit when the forward pulse is output from the last delay unit, thereby to supply a pulse of the internal clock signal from the second delay circuit, instead of the rearward pulse. The control means initializes the second delay circuit in accordance with the rearward pulse output from the first delay unit after the second delay circuit has output the pulse of the internal clock pulse.

In the clock control circuit, the delay units are located between the buffer and the second delay circuit, and the first delay circuit is composed of a first group of patterns similar to those of the buffer and wiring patterns extending from the buffer to the delay units and a second group of patterns similar to those of the second delay circuit and wiring patterns extending from the delay units to the second delay circuit.

A memory circuit according to the present invention comprises: a memory cell array; a write/read circuit for writing data into and reading data from the memory cell array; an input circuit for receiving the data from a bus; an output circuit for supplying data to the bus; and a clock control circuit of the type described above. The write/read circuit is controlled by the internal clock signal output from the buffer, and the input circuit and the output circuit are controlled by the corrected internal clock signal output from the second delay circuit.

A memory system according to the invention comprises: a memory circuit of the type described above; a bus; and a control block for supplying data to and receiving data from the bus and for generating the external clock signal, A delay array according to the present invention comprises: a plurality of first delay units connected in series; and a plurality of second delay units connected in series. Each first delay unit comprises: a forward pulse delay circuit for delaying a forward pulse by a first predetermined time and supplying the forward pulse thus delayed to the succeeding delay unit; a first rearward pulse delay circuit for delaying a first rearward pulse by the first predetermined time and supplying the first rearward pulse thus delayed to the preceding delay unit; and a state-holding section which is set upon receipt of the forward pulse when no pulses of an internal clock signal are input to the delay units, and which is reset upon receipt of the rearward pulse when the pulses of the internal clock signals are input to the delay units. Each second delay unit comprises: a second rearward pulse delay circuit for delaying a second rearward pulse by a second predetermined time and supplying the second rearward pulse thus delayed to the preceding delay unit. The forward pulse is input to the first delay unit at the first stage. The front edge of the forward pulse is generated by that one of the delay units whose state-holding sections are reset by the pulses of the internal clock signal when the pulses of the internal clock signals are input to the delay units, which is located most close to the first delay unit. The first rearward pulse is generated by the first delay unit. The front edge of the second rearward pulse is generated by the second delay unit which corresponds to the first delay unit which generates the front edge of the first rearward pulse. The second rearward pulse is generated by the second delay unit at the first stage. Each second delay unit has the same structure as that part of each first delay unit which transfers the first rearward pulse.

Another clock control circuit according to the invention comprises: a delay array of the type described above; a buffer having a delay time D1, for generating the internal clock signal from an external clock signal; a first delay circuit for delaying the pulses of the internal clock signal by a time A and supplying the pulses thus delayed to the first delay unit; a second delay circuit for delaying the first rearward pulses output from the first delay unit, by a time $(j-1) \times D1 + j \times D2$, and supplying the first rearward pulses thus delayed, as a first corrected internal clock signal; and a third delay circuit for delaying the second rearward pulses output from the second delay unit, by a time $(k-1) \times D1 + k \times D2$, and supplying the second rearward pulses thus delayed, as a second internal clock signal. The time D1, the time D2 and the time A have the relationship of: $A = D1 + D2$.

Still another clock control circuit according to the invention comprises: a delay array of the type described above; a buffer having a delay time $k \times D1$, for generating the internal clock signal from an external clock signal; a first delay circuit for delaying the pulses of the internal clock signal by a time A and supplying the pulses thus delayed to the first delay unit; a second delay circuit for delaying the first rearward pulses output from the first delay unit, by a time $(j-k) \times D1 + j \times D2$, and supplying the first rearward pulses thus delayed, as a first corrected internal clock signal; and a third delay circuit for delaying the second rearward pulses output from the second delay unit, by a time $k \times D2$, and supplying the second rearward pulses thus delayed, as a second internal clock signal. The time D1, the time D2 and the time A have the relationship of: $A = D1 + D2$.

Another memory system according this invention comprises: a plurality of memories; a controller for controlling the memories; a dummy memory having the same storage capacity as the memories with respect to an external clock signal output from the controller; a first line for equalizing the time by which the external clock signal is delayed while supplied from the controller to the memories to the time by which the external clock is delayed while supplied from the controller to the dummy memory; a data bus for supplying data from one of the memories to the controller in synchronism with an internal clock signal which has a specific phase relation with the external clock signal; and a second line for returning the external clock signal from the dummy memory to the controller as a return clock signal. The time by which the data is delayed while supplied from one of the memories to the controller is equal to the time by which the return clock signal is delayed while supplied from the dummy memory to the controller, and the controller receives the data in synchronism with the return clock signal.

Another clock control circuit according to the invention comprises: a first delay circuit for receiving an internal clock signal delayed by a time D1 with respect to an external clock and for generating a forward pulse upon lapse of a time A from the receipt of the internal clock signal; a second delay circuit for delaying the forward pulse by a time $2 \times \Delta$ and outputting a rearward pulse; and a third delay circuit for receiving the rearward pulse and outputting a correcting internal clock signal in phase with the external clock signal, upon lapse of a delay time $(j-1) \times D1 + j \times D2$ from the receipt of the rearward pulse, where j is a natural number, $\Delta$ is the time between the generation of the forward pulse and the generation of the first pulse of the internal clock signal, and A is $j \times (D1 + D2)$.

Still another clock control circuit according to the present invention comprises: a first delay circuit for receiving an internal clock signal delayed by a time $k \times D1$ with respect to an external clock and for generating a forward pulse upon lapse of a time A from the receipt of the internal clock signal; a second delay circuit for delaying the forward pulse by a time $2 \times \Delta$ and outputting a rearward pulse; and a third delay circuit for receiving the rearward pulse and outputting a correcting internal clock signal in phase with the external clock signal, upon lapse of a delay time $(j-k) \times D1 + j \times D2$ from the receipt of the rearward pulse, where j and k are natural numbers, $j > k$, $\Delta$ is the time between the generation of the forward pulse and the generation of the first pulse of the internal clock signal, and A is $j \times (D1 + D2)$.

A further clock control circuit according to the invention comprises: a first delay circuit for receiving an internal clock signal delayed by a time D1 with respect to an external clock and for generating a forward pulse upon lapse of a time A from the receipt of the internal clock signal; a second delay circuit for delaying the forward pulse by a time $\Delta + (k/j) \times \Delta$ and outputting a rearward pulse; and a third delay circuit for receiving the rearward pulse and outputting a correcting internal clock signal delayed in phase by $(k/j) \times T$ with respect to the external clock signal, upon lapse of a delay time $(k-1) \times D1 + k \times D2$ from the receipt of the rearward pulse, where j and k are natural numbers, $j > k$, $\Delta$ is the time between the generation of the forward pulse and the generation of the first pulse of the internal clock signal, and A is $j \times (D1 + D2)$, and T is the cycle of the external clock signal.

A further clock control circuit according to the invention comprises: a first delay circuit for receiving an internal clock signal delayed by a time $k \times D1$ with respect to an external clock and for generating a forward pulse upon lapse of a time A from the receipt of the internal clock signal; a second delay circuit for delaying the forward pulse by a time $\Delta + (k/j) \times \Delta$ and outputting a rearward pulse; and a third delay circuit for receiving the rearward pulse and outputting a correcting internal clock signal delayed in phase by (k/j)×T with respect to the external clock signal, upon lapse of a delay time k×D2 from the receipt of the rearward pulse, where j and k are natural numbers, j>k, Δ is the time between the generation of the forward pulse and the generation of the first pulse of the internal clock signal, and A is j×(D1+D2), and T is the cycle of the external clock signal.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a block diagram of the conventional clock control circuit;

FIG. 5 is a timing chart for explaining how delay times Δf and Δb are determined in the conventional clock control circuit;

FIG. 6 is a block diagram of a system having a memory incorporating a clock control circuit according to the present invention;

FIG. 7 is a block diagram of the clock control circuit shown in FIG. 6;

FIG. 11 is a timing chart for explaining the operating principle of the clock control circuit according to the invention;

FIG. 12 is a timing chart showing various signals generated in the clock control circuit;

FIG. 14 is a diagram representing how the clock control circuit operates at time b shown in FIG. 12;

FIG. 15 is a diagram representing how the clock control circuit operates at time c shown in FIG. 12;

FIG. 22 is a circuit diagram of a modification of the clock control circuit shown in FIG. 7;

FIG. 23 is a circuit diagram of another modification of the clock control circuit shown in FIG. 7;

FIG. 24 is a circuit diagram illustrating the delay circuit incorporated in the circuit of FIG. 23;

FIG. 25 is a circuit diagram showing the control pulse generating circuit provided in the circuit of FIG. 23;

FIG. 26 is a timing chart for explaining the operating principle of the clock control circuit shown in FIG. 7;

FIG. 27 is a timing chart for explaining how the clock control circuit shown in FIG. 23 operates;

FIG. 28 is a diagram showing the positions at which the components of the clock control circuit of the invention are laid out in a semiconductor chip;

FIGS. 29 to 32 are diagrams for explaining how the clock control circuits shown in FIGS. 7 and 23 operate;

FIG. 36 is a circuit diagram showing a third embodiment of the clock control circuit according to the invention;

FIG. 37 is a circuit diagram showing a fourth embodiment of the clock control circuit according to the invention;

FIG. 38 is a circuit diagram showing a fifth embodiment of the clock control circuit according to the invention;

FIG. 39 is a diagram illustrating the fourth embodiment in greater detail;

FIG. 40 is diagram showing in detail one of the identical delay units provided in the fourth embodiment;

FIG. 47 is a diagram showing a 2/3BD delay section which may be used as the k/j backward delay section k/jBD in the fourth embodiments;

FIG. 48 is another diagram showing the k/jBD delay section shown in FIG. 39;

FIG. 49 is a diagram illustrating the block Bi shown in FIG. 48;

DETAILED DESCRIPTION OF THE INVENTION

Figure 1:
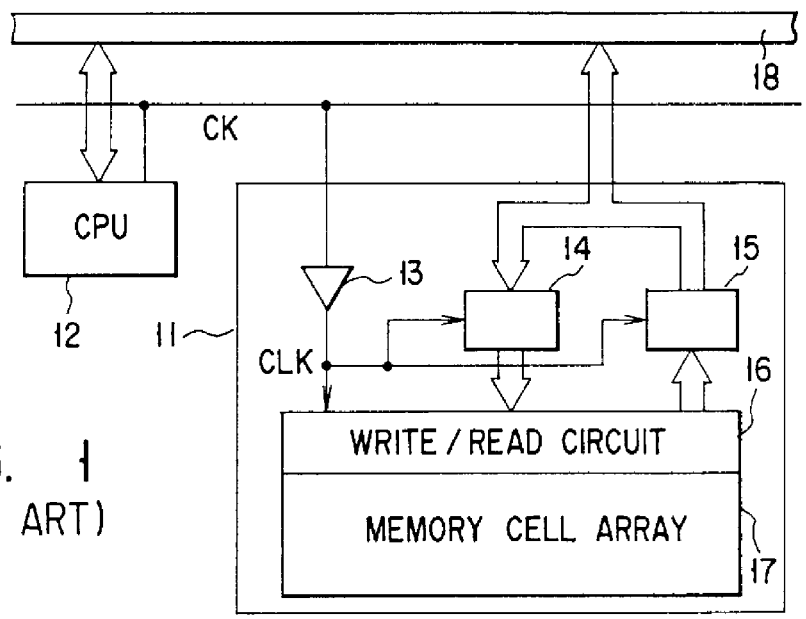
FIG. 1 is a block diagram of a system having a conventional memory.
Figure 2:
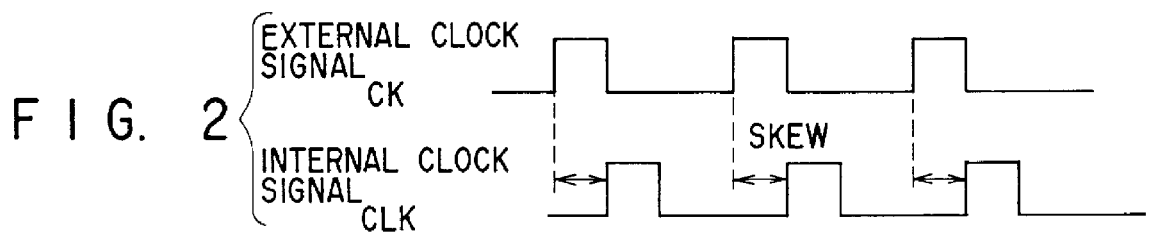
FIG. 2 is a timing chart illustrating a clock skew, i.e., the timing deviation between the internal clock signal and the external clock signal in the system.
Figure 3:
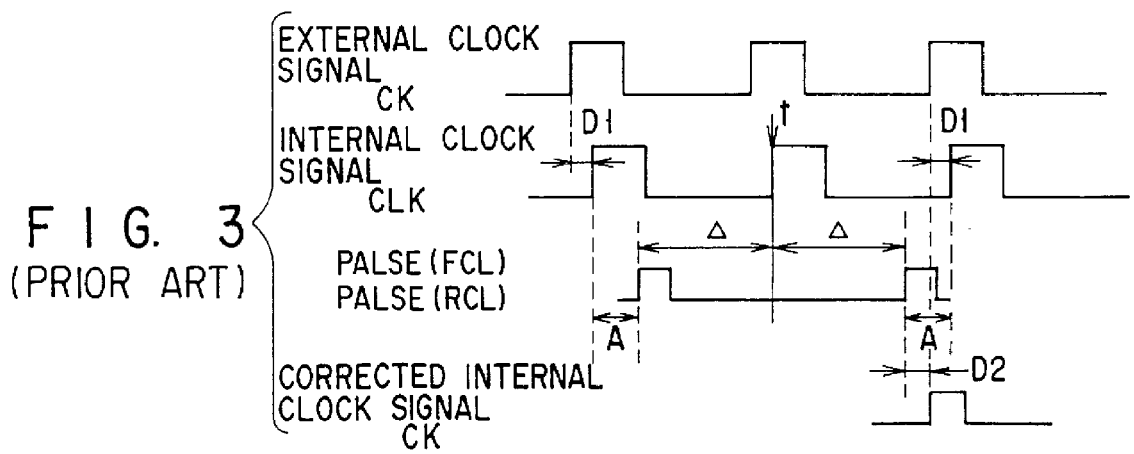
FIG. 3 is a timing chart explaining the operating principle of a conventional clock control circuit.

A clock control circuit according to the present invention will be described, with reference to the accompanying drawings.

FIG. 6 shows a synchronous control system which comprises a memory having a clock control circuit according to the invention.

As shown in FIG. 6, the synchronous control system comprises a memory 11 and a CPU 12. The memory 11 is a synchronous DRAM (namely, a synchronous type DRAM). The memory 11 comprises a buffer 13, an input circuit 14, an output circuit 15, a write/read circuit 16, a memory cell array 17, and a clock control circuit 31.

The CPU 12 generates an external clock signal CK, which is supplied to the memory 11. In the memory 11, the buffer 13 converts the external clock signal CK to an internal clock signal CLK. The internal clock signal CLK is supplied to the write/read circuit 16. The circuit 16 writes data into the memory cell array 17 and reads data therefrom In accordance with the clock signal CLK.

The buffer 13 generates the internal clock signal CLK, by using the external clock signal CK as a trigger pulse. Inevitably, a clock skew exists between the external clock signal CK and the internal clock signal CLK.

The clock control circuit 31 generates a corrected clock signal CK' from the internal clock signal CLK. The corrected clock signal CK' has no timing deviation with respect to the external clock signal CK. The signal CK' is supplied to the input circuit 14 and the output circuit 15. The circuits 14 and 15 receives data and outputs data, respectively, under the control of the corrected clock signal CK'.

FIG. 7 shows the clock control circuit 31 incorporated in the memory 11.

The external clock signal CK is supplied to the input terminal 30 of the memory 11 and hence to the input buffer 13 which has a delay time D1. The input buffer 13 outputs the internal clock signal CLK. The internal clock signal CLK has a skew of D1 with respect to the external clock signal CK, because of the delay time D1 of the input buffer 13. The internal clock signal CLK is input to a delay circuit 32 which has a delay time A. The delay circuit 32 outputs a forward pulse FCL1 (i.e., a forward clock).

The internal clock signal CLK is input to n delay units 33-1, 33-2, 33-3, . . . 33-n. The internal clock signal CLK is input also to an inverter 35, which generates an inverted internal clock signal $\overline{CLK}$. The inverted internal clock signal $\overline{CLK}$ is input to the delay units 33-1, 33-2, 33-3, . . . 33-n.

The delay units 33-1, 33-2, 33-3, . . . 33-n are connected in series. The forward pulse FCL1 is input to the first delay unit 33-1, which outputs a rearward pulse RCL1. The rearward pulse RCL1 is supplied to a delay circuit 34 having a delay time D2. The delay circuit 34 generates a corrected internal clock signal CK'.

The delay units 33-1 to 33-n are identical in structure. One of the units 33-1 to 33-n, delay unit 33-i, will be described, with reference to FIG. 8.

Figure 8:
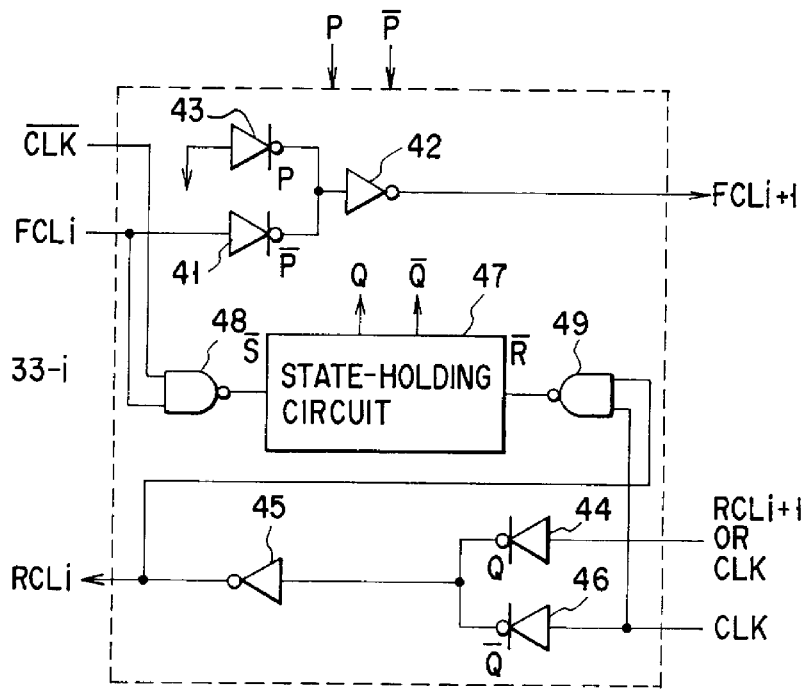
FIG. 8 is a circuit diagram showing one of the identical delay units used in the clock control circuit.

As can be understood from FIG. 8, the delay unit 33-i comprises three circuits, i.e., a forward-pulse delay circuit, a state-holding circuit, and a rearward-pulse delay circuit.

The forward-pulse delay circuit is composed of three inverters 41 to 43. The inverters 41 and 42 are connected in series. The inverter 41 receives the output pulse FCLi of the immediately preceding delay unit. The inverter 42 outputs a pulse FCLi+1 to the succeeding delay unit. The inverter 41 is a clocked inverter, which is controlled by a control pulse $\overline{P}$. When the control pulse $\overline{P}$ is at "1" level, the inverter 41 remains active. The inverter 43 has its output terminal connected to the input terminal of the inverter 42. The input terminal of the inverter 43 is set at "0" potential (e.g., the ground potential). The inverter 43 is a clocked inverter, which is controlled by a control pulse P. When the control pulse P is at "1" level, the inverter 43 remains active.

The rearward-pulse delay circuit is composed of three inverters 44 to 46. The inverters 44 and 45 are connected in series. The inverter 44 receives either the internal clock signal CLK or the pulse RCLi+1 output from the succeeding delay unit. The inverter 45 outputs a pulse RCLi to the preceding delay unit. The inverter 44 is a clocked inverter, which is controlled by a control pulse Q. The inverter 44 is active only while the control pulse Q is at "1" level. The inverter 46 has its output terminal connected to the input terminal of the inverter 45. The input terminal of the inverter 46 receives the internal clock signal CLK at all times. The inverter 46 is also a clocked inverter and controlled by a control pulse $\overline{Q}$. It remains active while the control pulse $\overline{Q}$ is at "1" level.

The state-holding circuit is composed of a state-holding section 47 and two NAND circuits 48 and 49. The NAND circuit 48 receives the output pulse FCLi of the preceding delay unit and a clock signal $\overline{CLK}$ generated by inverting the internal clock signal CLK. The NAND circuit 49 receives the output signal of the inverter 45 and the internal clock signal CLK. The output signal of the NAND circuit 48 is supplied as a set signal to the state-holding section 47. The output signal of the NAND circuit 49 is supplied as a reset signal to the state-holding section 47. The state-holding section 47 is set when the output signal $\overline{S}$ of the NAND circuit 48 (i.e., the set signal) falls to "0" level, and is reset when the output signal of the NAND circuit 49 (i.e., the reset signal $\overline{R}$) falls to "0" level.

The state-holding section 47 is designed to output the control pulses Q and $\overline{Q}$. The control pulse Q rises to "1" level when the section 47 is set. The control pulse $\overline{Q}$ rises to "1" level when the section 47 is reset.

Figure 9:
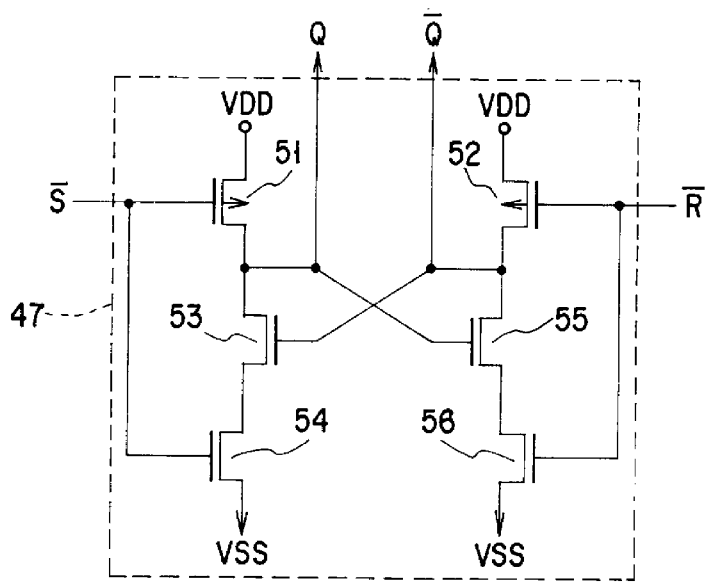
FIG. 9 is a circuit diagram showing the state-holding section of the delay unit shown in FIG. 8.

The state-holding section 47 will be described in detail, with reference to FIG. 9. As shown in FIG. 9, the section 47 comprises P-channel MOS transistors 51 and 52 and N-channel MOS transistors 53 to 56. The P-channel MOS transistor 51 and the N-channel MOS transistors 53 and 54 are connected in series, constituting a series circuit. A high-potential VDD and a low-potential VSS are applied to the ends of the series circuit, respectively. The P-channel MOS transistor 52 and the N-channel MOS transistors 55 and 56 are connected in series, constituting another series circuit. A high-potential VDD and a low-potential VSS are applied to the ends of this series circuit, respectively.

The set signal $\overline{S}$ is input to the gates of the MOS transistors 51 and 54. The reset signal $\overline{R}$ is input to the MOS transistors 52 and 56. The gate of the MOS transistor 53 is connected to the drain of the MOS transistor 52. The gate of the MOS transistor 55 is connected to the drain of the MOS transistor 51. The control pulse Q is output from the drain of the MOS transistor 51, whereas the control pulse $\overline{Q}$ is output from the drain of the MOS transistor 52.

The control pulses P and $\overline{P}$ are generated by a control pulse generating circuit 60 shown in FIG. 7. The circuit 60 will be described, with reference to FIG. 10.

Figure 10:
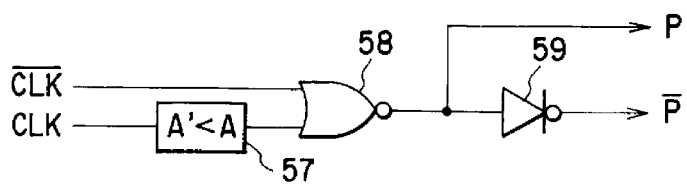
FIG. 10 is a circuit diagram illustrating the control pulse generating circuit incorporated in the clock control circuit.

As seen from FIG. 10, the control pulse generating circuit 60 comprises a delay circuit 57, a two-input NOR circuit 58, and an inverter 59. The internal clock signal CLK is supplied one input terminal of the NOR circuit 58 via the delay circuit 57 which has a delay time A'. The inverted internal clock signal $\overline{CLK}$ is supplied to the other input terminal of the NOR circuit 58. The NOR circuit 58 generates the control pulse P, which is output from the circuit 60. The control pulse P is input to the inverter 59, which generates a control pulse $\overline{P}$.

The widths of the control pulses P and $\overline{P}$ are determined by the delay time of the delay circuit 57. The delay time A' is shorter than the delay time A of the delay circuit 32 which generates a forward clock FCL1. This is because it is necessary to initialize the forward-pulse delay circuits of all delay units 33-1 to 33-n before the forward pulse is input to the first delay unit 23-1.

The skew, i.e., the delay the internal clock signal CLK has with respect to the external clock signal CK, is D1 as illustrated in FIG. 11. Both clock signals CK and CLK have the same cycle T. As shown in FIG. 11, the delay circuit 32 which generates the forward clock FCL1 upon lapse of time A from the leading edge of the first pulse of the internal clock signal CLK. The second pulse of the clock signal CLK is generated upon lapse of time Δf from the leading edge of the forward clock FCL1. The first delay unit 33-1 generates a forward clock RCL1 upon lapse of time 2Δ(Δ=Δf=Δb) from the leading edge of the forward clock FCL1. As a result, the time A from the leading edge of the forward clock RCL1 elapses at the very moment the third pulse of the internal clock signal CLK is generated. Here, (A+W)<T, where W is the width of the forward clocks FCL and RCL.

Assume that time D2 passes from the leading edge of the forward clock RCL1 to the leading edge of the third clock pulse of the external clock signal CK. Then, the delay circuit 34 will generate a corrected internal clock signal CK' which has no skew with respect to the external clock signal CK as seen from FIG. 11. Namely, the delay circuits having a delay time A, a delay time of 2Δ and a delay time D2 cooperate to delay the external clock signal CK by A+2Δ+D2. The corrected internal clock signal CK' is thereby obtained which has the same timing as the external clock signal CK.

It is possible to determined the delay time D2 from the delay time A and the delay time D1, since the time A is a sum of the time D1 and the time d2 (i.e., A=D1+D2). The control pulse P is used to initialize the forward-pulse delay circuits of all delay units 33-1 to 33-n before the forward pulse is input to the first delay unit 23-1.

How the clock control circuit 31 shown in FIGS. 7 to 10 operates will be explained, with reference to FIG. 12 and FIGS. 13 to 21.

2. At Time a in FIG. 12

Figure 13:
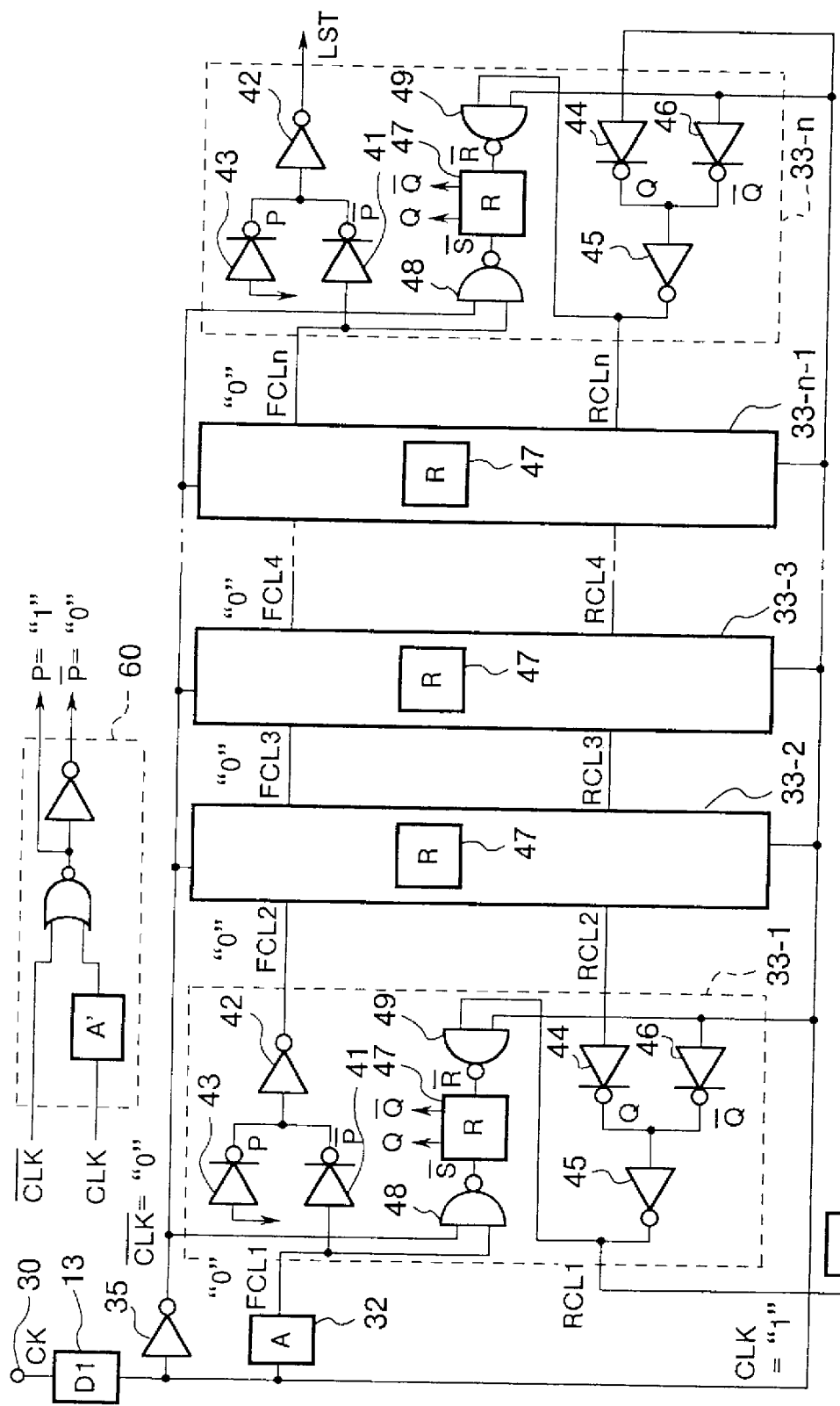
FIG. 13 is a diagram representing how the clock control circuit operates at time a shown in FIG. 12.

The internal clock signal CLK rises to "1" level at time a, as shown in FIG. 12. As a result, the control pulse generating circuit 60 generates control pulses P and $\overline{P}$ which are at "1" level and "0" level, respectively, as illustrated in FIG. 13. The pulses P and $\overline{P}$ have a pulse width determined by the delay time A'. Both control pulses P and $\overline{P}$ are input to the delay units 33-1 to 33-n.

In all delay units 33-1 to 33-n, the inverters 43 and 41 are respectively activated and deactivated, because the pulses P and $\overline{P}$ are at "1" level and "0" level. The output pulses FCL1 to FCLn of the units 33-1 to 33-n are set at "0" level. The line for transmitting the forward pulse is initialized.

When the control pulses P and $\overline{P}$ acquire "0" level and "1" level, respectively, the inverters 41 and 43 are respectively activated and deactivated, in every delay unit. Thus, the forward-pulse delay circuits of the delay units 33-1 to 33-n are electrically connected, and the forward-pulse delay circuit of the first delay unit 33-1 is electrically connected at its input terminal to the delay circuit 32. The forward pulses can then be transmitted.

The control pulses P and $\overline{P}$ must have a width which is less than the period determined by the delay time A of the delay circuit 32. (The width corresponds to the period during which the control pulses P and $\overline{P}$ remain at "1" level and "0" level, respectively.) This is because the line for transmitting the forward pulses output from all delay units 33-1 to 33-n must be initialized before the forward pulse FCL1 (i.e., the forward clock) is input to the first delay unit 33-1.

2. At Time b in FIG. 12

At time b, the internal clock signal CLK falls to "0" level, as shown in FIG. 12. At the same time, the inverted internal clock $\overline{CLK}$ rises to "1" level. Since both internal clock signals CLK and $\overline{CLK}$ are input to all delay units 33-1 to 33-n, one input of the NAND circuit 48 of each delay unit rises to "1" level. The state-holding section 47 of each delay unit is reset, outputting control pulses Q and $\overline{Q}$ which are at "0" level and "1" level, respectively.

Therefore, the inverters 44 and 46 of each delay unit are activated an deactivated, respectively. The delay units 33-1 to 33-n are activated, the forward clocks RCL1 to RCLn output from the delay units 33-1 to 33-n are at "0" level.

3. At Time c in FIG. 12

At time c, the delay circuit 32 outputs a forward pulse FCL1 (i.e., forward clock), which is input to the first delay unit 33-1. The sum of the width of the forward pulse FCL1 (i.e., the period during which the pulse FCL1 remains at "1" level) and the delay time A must be shorter than the cycle T of the internal clock signal CLK.

When the forward pulse FCL1 (="1") is input to the first delay unit 33-1, the other input of the NAND circuit 48 of the unit 33-1 rises to "1" level. The output (i.e., the set signal $\overline{S}$) of the NAND circuit 48 falls to "0" level. As a result, the state-holding section 47 assumes a set state S. Now that the section 47 has assumed the set state S, the control pulses output from the section 47 acquire "1" level and "0" level, respectively. The inverters 44 and 46 are thereby activated and deactivated, respectively, in the first delay unit 33-1.

4. At Times d and e in FIG. 12

Figure 16:
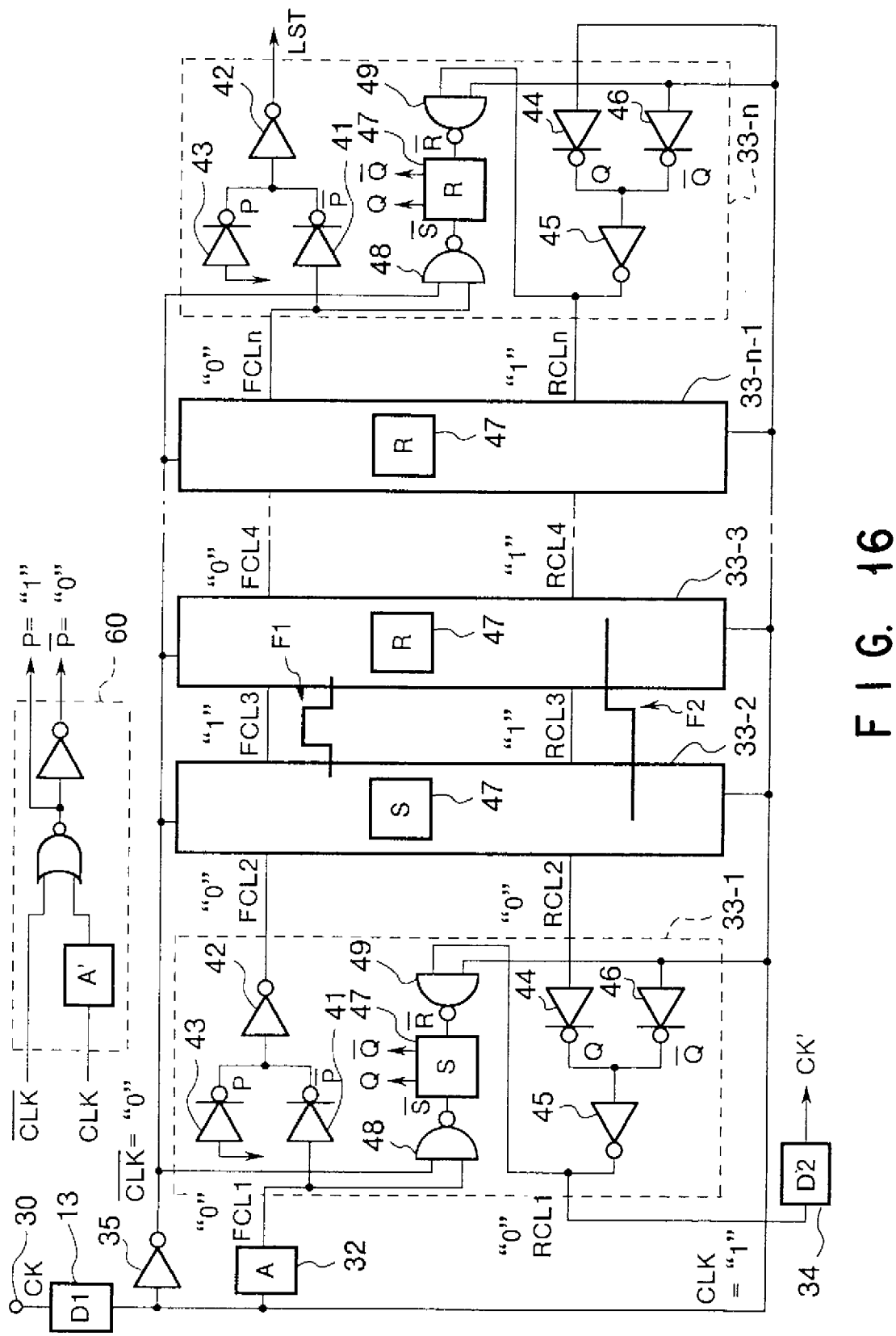
FIG. 16 is a diagram representing how the clock control circuit operates at time d shown in FIG. 12.

At times d and 2, the forward pulse passes through the delay units 33-1 to 33-n, one after another, as illustrated in FIG. 16. When the forward pulse passes through the first delay unit 33-1, the other input of the NAND circuit 48 falls to "0" and the output of the NAND circuit 48 (i.e., the set signal $\overline{S}$) rises to "1" level. Nonetheless, the state-holding section 47 remains in the set state S.

When the forward pulse is input to the second delay unit 33-2, the state-holding section 47 of the unit 33-2 assumes a set state S. The section 47 remains in the set state S even after the forward pulse passes through the second delay unit 33-2. When the internal clock signal CLK again rises to "1" level and the inverted internal clock signal $\overline{CLK}$ falls to "0" level, both internal clock signals CLK and $\overline{CLK}$ are input to all delay units 33-1 to 33-n. Hence, in all delay units 33-1 to 33-n, one input of the NAND circuit 48 changes to "0" level, whereas one input of the NAND circuit 49 changes to "1" level.

In the delay units 33-1 and 33-2, the state-holding circuit 47 assumes the set state S and outputs a control pulse Q at "1" level. The inverters 44 of the units 33-1 and 33-2 are therefore active. The pulses RCL1 and RCL2 output from the rearward-pulse delay circuits of the delay units 33-1 and 33-2 remain at the "0" level. In the other delay units 33-3 to 33-n, the pulses RCL3 to RCLn of the rearward-pulse delay circuits are at "1" level.

Thus, the rearward pulse comes to have a front edge F2, as shown in FIG. 16. The front edge F2 is formed by the third delay unit 33-3, i.e., the delay unit most close to the first delay unit 33-1 among the delay units 33-3 to 33-n in which the state-holding section 47 assume a reset state R.

It is considered that the front edge F1 of the forward pulse is present at time e, immediately before the third delay unit 33-3. The front edge F1 coincides with the front edge F2 of the rearward pulse. Therefore, the time Δf between the leading edge of the forward pulse FCL1 (i.e., the forward clock) and the leading edge of the internal clock pulse CLK is equal to the time Δb between the leading edge of the internal clock pulse and the leading edge of the rearward pulse RCL1.

Figure 17:
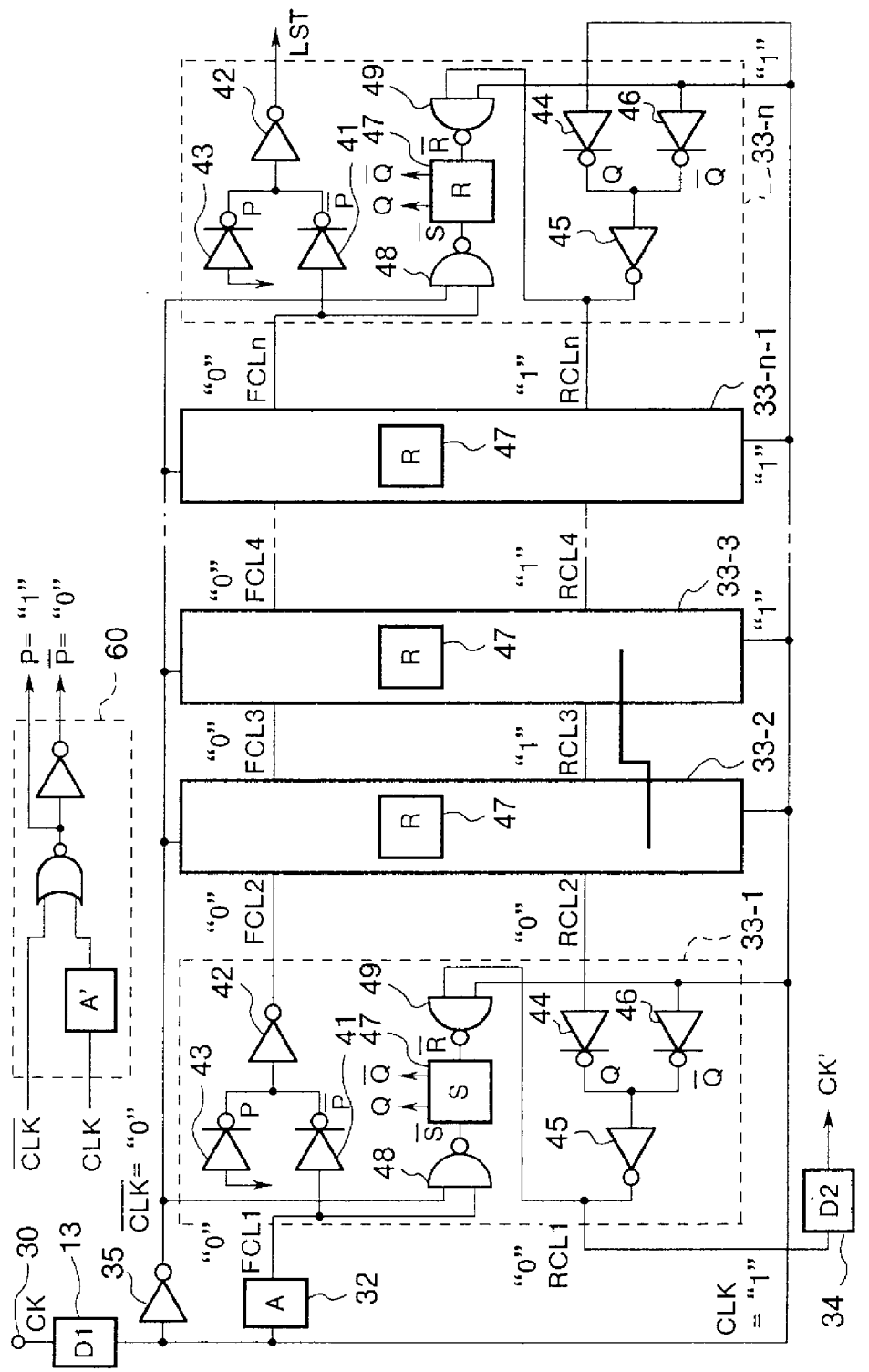
FIG. 17 is a diagram representing how the clock control circuit operates at time e shown in FIG. 12.

As shown in FIG. 17, the control pulses P and $\overline{P}$ output from the control pulse generating circuit 60 acquire "1" level and "0" level, respectively. These pulses P and $\overline{P}$ are input to the delay units 33-1 to 33-n. In each delay unit, the inverters 43 and 44 are respectively activated and deactivated because the control pulses P and $\overline{P}$ are at "1" and "0" level. The output pulses FCL1 to FCLn of the delay units 33-1 to 33-n are at "0" level. In other words, all forward pulses cease to exist, whereby the line for transmitting the forward pulses is initialized.

As the front edge of the rearward pulse (="1") enters the first delay unit 33-1, both inputs to the NAND circuit 49 of the second delay unit 33-2 rise to "1" level. In the second delay unit 33-2, the output of the NAND circuit 49 (i.e., the reset signal $\overline{R}$) falls to "0" level and the state-holding section 47 is initialized, assuming a reset state R.

In each delay unit, the state-holding section 47 is initialized (or reset), exclusively while the internal clock signal CLK remains at "1" level. That is, both inputs of the NAND circuit 49 rise to "1" level when the rearward pulse at "1" level is input while the internal clock signal CLK remains at "1."

Since the state-holding section 47 of each delay unit is initialized during no other period than while the internal clock signal CLK remains at "1" level, the sections 47 of all delay units 33-1 to 33-n may not simultaneously assume a reset state R in some cases. This imposes no particular problem. The next forward pulse passes, without fail, through the first delay unit 33-1 which is not initialized.

5. At Time f in FIG. 12

Figure 18:
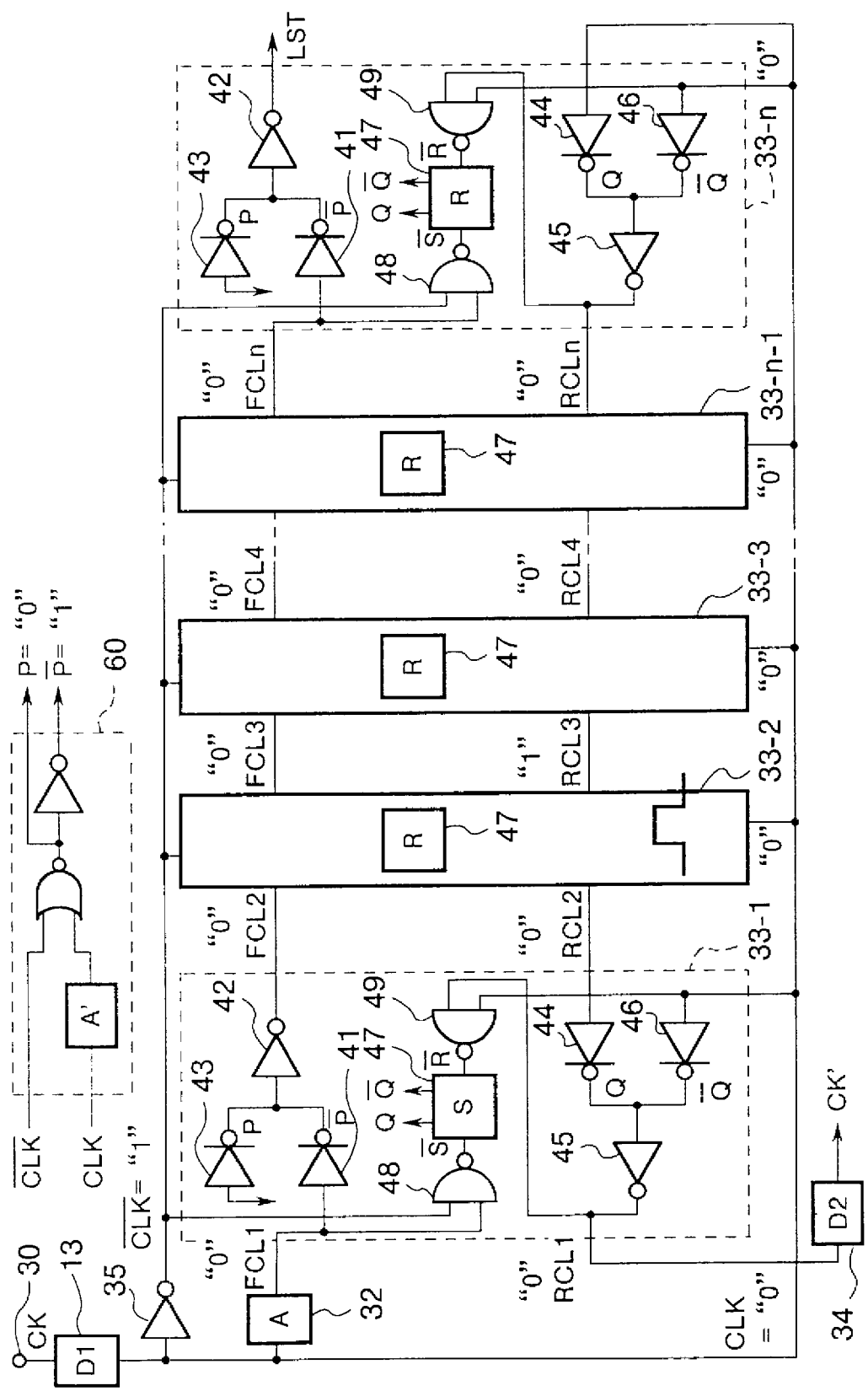
FIG. 18 is a diagram representing how the clock control circuit operates at time f shown in FIG. 12.

At time f, the internal clock signal CLK falls to "0" level and the inverted internal clock signal $\overline{CLK}$ rises to "1" level, as is illustrated in FIGS. 12 and 18. Both signals CLK and $\overline{CLK}$ are input to all delay units 33-1 to 33-n.

In each delay units, the control pulses P and $\overline{P}$ rise to "1" level. The inverters 41 and 43 are respectively activated and deactivated. As a result, the forward-pulse delay circuits of the delay units 33-1 to 33-n are electrically connected, and the forward-pulse delay circuit of the first delay unit 33-1 is electrically connected at its input terminal to the delay circuit 32. The forward pulses can then be transmitted.

In the delay units 33-2 to 33-n, the state-holding section 47 assumes the reset state R and generates a control pulse $\overline{Q}$ at "1" level, and the inverter 46 is activated. Thus, when the internal clock signal CLK falls to "0" level, the output pulses RCL2 to RCLn of the delay units 33-2 to 33-n fall to "0" level, whereby each rearward pulse has a back edge.

The rearward pulses therefore have a width which is either equal to or shorter than the delay time of each delay unit (the sum of the delay times of two inverters). To increase the width of the rearward pulse to a value greater than the delay time of one delay unit, one input terminal of the NAND circuit 49 of the last delay unit 33-n may be connected to the output terminal of the preceding delay unit 33-(n−1), thereby to receive the rear pulse RCLn−1 output by the delay unit 33-(n−1). In this case, the maximum width the rearward pulse can have will correspond to the sum of the delay times of two delay units (i.e., the sum of the delay times of four inverters).

In the first delay unit 33-1, the state-holding section 47 assumes the reset state R and outputs a control pulse Q at level "1." The inverter 44 is therefore activated. Thus, a reward pulse can be supplied to the delay circuit 34 via the first delay unit 33-1.

6. At Time g in FIG. 12

Figure 19:
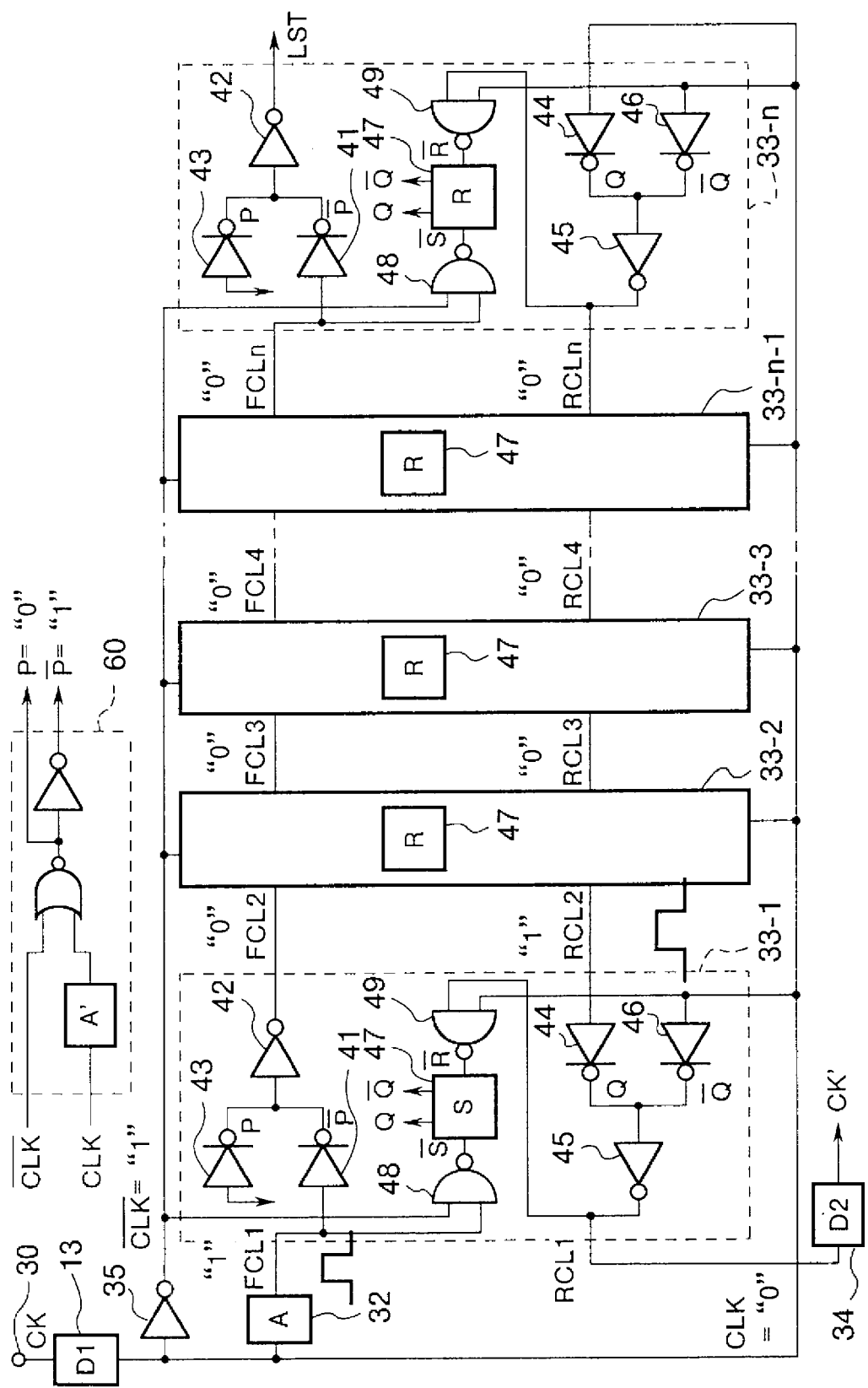
FIG. 19 is a diagram representing how the clock control circuit operates at time g shown in FIG. 12.

As shown in FIGS. 12 and 19, the delay circuit 32 outputs a forward pulse FCL1 (a forward clock) at time g. The forward pulse FCL1 is input to the first delay unit 33-1. In the delay unit 33-1, the other input of the NAND circuit 48 rises to "1" level when the forward pulse FCL1 (="1") is input to the delay unit 33-1. In this case, the output of the NAND circuit 48 (i.e., the set signal $\overline{S}$) falls to "0" level.

The state-holding section 47 of the delay unit 33-1 keeps assuming the set state S until it is reset to assume the reset state R. The section 47 which is now in the set state S outputs control pulses Q and $\overline{Q}$ which are at "1" level and "0" level, respectively. The inverters 44 and 46 of the delay unit 33-1 are therefore activated and deactivated, respectively.

Meanwhile, the rearward pulse is input to the first delay unit 33-1. It is delayed by twice the delay time of one inverter and output from the first delay unit 33-1.

7. At Time h in FIG. 12

Figure 20:
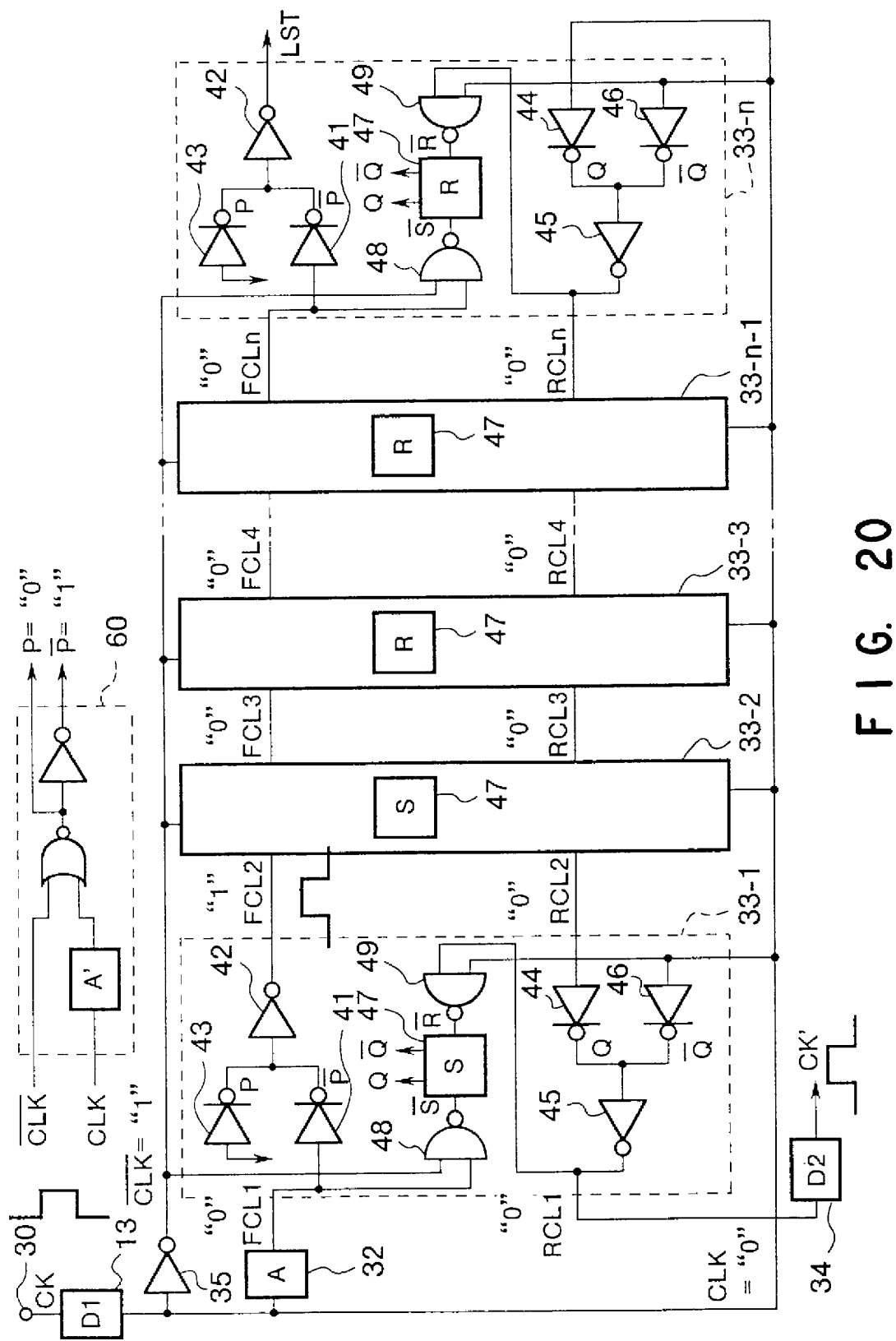
FIG. 20 is a diagram representing how the clock control circuit operates at time h shown in FIG. 12.

As shown in FIG. 20, the rearward pulse passes through the delay units 33-1, 33-2, 33-3, . . . and 33-n. In the first delay unit 33-1 through which the rearward pulse has just passed, the NAND circuit 48 has its other input set at "0" level again and its output set at "1" level (i.e., the set signal $\overline{S}$). However, the state-holding section 47 remains in the set state S.

When the forward pulse is input to the second delay unit 33-2, the state-holding section 47 of the unit 33-2 assumes the set state S. The section 47 remains in the set state S even after the forward pulse has passed through the second delay unit 33-2.

Meanwhile, the rearward pulse is input to the delay circuit 34. The delay circuit 34 delays the rearward pulse by the delay time D2, outputting a pulse of the corrected internal clock pulse CK'. This pulse is synchronous with the pulse of the external clock signal CK.

8. At Time i in FIG. 12

Figure 21:
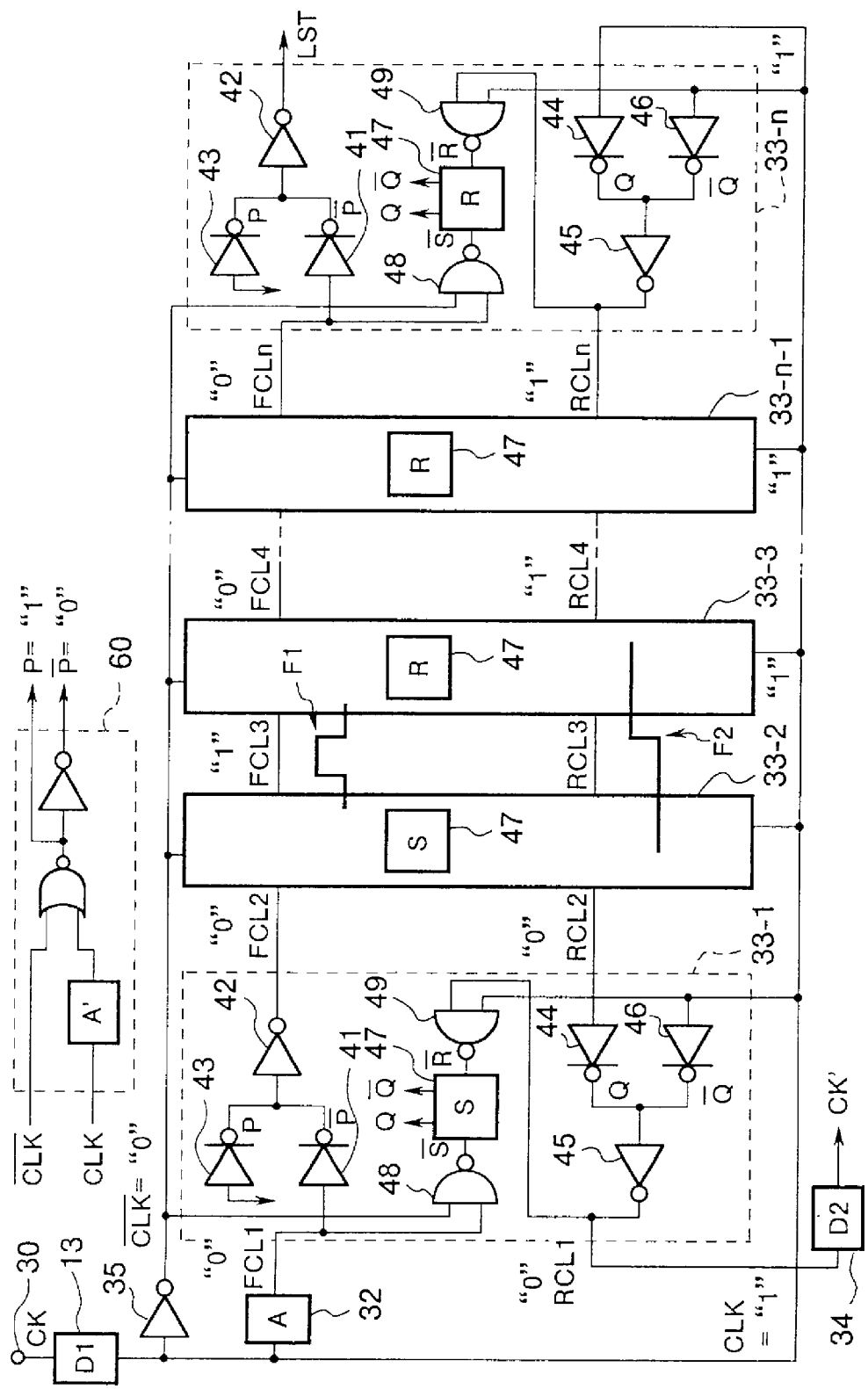
FIG. 21 is a diagram representing how the clock control circuit operates at time i shown in FIG. 12.

As shown in FIG. 21, the internal clock signal CLK rises to "1" level again at time i. The inverted internal clock signal $\overline{CLK}$ therefore falls to "0" level. Both the internal clock signal CLK and the inverted internal clock signal $\overline{CLK}$ are input to the delay units 33-1, 33-2, 33-3, . . . and 33-n. Hence, in each delay unit, the NAND circuit 48 has its one input set at "0" level and the NAND circuit 39 has its one input set at "1" level.

In the first and second delay units 33-1 and 33-2, the state-holding section 47 assumes the set state S and outputs a control pulse Q at "1" level, and the inverter 44 is activated. The output signals RCL1 and RCL2 of the rearward-pulse delay circuits incorporated in the delay units 33-1 and 33-2, respectively, remain at "0" level. In the other delay units 33-3 to 33-n, the output signals RCL3 to RCLn of the rearward-pulse delay circuits are at "1" level, because the state-holding section 47 assumes the reset state R and outputs a control pulse $\overline{Q}$ at "1" level, and the inverter 46 is activated. The front edge F1 of the rearward pulse is thereby formed.

Thereafter, the operations of FIGS. 17 to 21 are repeated sequentially.

In the clock control circuit described above, each of the delay units 33-1 to 33-n has a state-holding section 47. Thanks to the use of the section 47, the time Δf between the leading edge of the forward clock FCL1 (i.e., forward pulse) and the leading edge of a pulse of the internal clock CLK can be correctly copied, providing a time Δb(=Δf). Upon lapse of this time Δb from the leading edge of the pulse of the internal clock signal CLK, the rearward pulse RCL1 can be input to the delay circuit 34 which has a delay time 2D. The delay circuit 34 can therefore generates a corrected internal clock signal CK' which is completely synchronous with the external clock signal CK. This makes it possible to transfer data at high speed in synchronism with a clock signal (high-frequency). The clock control circuit of the invention is useful, also in a memory such as a synchronous DRAM, wherein the internal clock signal is temporarily interrupted and data is transferred in synchronism with a clock signal (high-frequency).

FIG. 23 shows a modification of the clock control circuit 31 shown in FIG. 7. The modified clock control circuit is identical to the circuit of FIG. 7, except that the delay circuit 34 can perform an additional function.

The modified clock control circuit cannot make the internal clock signal CLK synchronous with the external clock signal CK in terms of timing if the clock signal CK or the clock signal CLK has a cycle T longer than a predetermined value. Rather, an internal clock signal CLK having a predetermined skew is used to control the input circuit 14 and output circuit 15 of the memory 11. There is two reasons for this. First, the skew of the internal clock signal CLK does not matter so much if the external clock signal CK has a relatively low frequency and, thus, a relatively long cycle T. Second, a relatively small number of delay units are used in the clock control circuit and occupy a comparatively small area on the memory chip.

The modified clock control circuit will be described.

The external clock signal CK supplied to the input terminal 30 of the memory 11 is input to the input buffer 13 which has a delay time D1. The buffer 13 outputs an internal clock signal CLK, which has a skew of D1 with respect to the external clock signal CK. The internal clock signal CLK is input to a delay circuit 32 which has a delay time A. The delay circuit 32 outputs a forward pulse FCL1 (i.e., a forward clock).

The internal clock signal CLK is input to j delay units 33-1, 33-2, 33-3, . . . 33-n. The internal clock signal CLK is input also to an inverter 35, which generates an inverted internal clock signal $\overline{CLK}$. The inverted internal clock signal $\overline{CLK}$ is input to the delay units 33-1, 33-2, 33-3, . . . 33-n.

The delay units 33-1, 33-2, 33-3, . . . 33-n are connected in series. The forward pulse FCL1 is input to the first delay unit 33-1, which outputs a rearward pulse RCL1. The rearward pulse RCL1 is supplied to a delay circuit 34 having a delay time D2, if the external clock signal CK has a cycle T less than a predetermined value—that is, if the signal CK has a frequency higher than a predetermine value. The delay circuit 34 generates a corrected internal clock signal CK', which is synchronous with the external clock signal CK.

If the external clock signal has a cycle T equal to or longer than the predetermined value, the rearward pulse RCL1 is input to the delay circuit 34 having a delay time D2 but is not output from the delay circuit 34. Instead, the internal clock signal CLK is output from the delay circuit 34. Needless to say, the internal clock signal CLK has a certain skew with respect to the external clock signal CK. The skew is negligibly small, far less than the cycle of the external clock signal CK.

A control pulse generating circuit 61 generates a two control pulses L and $\overline{L}$ from the output LST of the forward-pulse delay circuit of the last delay unit 33-n and the output RCL1 of the rearward-pulse delay circuit of the first delay unit 33-1. The control pulses L and $\overline{L}$ determine which signal must be output, a corrected internal clock signal CK' or an internal clock signal CLK.

FIG. 24 shows the delay circuit 34 (FIG. 23) in detail. As seen from FIG. 34, the circuit 34 comprises a delay circuit 62, an inverter 63, a two-input NAND circuit 64, and inverters 65 to 67. In the circuit 34, the output RCL1 of the delay unit 33-1 is input to one input terminal of the NAND circuit 64 and also to the delay circuit 62. The output of the delay circuit 62, i.e., the pulse RCL1 delayed, is supplied to the inverter 63, inverted thereby and input to the other input terminal of the NAND circuit 64. The output of the NAND circuit 64 is inverted three times by the inverters 65 to 67. The output of the inverter 67 is supplied from the delay circuit 34 as a corrected internal clock signal CK'.

The inverter 66 is a clocked inverter and receives a control pulse $\overline{L}$. It is activated when the control pulse $\overline{L}$ rises to "1" level. While the control pulse $\overline{L}$ remains at "1" level, the inverter 66 delays the rearward pulse RCL1 by a predetermined time, so that the inverter 67 may generates a corrected clock signal CK'. While the control pulse $\overline{L}$ remains at "0" level, the inverter 66 does not lead the rearward pulse RCL1 to the inverter 67.

The delay circuit 34 further comprises an inverter 68. The internal clock signal CLK is input via this inverter 68 to the inverter 67 of the delay circuit 34. The inverter 68 is a clocked inverter and receives a control pulse L. The inverter 68 is activated when the control pulse L rises to "1" level. While the control pulse L remains at "1" level, the inverter 66 leads the internal clock signal CLK to the inverter 67. While the control pulse L remains at "0" level, the inverter 68 does not lead the internal clock signal CLK to the inverter 67.

FIG. 25 shows the control pulse generating circuit 61 (FIG. 23). As illustrated in FIG. 25, the circuit 61 comprises a NOR circuit 69, an inverter 70, NOR circuits 71 and 72, a NAND circuit 73, a delay circuit 74, and an inverter 75.

The output LST of the forward-pulse delay circuit of the last delay unit 33-n is input to one input terminal of the NOR circuit 69, and output of the NOR circuit 72 is input to the other input terminal of the NOR circuit 69. The output of the NOR circuit 69 is input to one input terminal of the NOR circuit 72, and the output of the NOR circuit 71 is input to the other input terminal of the NOR circuit 72.

Input to the NOR circuit 71 are the output LST of the forward-pulse delay circuit of the last delay unit 33-n and the output of the inverter 70, i.e., the inverted output RCL1 of the rearward-pulse delay circuit of the first delay unit 33-1. Input to the NAND circuit 73 are the output of the NOR circuit 69 and the output of the delay circuit 74, i.e., the output of the NOR circuit 69 delayed by a time D3. The output of the NAND circuit 73 is the control pulse L. The inverter 75 inverts the control pulse L, generating the control pulse $\overline{L}$.

The NAND circuit 73 and the delay circuit 74 process the output of the NOR circuit 69, generating a control pulse L. The control pulse L has a leading edge which coincides with that of the output of the NOR circuit 69 and a trailing edge which is delayed by time D3 with respect to that of the output of the NOR circuit 69. That is, the rearward pulse is reliably eliminated in the delay circuit 34, whereby the rearward-pulse delay circuit of the last delay unit 33-n is initialized.

The operating principle of a clock control circuit shown in FIG. 7 will be described, with reference to FIG. 26.

FIG. 26 is a timing chart pertaining to the case where the cycle of an external clock pulse CK is relatively long and the maximum delay maxΔ attained by all delay units is less than the time Δf elapsing from the generation of the forward clock and the generation of an internal clock pulse CLK. To be more specific, FIG. 26 represents the waveforms which the clock signals CK and CLK, a corrected internal clock signal CK' and forward clocks FCL1 and RCL1 have in this specific case. In FIG. 26, T is the cycle of the external clock signal CK, and D1 is the skew the internal clock signal CLK has with respect to the external clock signal CK.

As FIG. 26 shows, a forward clock FCL1 is generated upon lapse of time A from the leading edge of the first pulse of the internal clock signal CLK. Thus, time Δf passes from the time the pulse FCL1 is generated to the time the second pulse of the internal clock signal CLK is generated. Time Δf, which is a delay, cannot be attained by the delay units, however. This is because the maximum delay maxΔ the units can provide is less than time Δf (maxΔ<Δf) as indicated above, and the forward clock RCL1 is generated upon lapse of the time maxΔ.

If a corrected internal clock signal CK' is generated upon lapse of time D2 from the generation of the forward clock RCL1, it will deviate in timing from the external clock signal CK. This deviation is greater, in some cases, than the skew the internal clock signal CLK has with respect to the external clock signal CK, impairing the operating efficiency of the memory which incorporates the clock control circuit.

The modified clock control circuit shown in FIGS. 23 to 25 is designed to prevent the corrected internal clock signal CK' from having a greater skew the internal clock signal CLK, with respect to the external clock signal CK. With the circuit of FIGS. 23 to 25 it is not necessary to satisfy the equation of A+maxΔ≦T as in the clock control circuit shown in FIG. 7. (As defined above, A is the time between the leading edge of the first pulse of the clock signal CLK and the generation of the forward clock FCL1, and maxΔ is the maximum delay the delay units can provide.)

How the clock control circuit of FIGS. 23 to 25 operates will be explained, with the timing chart of FIG. 27.

When A+maxΔ≦T, the circuit operates exactly in the same way as is illustrated in FIG. 12. Hence, how it operates in this case will not be explained here. It will be described below how it operate when A+maxΔ>T, with reference to FIG. 27.

When the internal clock signal CLK rises to "1" level, the control pulses P and $\overline{P}$ acquire "1" and "0" levels, respectively. The signals FCL1 to FCLn input to the forward-pulse delay circuits of the delay units 33-1 to 33-n will all fall to "0." The line for transmitting the forward pulses is initialized.

When the pulses P and $\overline{P}$ thereafter acquire "0" and "1" levels, respectively, thereafter, the forward-pulse delay circuits of the delay units 33-1 to 33-n are electrically connected. The forward pulses can then be transmitted.

When the internal clock signal CLK falls to "0" level and the inverted internal clock signal $\overline{CLK}$ rises to the "1" level, the delay circuit 32 having a delay time A outputs a forward pulse FCL1 (a forward clock). The forward pulse FCL1 is input to the first delay unit 33-1, in which the state-holding section 47 assumes the set state S. The forward pulse FCL1 then passes through the delay units 33-2 to 33-n, one after another. In each delay unit through which the pulse FCL1 has passed, the state-holding section 47 is maintained in the set state S. The forward pulse is finally output from the last delay unit 33-n and is used as an output pulse LST (="1").

The output pulse LST is input to the control pulse generating circuit 61. The circuit 61 generates path-switching signals L (="1") and $\overline{L}$ (="0"). That is, the signals L and $\overline{L}$ are set at "1" and "0" levels when the last delay unit 33-n outputs the pulse LST. The delay circuit 34 is deactivated, whereby the corrected internal clock signal CK' which is synchronous with the internal clock signal CLK in terms of timing is output from the delay circuit 34.

Upon lapse of time maxΔ after the internal clock pulse CLK rises to "1" level again, the first delay unit 33-1 outputs a reward pulse RCL1. The pulse RCL1 is input to the control pulse generating circuit 61. The circuit 61 generates path-switching signals L and $\overline{L}$ after the delay circuit 34 has output the rearward pulse RCL1—that is, after the pulse RCL1 has fallen to "0" level. In other words, the delay circuit 34 is initialized (or activated) and enabled to output the pulse RCL1 supplied from the first delay unit 33-1.

The delay circuit 62, inverter 63 and NAND circuit 64 determine the width of the rearward pulse output from the first delay unit 33-1. When the internal clock signal CLK is used to control the data-writing and -reading into and from the memory 11, the path-switching pulses L and $\overline{L}$ acquire "0" level and "1" level, respectively. The delay circuit 34 is thereby initialized (or activated). The delay circuits 34, 62 and 74 have delay times D3, D2 and D2', which have the relationship of: D3>D2>D2'.

The clock control circuit shown in FIGS. 23 to 25 can generates a corrected internal clock signal CK' which is completely synchronous with the external clock signal CK. The clock control circuit well serves to transfer data at high speed in synchronism with a high-frequency clock signal.

In the modified clock control circuit, either the internal clock signal CLK or the corrected clock signal CK' is used, in accordance with the frequency of the external clock signal CK. To be more specific, the corrected internal clock signal CK' is used to transfer data, if the external clock signal CK has a high frequency and the internal clock signal CLK has a large skew with respect to the signal CK. The internal clock signal CLK is used to transfer data, if the external clock signal CK has a low frequency and the signal CLK has a negligibly small skew with respect to the signal CK.

Which signal, the internal clock signal CLK or the corrected internal clock signal CK', should be used is determined by the number of the delay units provided in the clock control circuit. Thus, the skew the corrected internal clock signal CK' has with respect to the external clock signal CK does not increase if the external clock signal CK has a long cycle T.

Where in a semiconductor chip the components of the clock control circuit of the invention are laid out will be explained, with reference to FIG. 28.

The components of the clock control circuit must be arranged in the chip to reduce the wiring capacitance as much as small, thereby to minimize delay (wiring delay) of signals. To this end, the array 80 of the delay units (hereinafter referred to as "STBD (Synchronous Traced Backwards Delay) array") is positioned at the same distance from the input buffer 13 as from the output buffer 34. As a result, the wiring delay occurring between the STBD array 80 and the input buffer 13 is equal to that between the STBD array 80 and the output buffer 34.

The input buffer 13 is connected to the STBD array 80 by a wire having a length L. The skew D1 of the internal clock signal CLK is therefore the sum of the delay caused by this wire and the delay caused by the input buffer 13. As mentioned above, the delay time of the delay circuit 32 is given as: A=D1+D2 (see FIG. 6). The delay time D2 of the delay circuit 34 (i.e., the output buffer) is the sum of the delay caused by the output buffer 34 and the delay caused by the wire having the length L.

As shown in FIG. 28, the delay circuit 32 consists of four patterns 81 to 84. The pattern 81 provides the skew D1. The pattern 82 is identical to the pattern 81, but is turned around with respect thereto. The pattern 83 which provides the delay time D2 is arranged besides the pattern 82, in the same position as the pattern 82. The pattern 84 is identical to the pattern 83. The patterns 81 to 83 are positioned on one side of the STBD array 80, and the pattern 84 on the opposite side thereof.

Arranged so, the patterns 81 and 83 can provide the skew D1 and the delay time D1 of high precision. Hence, the delay circuit 32 can have a delay time A of a desired valve. This makes it possible to render the corrected internal clock signal CK' sufficiently synchronous with the external clock signal CK.

The clock control circuit of the invention, described above, is advantageous in the following respect. Since each delay unit has a state-holding section, the time Δf passing from the time the generation of the pulse FCL1 to the generation of the next pulse of the internal clock signal CLK can be provide with high accuracy. The rearward pulse RCL1 can therefore be input to the delay circuit 34 having the delay time 2D upon lapse of time Δb from the leading edge of the pulse of the internal clock signal CLK. How the rearward pulse RCL1 is input to the delay circuit 43 in this manner will be explained, with reference to FIGS. 29 to 32.

Figure 29:
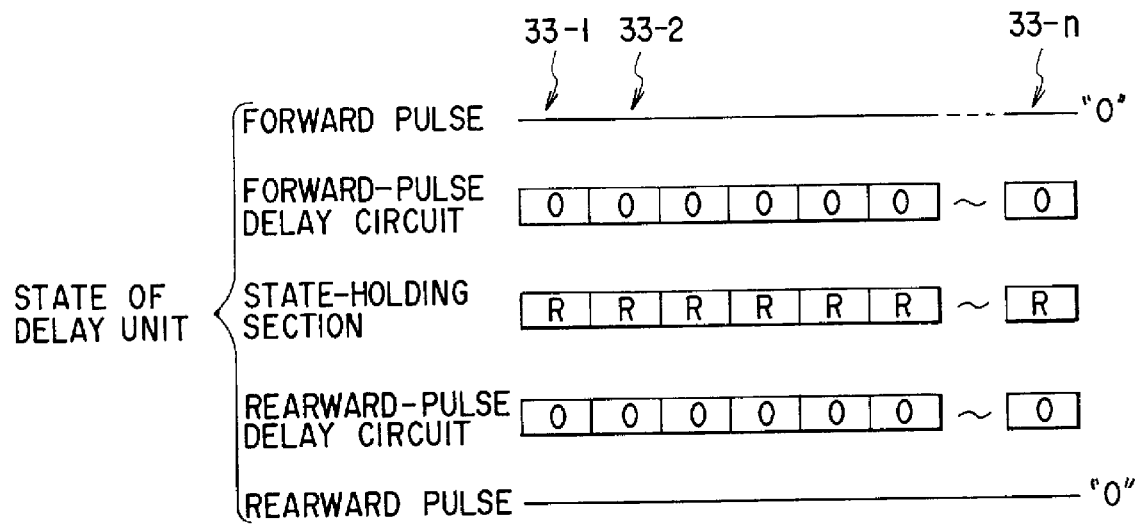
Figure 30:
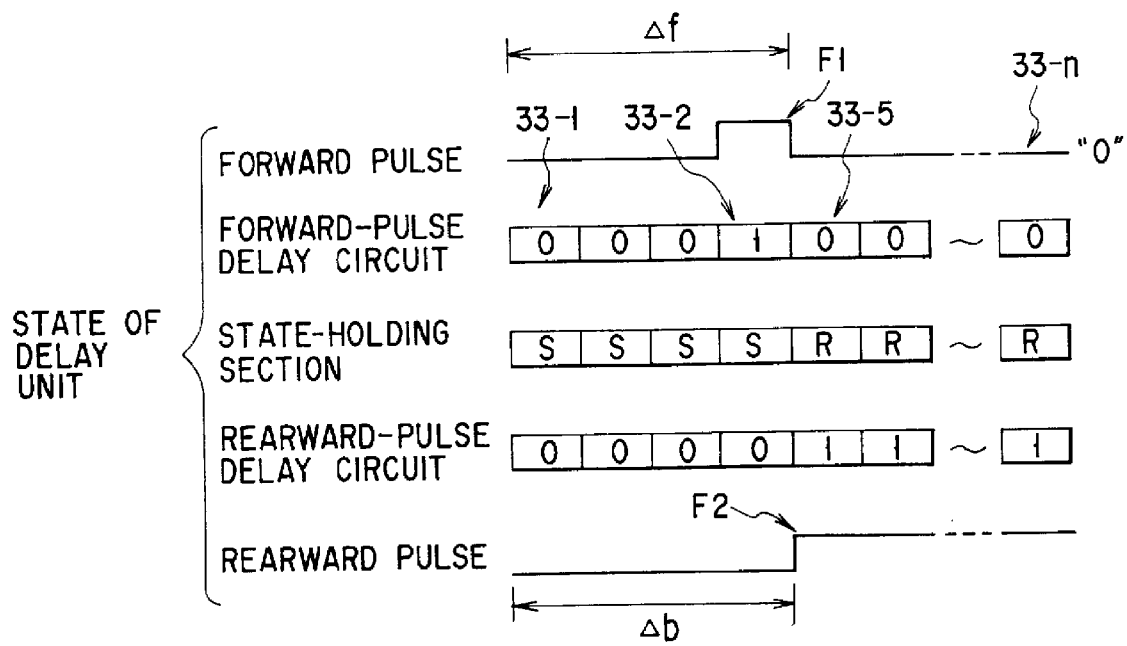

As shown in FIG. 29, the forward-pulse delay circuit and rearward-pulse delay circuit of every delay unit are outputting "0" while the delay circuits 33-1 to 33-n remain initialized. As seen from FIG. 30, a forward pulse is input to the delay unit 33-4, whereby the state-holding sections of the delay units 33-1 to 33-4 assume the set state S, and those of the other delay units 33-5 to 33-n assume the reset state R. When a pulse of the internal clock signal CLK is generated thereafter, the delay units 33-5 to 33-n output "1" because their state-holding sections are reset. As a result, the front edge F1 of the forward pulse and the front edge F2 of the rearward pulse coincide with each other. That is, the delay time Δf and the delay time Δb are equalized. As shown in FIG. 31, the delay unit 33-4 is initialized, and its state-holding section assumes the reset state R. A rearward pulse is thereby generated. This pulse passes through the delay units 33-3 and 33-2. Finally, it is output from the delay unit 33-1 as illustrated in FIG. 32.

Thus, a corrected internal clock signal CK' can be generated which is exactly synchronous with the external clock signal CK. Since the signal CK' is a high-frequency clock signal completely synchronous with the external clock signal CK, it can make it possible to transfer data at high speed.

The signal output from the last delay circuit 33-n is monitored. It can therefore be determined which signal, the internal clock signal CLK or the corrected internal clock signal CK', must be used to transfer data, in accordance with the frequency of the external clock signal. More precisely, if the external clock signal CK has a high frequency and the internal clock signal CLK inevitably has too great a skew, the corrected internal clock signal CK' synchronous with the signal CLK is used to transfer data. If the external clock signal CK has a low frequency and the internal clock signal CLK has but a small skew, the internal clock signal CLK is used to transfer data.

Which signal, the internal clock signal CLK or the corrected internal clock signal CK', must be used to transfer data, is determined also in accordance with the number of delay units used. The skew between the external clock signal CK and the internal clock signal CK' would not increase even if the external clock signal has a relatively long cycle T.

The delay time A is given as (D1+D2), the patterns providing the delay time A are identical to the patterns which provide the delay times D1 and D2. This means that a simplified layout of components is sufficient to constitute a system which generates a corrected internal clock signal CK' synchronous with the external clock signal CK.

The present invention is useful in a memory, such as a synchronous DRAM, in which the internal clock signal is temporarily interrupted and data which receives and outputs data in synchronism with a high-frequency clock signal having a varying frequency.

Figure 33:
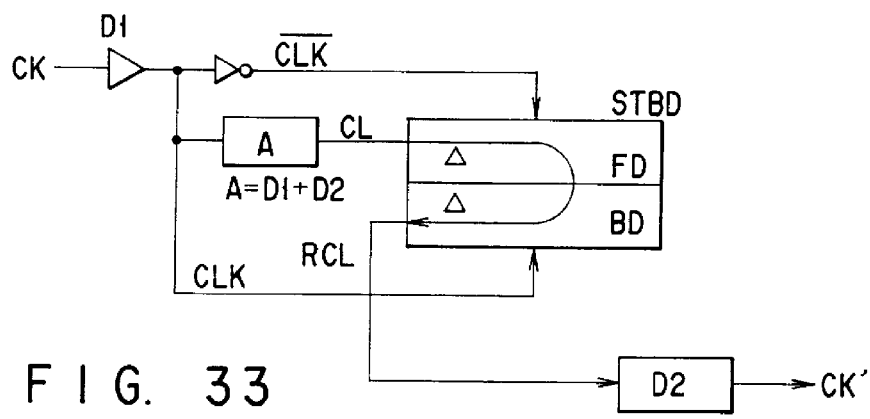
FIG. 33 is a simplified circuit diagram of the clock control circuit shown in FIG. 7.

FIG. 33 is a simplified circuit diagram of the clock control circuit shown in FIG. 7. As FIG. 7 shows, the circuit comprises three delay circuits D1, D2 and A and a STBD array. The circuits D1, D2 and A have delay times D1, D2 and A, respectively. The STBD array is composed of a forward delay section FD and a backward delay section BD.

The corrected internal clock signal CK' generated in the clock control circuit is completely synchronous with the external clock signal CK, having no skew with respect to the signal CK. The circuit shown in FIG. 33 therefore effectively works to transfer data at a leading edge of the external clock signal CK, that is, at the time the signal CK rises from "L" level to "H" level.

Recently it is demand that not only a corrected internal clock signal CK' having no skew, but also an internal clock pulse be generated which is delayed in phase with respect to the external clock signal CK by $(k/j)\times T$, where T is the cycle of the external clock signal CK and k and j are natural numbers, k being greater than j (k<j).

To output data from the memory at, for example, the leading edge and trailing edge of the external clock signal CK, it is necessary to generate an internal clock signal CKD delayed in phase by $T/2$ ($=\pi$) with respect to the clock signal CK, as well as a corrected internal clock signal CK' which is in phase with the clock signal CK. Unless the internal clock signal CKD is delayed in phase with respect to the clock signal CK, exactly by $T/2$ ($=\pi$), the data window (i.e., the period during which the data remains intact) will be short at the time the memory outputs the data. The memory may therefore output erroneous data.

Various embodiments of the clock control circuit according to the invention will be described, which can generate an internal clock signal CKD which is delayed in phase with respect to the external clock signal CK, exactly by $(k/j)\times T$.

Figure 34:
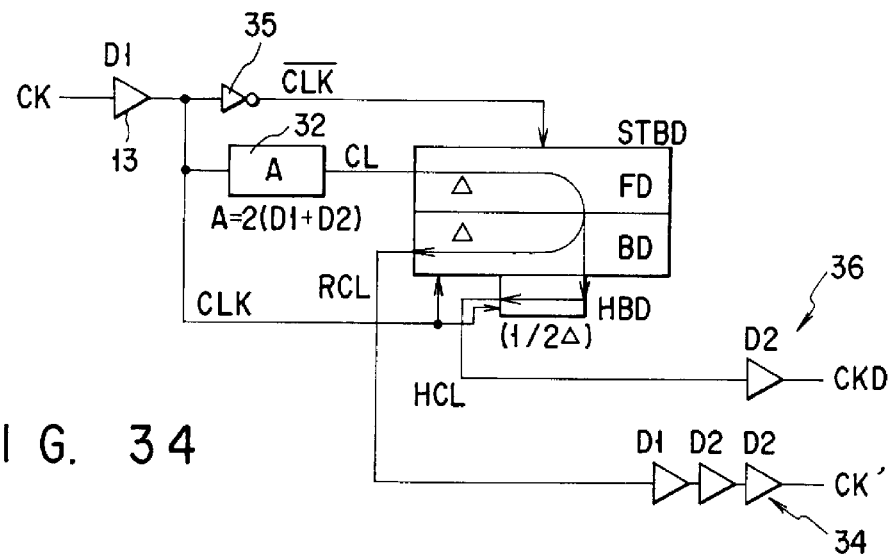
FIG. 34 is a circuit diagram showing a first embodiment of the clock control circuit according to the invention.

FIG. 34 shows the first embodiment of the clock control circuit. The first embodiment generates not only a corrected internal clock signal CK' set in phase with the external clock signal CK, but also an internal clock signal CKD delayed in phase by $T/2$ ($=\pi$) with respect to the clock signal CK, where T is the cycle of the clock signal CK.

As shown in FIG. 34, this circuit comprises an input buffer 13, three delay circuits 32, 34 and 36, an STBD array, an inverter 35, and a half backward delay section HBD. The input buffer 13 has a delay time D1, and the delay circuits 32, 34 and 36 have a delay time A, a delay time (2×D1+D2) and a delay time D2, respectively. The STBD array is composed of a forward delay section FD and a backward delay section BD.

In operation, the external clock signal CK is input to the input buffer 13. The buffer 13 generates an internal clock signal CLK having a skew of D1 with respect to the external clock signal CK. The internal clock signal CLK is supplied to the delay circuit 32, which generates a forward clock CL (a forward pulse FCL1). The pulse CL is input to the forward delay section FD of the STBD array. The section FD puts the forward clock CL forward by a time Δ. The pulse CL thus put forward is supplied to the backward section BD and then to the half backward delay section HBD. The section BD generates a rearward pulse RCL, and the section HBD generates a rearward pulse HCL. The pulse RCL is delayed precisely by the time Δ, and the pulse HCL is delayed exactly by the time Δ/2.

The internal clock signal CLK is input to the sections BD and HBD and determines the timing of generating the rearward pulses RCL and HCL. The inverter 35 inverts the internal clock signal CLK, generating an inverted internal clock signal $\overline{CLK}$. The clock signal $\overline{CLK}$ is input to the forward delay section FD and determines the time Δ by which the forward clock CL is to be put forward.

The rearward pulse RCL is supplied to the delay circuit 34. The circuit 34 delays the pulse RCL by the time (2×D1+D2), generating a corrected internal clock signal CK' which is in phase with the external clock signal CK. In the meantime, the rearward pulse HCL is supplied to the delay circuit 36. The circuit 36 delays the pulse HCL by the time D2, generating an internal clock signal CKD which is delayed in phase by T/2 (=180°). It should be noted here that the delay time A of the delay circuit 32 is set at 2×(D1+D2).

Figure 35:
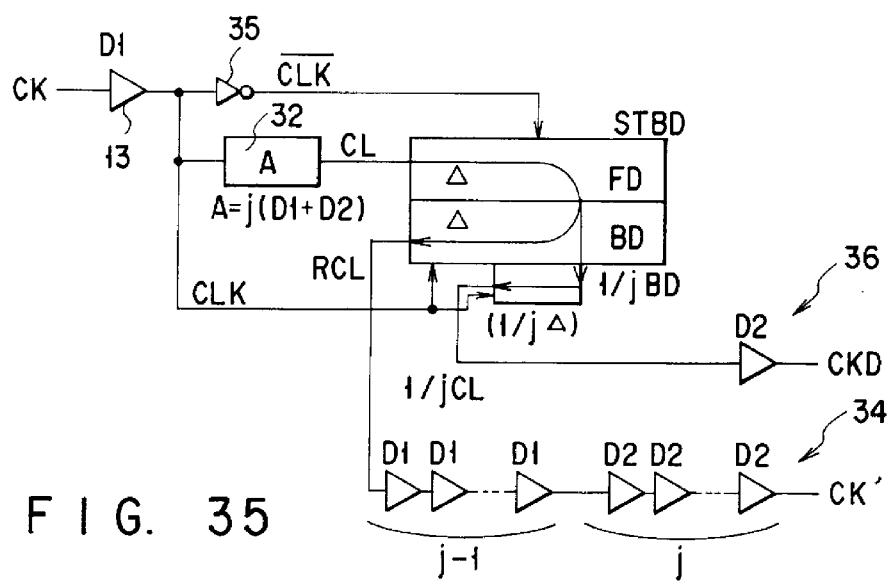
FIG. 35 is a circuit diagram showing a second embodiment of the clock control circuit according to the invention.

FIG. 35 shows the second embodiment of the clock control circuit according to the invention. The second embodiment generates not only a corrected internal clock signal CK' set in phase with the external clock signal CK, but also an internal clock signal CKD delayed in phase by T/j (=2 π/j) with respect to the clock signal CK, where T is the cycle of the clock signal CK.

As FIG. 35 shows, the circuit comprises an input buffer 13, three delay circuits 32, 34 and 36, and an STBD array, an inverter 35, and a 1/j backward delay section 1/jBD. The input buffer 13 has a delay time D1, and the delay circuits 32, 34 and 36 have a delay time A, a delay time ([j−1]× D1+j×D2) and a delay time D2, respectively. The STBD array is composed of a forward delay section FD and a backward delay section BD.

In operation, the external clock signal CK is input to the input buffer 13. The buffer 13 generates an internal clock signal CLK having a skew of D1 with respect to the external clock signal CK. The internal clock signal CLK is supplied to the delay circuit 32, which generates a forward clock CL (a forward pulse FCL1). The pulse CL is input to the forward delay section FD of the STBD array. The section FD puts the forward clock CL forward by a time Δ. The pulse CL thus put forward is supplied to the backward section BD and then to the 1/j backward delay section 1/jBD. The section BD generates a rearward pulse RCL, and the section 1/jBD generates a rearward pulse 1/jCL. The pulse RCL is delayed precisely by the time Δ, and the pulse 1/jCL is delayed exactly by the time Δ/j.

The internal clock signal CLK is input to the sections BD and 1/jBD and determines the timing of generating the rearward pulses RCL and 1/jCL. The inverter 35 inverts the internal clock signal CLK, generating an inverted internal clock signal $\overline{CLK}$. The clock signal $\overline{CLK}$ is input to the forward delay section FD and determines the time Δ by which the forward clock CL is to be put forward.

The rearward pulse RCL is supplied to the delay circuit 34. The circuit 34 delays the pulse RCL by the time ([j−1]×D1+j×D2), generating a corrected internal clock signal CK' which is in phase with the external clock signal CK. In the meantime, the rearward pulse 1/jCL is supplied to the delay circuit 36. The circuit 36 delays the pulse 1/jCL by the time D2, generating an internal clock signal CKD which is delayed in phase by T/j (=360°/j). It should be noted here that the delay time A of the delay circuit 32 is set at 2×(D1+D2).

FIG. 36 illustrates the third embodiment of the clock control circuit according to the invention. The third embodiment generates not only a corrected internal clock signal CK' set in phase with the external clock signal CK, but also an internal clock signal CKD delayed in phase by T×k/j (=2 π×k/j) with respect to the clock signal CK, where T is the cycle of the clock signal CK and k and j are natural numbers, k being greater than j (k<j).

As seen from FIG. 36, the third embodiment comprises an input buffer 13, three delay circuits 32, 34 and 36, an STBD array, an inverter 35, and an k/j backward delay section k/jBD. The input buffer 13 has a delay time k×D1, and the delay circuits 32, 34 and 36 have a delay time A, a delay time ([j−k]×D1+j×D2) and a delay time k×D2, respectively. The STBD array is composed of a forward delay section FD and a backward delay section BD.

In operation, the external clock signal CK is input to the input buffer 13. The buffer 13 generates an internal clock signal CLK having a skew of k×D1 with respect to the external clock signal CK. The internal clock signal CLK is supplied to the delay circuit 32, which generates a forward clock CL (a forward pulse FCL1). The pulse CL is input to the forward delay section FD of the STBD array. The section FD puts the forward clock CL forward by a time Δ. The pulse CL thus put forward is supplied to the backward section BD and then to the k/j backward delay section k/jBD. The section BD generates a rearward pulse RCL, and the section k/jBD generates a rearward pulse k/jCL. The pulse RCL is delayed precisely by the time Δ, and the pulse k/jCL is delayed exactly by the time Δ×k/j.

The internal clock signal CLK is input to the sections BD and k/jBD and determines the timing of generating the rearward pulses RCL and k/jCL. The inverter 35 inverts the internal clock signal CLK, generating an inverted internal clock signal $\overline{CLK}$. The clock signal $\overline{CLK}$ is input to the forward delay section FD and determines the time Δ by which the forward clock CL is to be put forward.

The rearward pulse RCL is supplied to the delay circuit 34. The circuit 34 delays the pulse RCL by the time ([j−k]×D1+j×D2), generating a corrected internal clock signal CK' which is in phase with the external clock signal CK. In the meantime, the rearward pulse k/jCL is supplied to the delay circuit 36. The circuit 36 delays the pulse k/jCL by the time k×D2, generating an internal clock signal CKD which is delayed in phase by T×k/j (=360°×k/j). It should be noted that the delay time A of the delay circuit 32 is set at j×(D1+D2).

FIG. 37 shows the fourth embodiment of the clock control circuit according to the invention. The fourth embodiment generates not only a corrected internal clock signal CK' set in phase with the external clock signal CK, but also an internal clock signal CKD delayed in phase by k×T/j (=2 π×k/j) with respect to the clock signal CK, where T is the cycle of the clock signal CK and k and j are natural numbers, k being greater than j (k<j).

As FIG. 37 shows, the fourth embodiment comprises an input buffer 13, three delay circuits 32, 34 and 36, and STBD array, an inverter 35, and an k/j backward delay section k/jBD. The input buffer 13 has a delay time D1, and the delay circuits 32, 34 and 36 have a delay time A, a delay time ([j−1]×D1+j×D2) and a delay time ([k−i]×D1+k×D2), respectively. The STBD array is composed of a forward delay section FD and a backward delay section BD.

In operation, the external clock signal CK is input to the input buffer 13. The buffer 13 generates an internal clock signal CLK having a skew of D1 with respect to the external clock signal CK. The internal clock signal CLK is supplied to the delay circuit 32, which generates a forward clock CL (a forward pulse FCL1). The pulse CL is input to the forward delay section FD of the STBD array. The section FD puts the forward clock CL forward by a time Δ. The pulse CL thus put forward is supplied to the backward section BD and then to the k/j backward delay section k/jBD. The section BD generates a rearward pulse RCL, and the section k/jBD generates a rearward pulse k/jCL. The pulse RCL is delayed precisely by the time Δ, and the pulse k/jCL is delayed exactly by the time Δ×k/j.

The internal clock signal CLK is input to the sections BD and k/jBD and determines the timing of generating the rearward pulses RCL and k/jCL. The inverter 35 inverts the internal clock signal CLK, generating an inverted internal clock signal $\overline{CLK}$. The clock signal $\overline{CLK}$ is input to the forward delay section FD and determines the time Δ by which the forward clock CL is to be put forward.

The rearward pulse RCL is supplied to the delay circuit 34. The circuit 34 delays the pulse RCL by the time ([j−1]×D1+j×D2), generating a corrected internal clock signal CK' which is in phase with the external clock signal CK. In the meantime, the rearward pulse k/jCL is supplied to the delay circuit 36. The circuit 36 delays the pulse k/jCL by the time ([k−1]×D1+k×D2), generating an internal clock signal CKD which is delayed in phase by T×k/j (=360°×k/j). It should be noted that the delay time A of the delay circuit 32 is set at j×(D1+D2).

FIG. 38 shows the fifth embodiment of the clock control circuit according to the invention. The fourth embodiment generates not only a corrected internal clock signal CK' set in phase with the external clock signal CK, but also three internal clock signals CKQ, CKH and CK3Q which are delayed in phase by T/4 (=90°), T/2 (=180°) and 3T/4 (=270°), respectively, with respect to the clock signal CK.

As is shown in FIG. 38, the fifth embodiment comprises an input buffer 13, delay circuits 32 and 34, a SAD (Synchronous Adjustable Delay) array, an inverter 35, delay circuits 36a, 36b and 36c, and delay sections QBD, HBD AND 3QBD. The input buffer 13 has a delay time D1, the delay circuits 32 has a delay time A, and the delay circuit 34 has a delay time (3×D1+4×D2). The delay circuits 36a, 36b and 36c have a delay time D2, (D1+2×D2) and (2×D1+3×D2), respectively. The SAD array is composed of a forward delay section FD and a backward delay section BD.

In operation, the external clock signal CK is input to the input buffer 13. The buffer 13 generates an internal clock signal CLK having a skew of D1 with respect to the external clock signal CK. The internal clock signal CLK is supplied to the delay circuit 32, which generates a forward clock CL (a forward pulse FCL1). The pulse CL is input to the forward delay section FD of the SAD array which is, for example, an STBD array.

The section FD puts the forward clock CL forward by a time Δ. The pulse CL thus put forward is supplied to the backward delay section BD, quarter backward delay section QBD, half backward delay section HBD and 3-quarter backward delay section 3QBD. The backward delay section BD delays the pulse CL by time Δ (the delay time of j delay elements), generating a rearward pulse RCL. The quarter backward delay section QBD delays the pulse CL by time Δ/4 (the delay time of j/4 delay elements), generating a rearward pulse QCL. The half backward delay section HBD delays the pulse CL by time Δ/2 (the time of j/2 delay elements), generating a rearward pulse HCL. The 3-quarter backward delay section 3QBD delays the pulse CL by time 3Δ/4 (the delay time of 3j/4 elements), generating a rearward pulse 3QCL.

The internal clock signal CLK is input to the sections BD, QBD, HBD and 3QBD, determines the timing of generating the rearward pulses RCL, QCL, HCL and 2QBD. The inverter 35 inverts the internal clock signal CLK, generating an inverted internal clock signal $\overline{CLK}$. The clock signal $\overline{CLK}$ is input to the forward delay section FD and determines the time Δ by which the forward clock CL is to be put forward.

The rearward pulse RCL is supplied to the delay circuit 34. The circuit 34 delays the pulse RCL by the time (3×D1+4×D2), generating a corrected internal clock signal CK' which is in phase with the external clock signal CK. The rearward pulse QCL is supplied to the delay circuit 36a. The circuit 36a delays the pulse QCL by the time D2, generating an internal clock signal CKQ which is delayed in phase by T/4 (=90°). The rearward pulse HCL is supplied to the delay circuit 36b. The circuit 36b delays the pulse HCL by the time (D1+2×D2), generating an internal clock signal CKH which is delayed in phase by T/2 (=180°). Similarly, the rearward pulse 3QCL is supplied to the delay circuit 36c. The circuit 36c delays the pulse 3QCL by the time (2×D1+3×D2), generating an internal clock signal CKD which is delayed in phase by 3T/4 (=270°).

It should be noted that the delay time A of the delay circuit 32 is set at 4×(D1+D2).

FIG. 39 shows, in detail, the fourth embodiment, i.e., the clock control circuit illustrated in FIG. 37.

The external clock signal CK is supplied to the input terminal 30 of the memory. The signal CK is then input to the input buffer 13 which has, as mentioned above, a delay time D1. The input buffer 13 generates an internal clock signal CLK which has a skew of D1 with respect to the external clock signal CK. The signal CLK is input to the delay circuit 32 having a delay time A. The circuit 32 generates a forward pulse FCL1 (a forward clock CL).

Meanwhile, the inverter 35 inverts the internal clock signal CLK, generating an inverted internal clock signal $\overline{CLK}$. The signals CLK and $\overline{CLK}$ are supplied to n delay units 33-1 to 33-n. The units 33-1 to 33-n are connected in series. The forward pulse FCL1 is input to the first delay unit 33-1, which generates a rearward pulse RCL1.

A control pulse generating circuit 60 generates control pulses P and $\overline{P}$ which are at "1" level and "0" level, respectively. The control pulses P and $\overline{P}$ are supplied to the delay units 33-1 to 33-n. Each delay unit 33-i (i=1 to n) generates control pulses Qi and $\overline{Qi}$. The control pulses Qi and $\overline{Qi}$ are input to the k/j backward delay section k/jBD 37.

The rearward pulse RCL1 is supplied to the delay circuit 34. The circuit 34 delays the pulse RCL by the time (j−1)×D1+j×D2, generating a corrected internal clock signal CK' which is in phase with the external clock signal CK. The rearward pulse k/jCL is supplied to the delay circuit 36. The circuit 36 delays the pulse k/jCL by the time (k−1)×D1+k×D2, generating an internal clock signal CKD which is delayed in phase by T×k/j (=360°×k/j).

FIG. 40 shows in detail one of the identical delay units 33-1 to 33-n, which will be referred to as "delay unit Ui."

As seen from FIG. 40, the delay unit Ui comprises three circuits, i.e., a forward-pulse delay circuit, a state-holding circuit, and a rearward-pulse delay circuit.

The forward-pulse delay circuit is composed of three inverters 41 to 43. The inverters 41 and 42 are connected in series. The inverter 41 receives the output pulse FCLi of the immediately preceding delay unit. The inverter 42 outputs a pulse FCLi+1 to the succeeding delay unit. The inverter 41 is a clocked inverter, which is controlled by a control pulse $\overline{P}$. When the control pulse $\overline{P}$ is at "1" level, the inverter 41 remains active. The inverter 43 has its output terminal connected to the input terminal of the inverter 42. The input terminal of the inverter 43 is set at "0" potential (e.g., the ground potential). The inverter 43 is a clocked inverter, which is controlled by a control pulse P. When the control pulse P is at "1" level, the inverter 43 remains active.

The rearward-pulse delay circuit is composed of three inverters 44 to 46. The inverters 44 and 45 are connected in series. The inverter 44 receives either the internal clock signal CLK or the pulse RCLi+1 output from the succeeding delay unit. The inverter 45 outputs a pulse RCL1 to the preceding delay unit. The inverter 44 is a clocked inverter, which is controlled by a control pulse Q. The inverter 44 is active only while the pulse signal Q is at "1" level. The inverter 46 has its output terminal connected to the input terminal of the inverter 45. The input terminal of the inverter 46 receives the internal clock signal CLK at all times. The inverter 46 is also a clocked inverter and controlled by a control pulse $\overline{Q}$. It remains active while the control pulse $\overline{Q}$ is at "1" level.

The state-holding circuit is composed of a state-holding section 47 and two NAND circuits 48 and 49. The NAND circuit 48 receives the output pulse FCLi of the preceding delay unit and a clock signal $\overline{CLK}$ generated by inverting the internal clock signal CLK. The NAND circuit 49 receives the output signal of the inverter 45 and the internal clock signal CLK. The output signal of the NAND circuit 48 is supplied as a set signal to the state-holding section 47. The output signal of the NAND circuit 49 is supplied as a reset signal to the state-holding section 47. The state-holding section 47 is set when the output signal $\overline{S}$ of the NAND circuit 48 (i.e., the set signal) falls to "0" level, and is reset when the output signal of the NAND circuit 49 (i.e., the reset signal $\overline{R}$) falls to "0" level.

The state-holding section 47 is designed to output the control pulses Q and $\overline{Q}$. The control pulse Q rises to "1" level when the section 47 is set. The control pulse Q rises to "1" level when the section 47 is reset.

The state-holding section 47 is, for example, of such a type as is illustrated in FIG. 9.

After the forward pulse has passed trough the delay unit Ui, the control pulse Qi rises to "H" level, and the control pulse $\overline{Qi}$ falls to "L" level.

Figure 41:
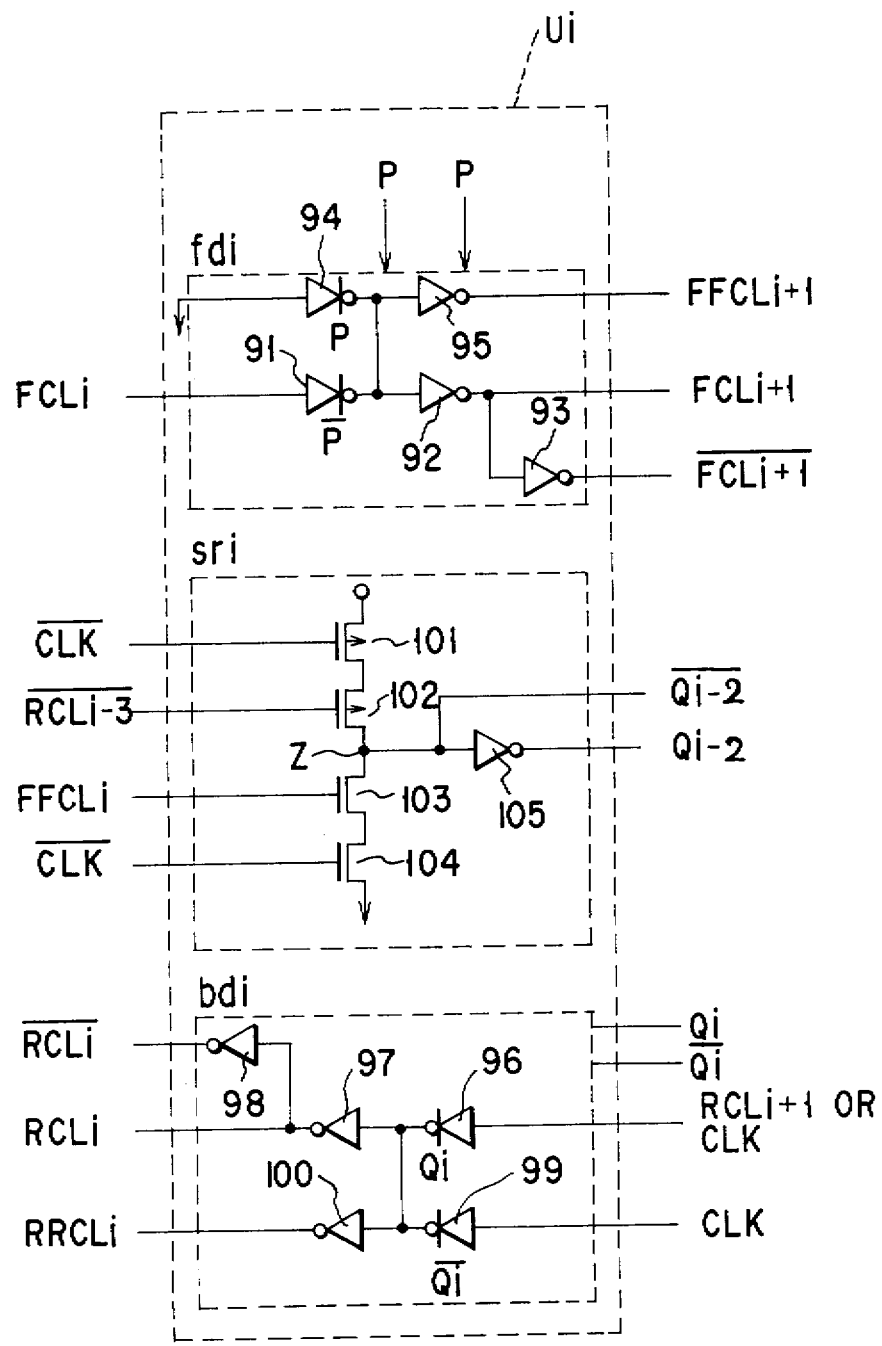
FIG. 41 is a diagram showing a modification of the delay unit Ui illustrated in FIG. 40.

FIG. 41 illustrates a modification of the delay unit Ui shown in FIG. 40.

As seen from FIG. 40, the modified delay unit Ui comprises three circuits, i.e., a forward-pulse delay circuit fdi, a state-holding circuit sri, and a rearward-pulse delay circuit bdi.

The forward pulse delay circuit fdi is composed of five inverters 91 to 95. The inverters 91 and 93 are connected in series. The inverter 91 receives the output signal FCLi of the preceding delay unit. The inverter 92 supplies a signal FCLi+1 to the following delay unit. The inverter 91 is a clocked inverter, which is controlled by a control pulse $\overline{P}$. The inverter 91 is active only while the control pulse $\overline{P}$ is at "1" level. The inverter 94 has its output terminal connected to the output terminal of the inverter 91 and also to the input terminals of the inverters 92 and 95. The input terminal of the inverter 94 is set at "0" potential (e.g., the ground potential). The inverter 94 is a clocked inverter, which is controlled by a control pulse P. When the control pulse P is at "1" level, the inverter 43 remains active.

The rearward-pulse delay circuit bdi is composed of five inverters 96 to 100. The inverters 96 and 98 are connected in series. The inverter 96 receives either the internal clock signal CLK or the pulse RCLi+1 output from the succeeding delay unit. The inverter 97 outputs a pulse RCLi to the preceding delay unit. The inverter 96 is a clocked inverter, which is controlled by a control pulse Qi+2. The inverter 96 is active only while the control pule Qi+2 is at "1", level. The inverter 99 has its output terminal connected to the input terminal of the inverter 96. The input terminal of the inverter 99 receives the internal clock signal CLK at all times. The inverter 99 is also a clocked inverter and controlled by a control pulse $\overline{Qi+2}$. It remains active while the control pulse $\overline{Q+2}$ is at "1" level.

The state-holding circuit sri is composed of P-channel MOS transistors 101 and 102, N-channel MOS transistors 103 and 104, and an inverter 105. The P-channel MOS transistors 101 and 102 are connected in series between the power-supply terminal and a node Z. The N-channel MOS transistors 103 and 104 are connected in series between the ground terminal and the node Z. The gates of the MOS transistors 101 and 104 are connected to receive a clock signal $\overline{CLK}$ obtained by inverting the internal clock signal CLK. The gate of the MOS transistor 102 is connected to receive the output signal $\overline{RCLi-3}$ of the delay unit Ui-3. The gate of the MOS transistor 103 is connected to receive the output signal FFCLi of the delay unit Ui-1. The input terminal of the inverter 105 is connected to the node Z. A control pulse Qi is output from the output terminal of the inverter 105. A control pulse $\overline{Qi}$ is output from the node Z.

Figure 42:
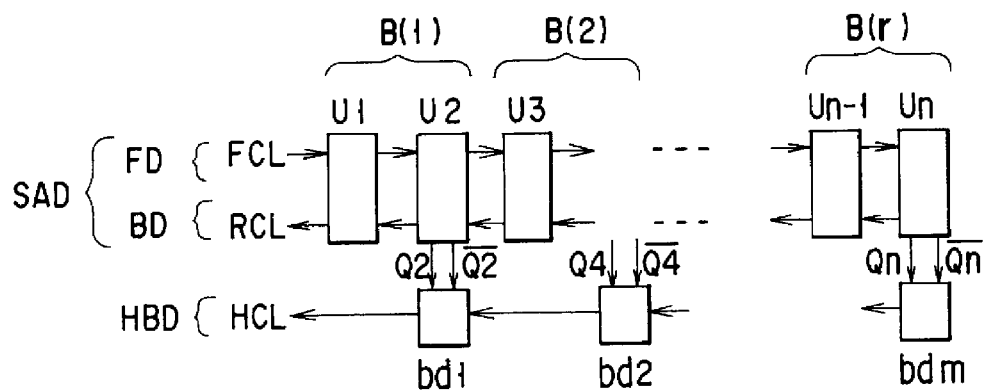
FIG. 42 is a diagram showing one example of the k/j backward delay section k/jBD illustrated in FIG. 39.
Figure 43:
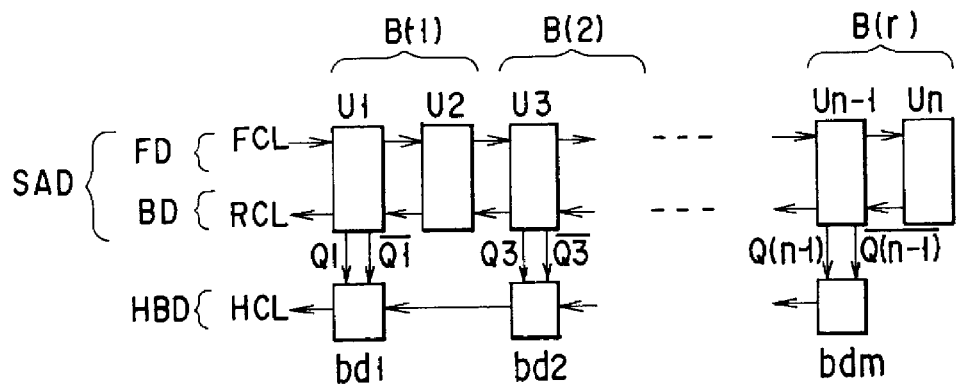
FIG. 43 is a diagram showing another example of the k/j backward delay section k/jBD illustrated in FIG. 39.

FIGS. 42 and 43 show two examples of the k/j backward delay section k/jBD 37 illustrated in FIG. 39. Either example functions as an HBD (Half Backward Delay) section when j=2, K=1 (for example, n=100, m=50)—that is, when internal clock signal CLK is delayed in phase by T/2 with respect to the external clock signal CK.

The HBD is composed of m delay units bdi (i=1 to m). Each delay unit bdi is identical in structure to the rearward pulse delay circuit bdi of a SAD (Synchronous Adjustable Delay) unit Ui. Hence, the ratio of the time by which the section BD delays the rearward pulse to the time by which the HBD section delays the rearward pulse is equal to the ratio of the number of delay units provided in the section BD to the number of delay units provided in the HBD section. To be more specific, n delay units Ui (i=1 to n) and m delay units bdi (i=1 to m) constitute r blocks B(1), B(2) . . . B(r).

For example, the block B(1) consists of two delay units U1 and U2 and one delay unit bd1. The delay unit U1 generates control pules Q1 and $\overline{Q1}$, and the delay unit U2 generates control pulses Q2 and $\overline{Q2}$. In the backward delay section k/jBD 37 shown in FIG. 42, the control pulses Q2 and $\overline{Q2}$ output by the delay unit U2 are supplied to the delay unit bd1. On the other hand, in the backward delay section k/jBD 37 shown in FIG. 43, the control pulses Q1 and $\overline{Q1}$ output by the delay unit U1 are supplied to the delay unit bd1.

Similarly, the block B(r) consists of two delay units Un-1 and Un and one delay unit bdm. The delay unit Un-1 generates control pules Qm-1 and $\overline{Qn-1}$, and the delay unit Um generates control pulses Qn and $\overline{Qn}$. In the backward delay section k/jBD 37 (FIG. 42), the control pulses Qn and $\overline{Qn}$ output by the delay unit Un are supplied to the delay unit bd. In the backward delay section k/jBD 37 shown in FIG. 43, the control pulses Qn-1 and $\overline{Qn-1}$ output by the delay unit Un-1 are supplied to the delay unit bdm.

In the fourth embodiment (FIG. 39), one delay unit of the half backward delay section HBD is provided for every two delay units of the backward delay section BD. Thus, the backward delay section BD delays a rearward pulse by time $\Delta$, whereas the half backward delay section HBD delays a rearward pulse by $\Delta/2$.

Since the n delay units Ui and m delay units bdi constitute r blocks, the delay units bd11 to bdm of the section HBD are uniformly distributed for the delay units U1 to Un of the SAD array—that is, one delay unit bdi is provided for every two adjacent SAD delay units. Therefore, the half backward delay section HBD can delay a rearward pulse, exactly by $\Delta/2$.

Figure 44:
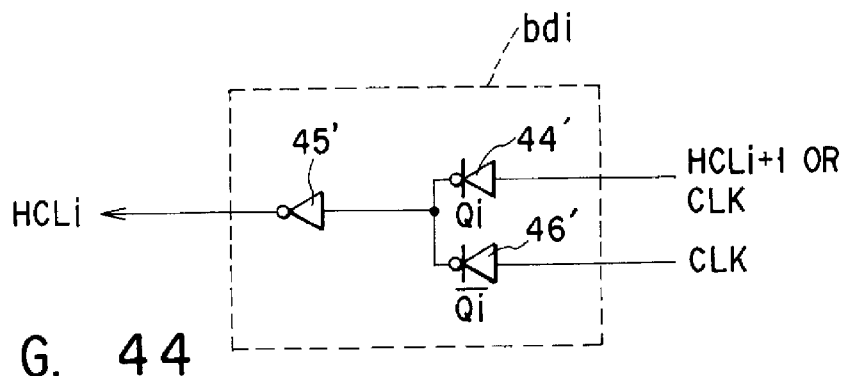
FIG. 44 is a diagram illustrating one of the identical delay units constituting the half backward delay section shown in FIGS. 42 and 43.

FIG. 44 illustrates one of the delay units bd1 to bdn which constitute the half backward delay section shown in FIGS. 42 and 43. The delay unit bdi is identical to the rearward pulse delay circuit of the delay unit Ui shown in FIG. 40. That is, the unit bdi comprises three inverters 44' to 46'.

The inverters 44' and 45' are connected in series. The inverter 44' receives either the output signal HCLi+1 of the following delay unit or the internal clock signal CLK. The inverter 45' receives the output signal HCLi of the preceding delay unit. The inverter 44' is a clocked inverter, which is controlled by a control pulse Qi. The inverter 44' is active only while the control pule Qi is at "1" level. The inverter 46' has its output terminal connected to the input terminal of the inverter 45'. The input terminal of the inverter 46' receives the internal clock signal CLK at all times. The inverter 46' is also a clocked inverter and controlled by a control pulse $\overline{Qi}$. It remains active while the control pulse $\overline{Q}$ is at "1" level.

Figure 45:
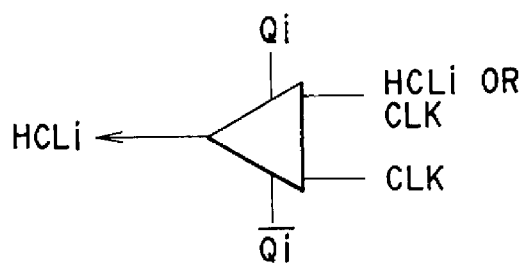
FIG. 45 is a symbol of the delay unit shown in FIG. 44.

FIG. 45 is a symbol representing the delay unit bdi the structure of which is illustrated in FIG. 44.

Figure 46:
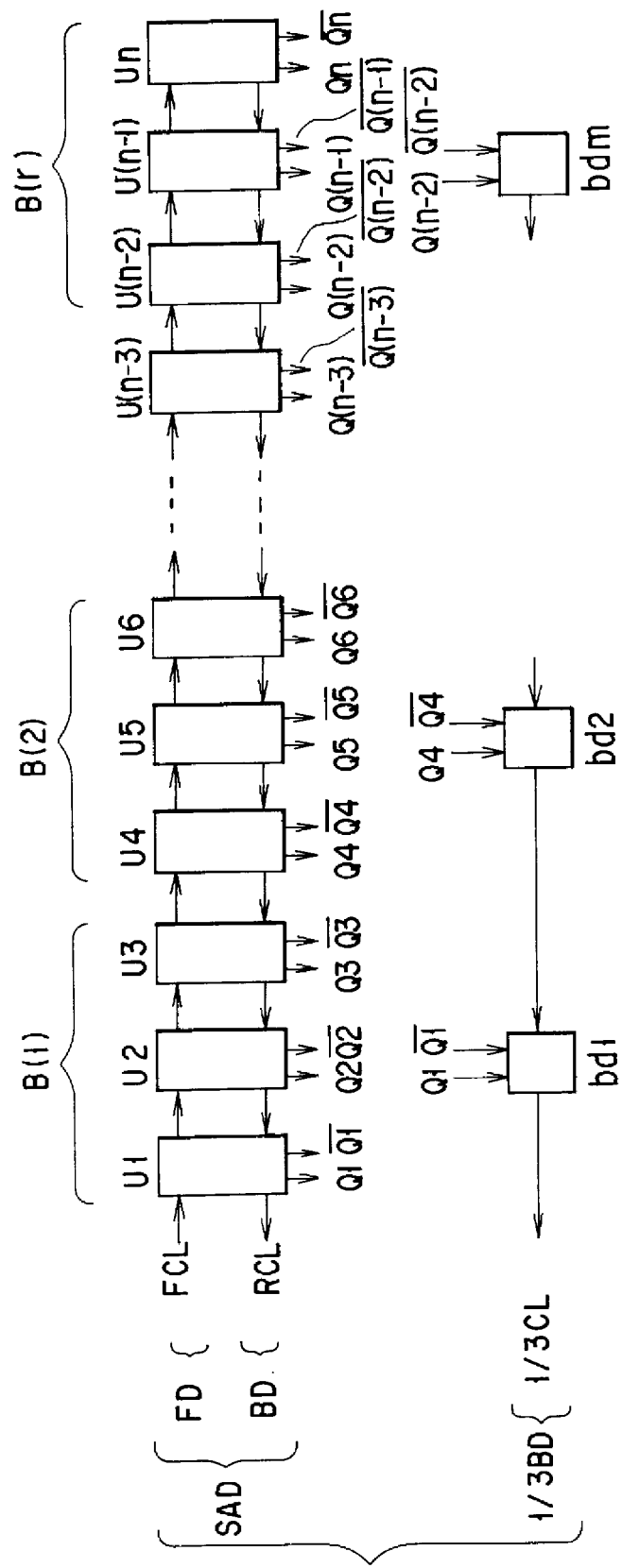
FIG. 46 is a diagram showing a 1/3BD delay section which may be used as the k/j backward delay section k/jBD in the fourth embodiments.

FIG. 46 shows still another example of the k/j backward delay section k/jBD 37 illustrated in FIG. 39. In this example, j=3, k=1. Stated in another way, this is a 1/3 backward delay section designed to generate a signal which is delayed by T/3 with respect to the external clock CK.

As shown in FIG. 46, the 1/3 backward delay section 1/3BD is composed of m delay units bd1 to bdm. Each unit bdi has the same structure as the rearward pulse delay circuit bdi of the SAD delay unit Ui. Therefore, the ratio of the time by which the section BD delays the rearward pulse to the time by which the 1/3BD section delays the rearward pulse is equal to the ratio of the number of delay units provided in the section BD to the number of delay units provided in the 1/3BD section. More specifically, n delay units Ui (i=1 to n) and m delay units bdi (i=1 to m) constitute r blocks B(1), B(2), . . . B(r).

For example, the block B(1) consists of three delay units U1 to U3 and one delay unit bd1. The delay unit U1 generates control pules Q1 and $\overline{Q1}$, which are supplied to the delay unit bd1. Instead of the control pulses Q1 and $\overline{Q1}$, the control pulses outputs from the delay unit U2 or U3 may be supplied to the delay unit bd1.

In the embodiment shown in FIG. 46, one delay unit of the 1/3 backward delay section 1/3BD is provided for every three delay units of the SAD array. Thus, the backward delay section BD delays a rearward pulse by time $\Delta$, whereas the delay section 1/3BD delays a rearward pulse by $\Delta/3$.

Since the n delay units U1 to Un and the m delay units bd1 to bdm constitute r blocks, the delay units bd11 to bdm of the section 1/3BD are uniformly distributed for the delay units U1 to Un of the SAD array—that is, one delay unit bdi is provided for every three adjacent SAD delay units. Therefore, the half backward delay section HBD can delay a rearward pulse, exactly by $\Delta/3$.

FIG. 47 shows still another example of the k/j backward delay section k/jBD 37 illustrated in FIG. 39. In this example, j=3, k=2; this example is a 2/3 backward delay section designed to generate a signal which is delayed by 2T/3 with respect to the external clock CK.

As shown in FIG. 47, the 2/3 backward delay section 2/3BD is composed of m delay units bd1 to bdm. Each unit bdi has the same structure as the rearward pulse delay circuit bdi of the SAD delay unit Ui. Therefore, the ratio of the time by which the section BD delays the rearward pulse to the time by which the 2/3BD section delays the rearward pulse is equal to the ratio of the number of delay units provided in the section BD to the number of delay units provided in the 2/3BD section. More specifically, n delay units Ui (i=1 to n) and m delay units bdi (i=1 to m) constitute r blocks B(1), B(2), . . . B(r).

For example, the block B(1) consists of three delay units U1 to U3 and two delay units bd1 and bd2. The delay unit U1 generates control pules Q1 and $\overline{Q1}$, which are supplied to the delay unit bd1. The delay unit U3 generates control pules Q3 and $\overline{Q3}$, which are supplied to the delay unit bd2. Instead of the control pulses Q1 and $\overline{Q1}$, the control pulses Q2 and $\overline{Q2}$ output from the delay unit U2 may be supplied to the delay unit bd1. Further, instead of the control pulses Q3 and $\overline{Q3}$, the control pulses Q2 and $\overline{Q2}$ output from the delay unit U2 may be supplied to the delay unit bd3.

In the embodiment shown in FIG. 47, two delay unit of the 2/3 backward delay section 2/3BD are provided for every three delay units of the SAD array. Thus, the backward delay section BD delays a rearward pulse by time $\Delta$, whereas the delay section 2/3BD delays a rearward pulse by $2\Delta/3$.

Since the n delay units U1 to Un and the m delay units bd1 to bdm constitute r blocks, the delay units bd11 to bdm of the section 2/3BD are uniformly distributed for the delay units U1 to Un of the SAD units U1 to Un—that is, two delay unit bdi are provided for every three adjacent SAD delay units. Therefore, the half backward delay section 2/3BD can delay a rearward pulse, exactly by $2\Delta/3$.

FIG. 48 is another diagram showing the k/jBD section shown in FIG. 39. FIG. 49 illustrates one of the identical blocks of a SAD array shown in FIG. 39.

As seen from FIG. 48, the SAD array is composed of r blocks B(1) to B(r). Each block includes j delay units. The k/jBD section is composed of r blocks B(1) to B(r), too. Each block of the k/jBD section includes k delay units. Both j and k are natural numbers. Generally, j>k. Composed of r blocks, each including j delay units, the SAD array has r×j delay units in all. Composed of r blocks, each including k delay units, the k/jBD section has r×k delay units in all. The SAD array and the k/jBD section has the same number of blocks. The blocks B(1), B(2), . . . B(r) of the SAD array are associated with the blocks B(1), B(2), B(r) of the k/jBD section, respectively.

The block B(1) of the SAD array generates j pairs of control pulses, Q1 and $\overline{Q1}$, Q2 and $\overline{Q2}$, . . . Qj and $\overline{Qj}$. From the j pairs of control pulses, k pairs (k<j) are selected from the j pairs in regular and uniform fashion. The k pairs thus selected are supplied to the k delay units of the block B(1) of the k/jBD section. Suppose the control pulses Q1, $\overline{Q1}$, Q2 and $\overline{Q2}$ are selected. Then, the pulses Q1 and $\overline{Q1}$ are supplied to the delay unit bd1 of the k/jBD section, not to the delay unit bd2, and the pulses Q2 and $\overline{Q2}$ are supplied to the delay unit bd2, not to the delay unit bd1.

Thus, the ratio of the number of SAD delay units to the number of k/jBD delay units is equal to m/n, namely k/j=m/n, regardless of the positions the k/jBD delay units which receive the forward pulses from the SAD delay units. In other words, the k/jBD section can delay a rearward pulse, exactly by $k/j\Delta$, no matter which position the k/jBD delay units take which receive forward pulses.

Figure 50:
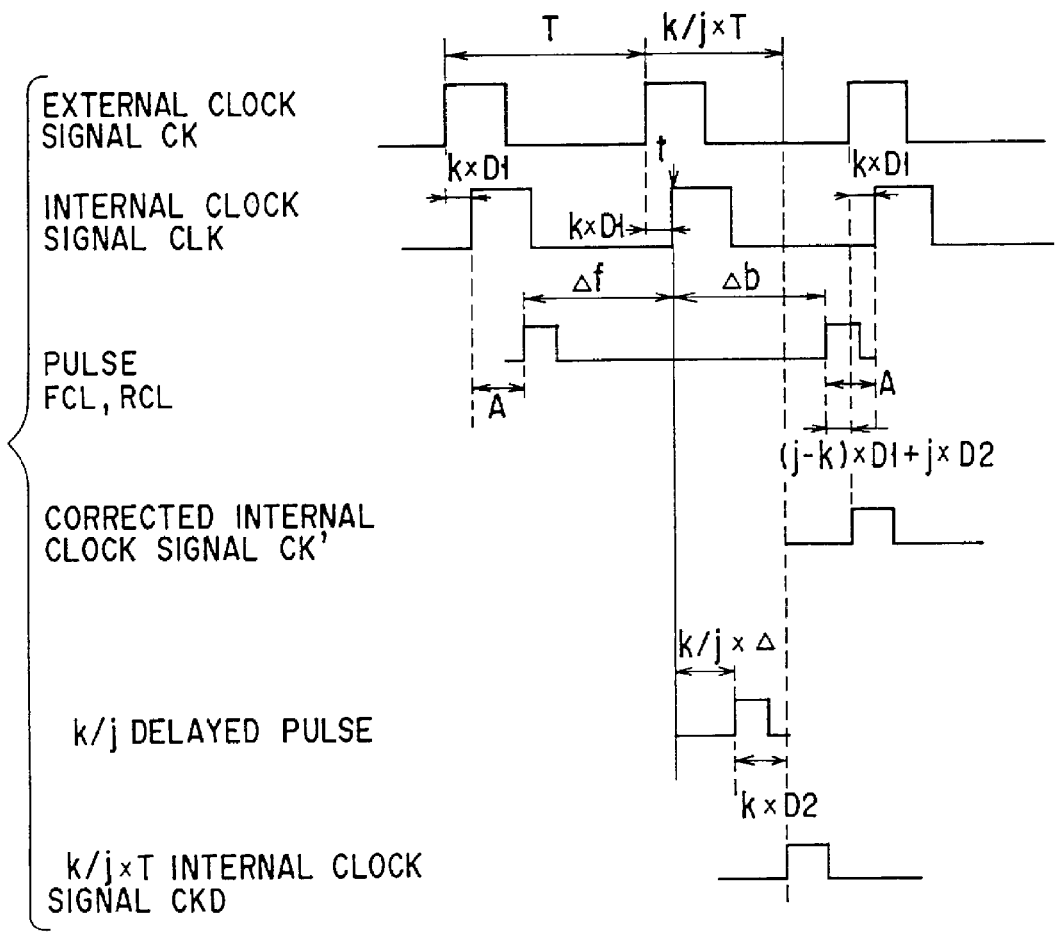
FIG. 50 is a timing chart for explaining the operating principle of the third embodiment shown in FIG. 36.

The operating principle of the third embodiment (FIG. 36) will be explained, with reference to the timing chart of FIG. 50.

Suppose the internal clock signal CLK has a skew of k×D1 with respect to the external clock signal CK, and that both clock signals CLK and CK have a cycle T. A forward clock CL is generated upon lapse of time A from the leading edge of the first pulse of the internal clock signal CLK. In this case, the second pulse of the internal clock signal CLK is generated upon lapse of time Δf from the generation of the forward clock CL. Further, a forward clock RCL is generated upon lapse of time Δb from the generation of the second pulse of the signal CLK. Time Δb is equal to time Δf (Δf=Δb=Δ). That is, the forward clock RCL is generated upon lapse of time 2×Δ from the generation of the forward clock CL. Therefore, the time A lapses at the very time the third pulse of the internal clock pulse CLK is generated. It should be noted that (A+W)<T, where W is the width of the forward clocks CL and RCL.

Assume that the third pulse of the internal clock signal CLK is generated upon lapse of time of (j−k)×D1+j×D2 from the generation of the forward clock RCL. Then, the corrected internal clock signal CK' which is synchronous with the external clock signal CK can be obtained, merely by delaying the pulse RCL by time (j−k)×D1+j×D2. To obtain the corrected internal clock signal CK', it suffices to use delay circuits which have delay times A, (2×Δ), and (j−k)×D1+j×D2, and to delay the internal clock signal CLK by the time A+(2×Δ)+{(j−k)×D1+j×D2}. The delay time (2×Δ) is provided by the SAD array, and the delay time (j−k)×D1+j×D2 is provided by delay elements. The delay time A is determined as follows:

$$k \times D1 + A + \Delta = T + k \times D1 \qquad (1)$$

From Equation 1 there derives the following equation:

$$k \times D1 + A + 2\Delta + (j-k) \times D1 + j \times D2 = 2T \qquad (2)$$

Equations 1 and 2 reduce to:

$$T = A + \Delta \qquad (3)$$

$$A + 2\Delta + j(D1+D2) = 2T \qquad (4)$$

From Equations 3 and 4, we obtain:

$$A + 2\Delta + j(D1+D2) = 2(A+\Delta) \therefore A = j(D1+D2) \qquad (5)$$

How the internal clock signal CKD delayed by (k/j)×T with respect to the external clock signal CK is generated will be explained below.

A delay time (k/j)×Δ is provided, and a delayed pulse k/jCL is generated upon lapse of time Δ+(k/j)×Δ from the generation of the forward clock CL. Furthermore, the internal clock signal CKD is generated upon lapse of time k×D2 from the generation of the delayed pulse k/jCL. As clear from FIG. 50, the signal CKD is delayed with respect to the external clock signal CK by the time given as follows:

$$k \times D1 + (k/j) \times \Delta + k \times D2 \qquad (6)$$

Equation 6 is transformed to:

$$(k/j) \times (j \times D1 + \Delta + j \times D2) = (k/j) \times \{j(D1+D2) + \Delta\} \qquad (7)$$

Substituting Equations 3 and 5 into Equation 7, we obtain the following:

$$(k/j) \times T \qquad (8)$$

Equation 8 means that the internal clock signal CKD is delayed in phase by (k/j)×T with respect to the external clock signal CK. Thus, the signal CKD delayed by (k/j)×T with respect to the signal CK can be generated by delaying the internal clock signal CLK by time A+{Δ+(k/j)×Δ}+k×D2, by using delay circuits which have delay times A, Δ+(k/j)×Δ, and k×D2. The delay time Δ is provided by the forward delay section FD of the SAD array, and the delay time k×D2 by the delay elements. The delay time A is j×(D1+D2), provided in accordance with Equation 5.

Figure 51:
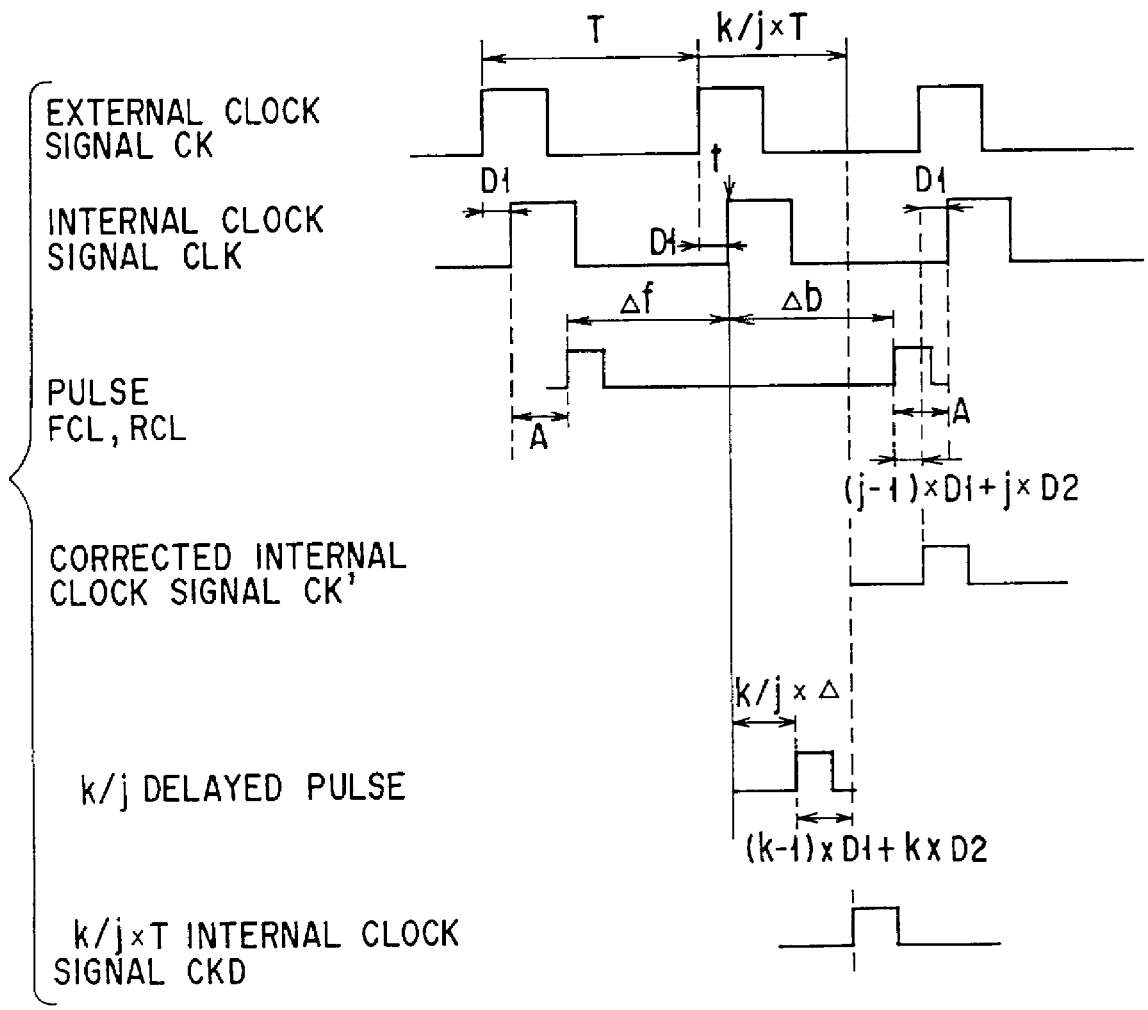
FIG. 51 is a diagram for explaining the operating principle of the fourth embodiment shown in FIG. 37.

The operating principle of the fourth embodiment shown in FIG. 37 will now be explained with reference to the timing chart of FIG. 51.

Suppose the internal clock signal CLK has a skew of D1 with respect to the external clock signal CK, and that both clock signals CLK and CK have a cycle T. A forward clock CL is generated upon lapse of time A from the leading edge of the first pulse of the internal clock signal CLK. In this case, the second pulse of the internal clock signal CLK is generated upon lapse of time Δf from the generation of the forward clock CL. Further, a forward clock RCL is generated upon lapse of time Δb from the generation of the second pulse of the signal CLK. Time Δb is equal to time Δf (Δf=Δb=Δ). That is, the forward clock RCL is generated upon lapse of time 2×Δ from the generation of the forward clock CL. Therefore, the time A lapses at the very time the third pulse of the internal clock pulse CLK is generated. It should be noted that (A+W)<T, where W is the width of the forward clocks CL and RCL.

Assume that the third pulse of the internal clock signal CLK is generated upon lapse of time of (j−1)×D1+j×D2 from the generation of the forward clock RCL. Then, the corrected internal clock signal CK' which is synchronous with the external clock signal CK can be obtained, merely by delaying the pulse RCL by time (j−1)×D1+j×D2. To obtain the corrected internal clock signal CK', it suffices to use delay circuits which have delay times A, (2×Δ), and (j−1)×D1+j×D2, and to delay the internal clock signal CLK by the time A+(2×Δ)+{(j−1)×D1+j×D2}. The delay time (2×Δ) is provided by the SAD array, and the delay time (j−1)×D1+j×D2 is provided by delay elements. The delay time A is determined as follows. As seen from FIG. 50:

$$D1 + A + \Delta = T + D1 \qquad (9)$$

$$D1 + A + 2\Delta + (j-1) \times D1 + j \times D2 = 2T \qquad (10)$$

From Equations 9 and 10 there derives the following equations, respectively:

$$T = A + \Delta \qquad (11)$$

$$A + 2\Delta + j(D1+D2) = 2T \qquad (12)$$

Equations 11 and 12, we obtain:

$$A + 2\Delta + j(D1+D2) = 2(A+\Delta) \therefore A = j(D1+D2) \qquad (13)$$

How the internal clock signal CKD delayed by (k/j)×T with respect to the external clock signal CK is generated will be explained below.

A delay time (k/j)×Δ(Δ=Δf=Δb) is provided, and a delayed pulse k/jCL is generated upon lapse of time Δ+(k/j)×Δ from the generation of the forward clock CL. Furthermore, the internal clock signal CKD is generated upon lapse of time (k−1)×D2+k×D2 from the generation of the delayed pulse k/jCL. As clear from FIG. 51, the signal CKD is delayed with respect to the external clock signal CK by the time given as follows:

$$D1+(k/j)\times\Delta+(k-1)\times D1+k\times D2 \qquad (14)$$

Equation 14 is transformed to:

$$(k/j)\times(j\times D1+\Delta+j\times D2)=(k/j)\times\{n(D1+D2)+\Delta\} \qquad (15)$$

Substituting Equations 11 and 12 into Equation 15, we obtain the following:

$$(k/j)\times T \qquad (16)$$

Equation 16 means that the internal clock signal CKD is delayed in phase by (k/j)×T with respect to the external clock signal CK. Thus, the signal CKD delayed by (k/j)×T with respect to the signal CK can be generated by delaying the internal clock signal CLK by time A+{Δ+(k/j)×Δ}+k× D2, by using delay circuits which have delay times A, Δ+(k/j)×Δ, and k×D2. The delay time Δ is provided by the forward delay section FD of the SAD array, and the delay time k×D2 by the delay elements. The delay time A is j×(D1+D2), provided in accordance with Equation 13.

Figure 52:
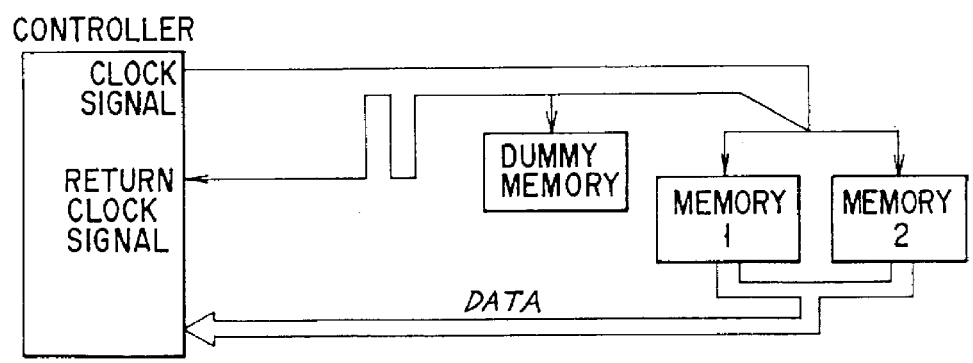
FIG. 52 is a diagram representing a memory system which incorporates a clock control circuit of the invention.

FIG. 52 shows a memory system which incorporates a clock control circuit of the invention.

As shown in FIG. 52, the memory system comprises a controller and a memory section. The controller generates an external clock signal and receives data from the memory. The memory section outputs data in synchronism with the internal clock signal generated from the external clock signal.

The external clock signal and the internal clock have the same phase relationship as has been described above, so that data may be correctly read from the memory section. The technique of causing the controller to correctly receive the data thus read will be described below.

Like most memory systems, the memory system shown in FIG. 52 comprises a controller (CPU) and a plurality of memories (ICs) 1 and 2. The external clock signal CK needs some time to travel from the controller to the memories 1 and 2. The length of the line connecting the controller to the memory 1 is equalized to that of the line connecting the controller to the memory 2. The memory 1 or the memory 2 outputs data in synchronism with the internal clock signal which has a specific phase relation with the external clock signal. The data output from the memory 1 or 2 is supplied to the controller through a data bus.

It takes the data some time to travel from the memory 1 or 2 to the controller, depending on the length and capacitance of the data bus. The controller must receive the data correctly, in spite of the time the data requires to reach the controller. To enable the controller to receive the data correctly, a dummy memory (IC) is used which has the same storage capacity as the memories 1 and 2, and the line for supplying the external clock signal from the controller to the dummy has the same length as the lines which supply the external clock signal from the controller to the memories 1 and 2.

The external clock signal CK input to the dummy memory is returned to the controller. This signal CK, or the return clock signal, determines the timing the controller receives the data output from the memory 1 or the memory 2. Hence, the length of the line for supplying the return clock signal from the dummy memory to the controller is made equal to the length of the data bus for supplying data from the memory 1 or the memory 2 to the controller.

The controller receives the data from the memory 1 or 2 in synchronism with the return clock signal. No erroneous data will be supplied to the controller.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A delay array having a plurality of delay units, each comprising:

a forward pulse delay circuit for delaying a forward pulse by a predetermined time and supplying the forward pulse thus delayed to the succeeding delay unit;

a rearward pulse delay circuit for delaying a rearward pulse by said predetermined time and supplying the rearward pulse thus delayed to the preceding delay unit; and a state-holding section which is set upon receipt of the forward pulse when no pulses of an internal clock signal are input to said delay units, and which is reset upon receipt of the rearward pulse when the pulses of the internal clock signals are input to said delay units, wherein said forward pulse is input to the first delay unit, a front edge of said rearward pulse is generated by that one of the delay units whose state-holding sections are reset by the pulses of the internal clock signal, which is located most close to the first delay unit, and said rearward pulse is generated by the first delay unit.

2. A delay array according to claim 1, wherein an edge of said rearward pulse, other than the front edge, is generated by that one of the delay units whose state-holding sections are reset when the pulses of the internal clock signal ceases to be supplied to said delay units, which is located most close to the first delay unit.

3. A clock control circuit comprising:

a plurality of delay units connected in series, each comprising: a forward pulse delay circuit for delaying a forward pulse by a predetermined time and supplying the forward pulse thus delayed to the succeeding delay unit; a rearward pulse delay circuit for delaying a rearward pulse by said predetermined time and supplying the rearward pulse thus delayed to the preceding delay unit; and a state-holding section which is set upon receipt of the forward pulse when no pulses of an internal clock signal are input to said delay units, and which is reset upon receipt of the rearward pulse when the pulses of the internal clock signals are input to said delay units, wherein said forward pulse is input to the first delay unit, a front edge of said rearward pulse is generated by that one of the delay units whose state-holding sections are reset by the pulses of the internal clock signal, which is located most close to the first delay unit, and said rearward pulse is generated by the first delay unit;

a buffer having a delay time D1, for generating said internal clock signal from an external clock signal;

a first delay circuit for delaying the pulses of the internal clock signal by a time A and supplying the pulses thus delayed, as forward pulses, to the first delay unit; and a second delay circuit for delaying the rearward pulses output from the first delay unit, by a time D2, and supplying the rearward pulses thus delayed, as a corrected internal clock signal, wherein the time D1, the time D2 and the time A have the relationship of: A=D1+D2.

4. A clock control circuit according to claim 3, further comprising a control pulse generating circuit for generating a control pulse for initializing said forward pulse delay circuit of each delay unit, within a period between the time the pulses of the internal clock signal are input to said delay units and the time the forward pulse is supplied to the first delay unit.

5. A clock control circuit according to claim 3, further comprising control means for preventing the rearward pulse output from the first delay unit from passing through said second delay circuit when the forward pulse is output from the last delay unit, thereby to supply a pulse of the internal clock signal from said second delay circuit, instead of the rearward pulse.

6. A clock control circuit according to claim 5, wherein said control means initializes said second delay circuit in accordance with the rearward pulse output from the first delay unit after the second delay circuit has output the pulse of the internal clock pulse.

7. A clock control circuit according to claim 3, wherein said delay units are located between said buffer and said second delay circuit, and said first delay circuit is composed of a first group of patterns similar to those of said buffer and wiring patterns extending from said buffer to said delay units and a second group of patterns similar to those of said second delay circuit and wiring patterns extending from said delay units to said second delay circuit.

8. A memory circuit comprising:
   a memory cell array;
   a write/read circuit for writing data into and reading data from said memory cell array;
   an input circuit for receiving the data from a bus;
   an output circuit for supplying data to the bus;
   a plurality of delay units connected in series, each comprising: a forward pulse delay circuit for delaying a forward pulse by a predetermined time and supplying the forward pulse thus delayed to the succeeding delay unit; a rearward pulse delay circuit for delaying a rearward pulse by said predetermined time and supplying the rearward pulse thus delayed to the preceding delay unit; and a state-holding section which is set upon receipt of the forward pulse when no pulses of an internal clock signal are input to said delay units, and which is reset upon receipt of the rearward pulse when the pulses of the internal clock signals are input to said delay units, wherein said forward pulse is input to the first delay unit, a front edge of said rearward pulse is generated by that one of the delay units whose state-holding sections are reset by the pulses of the internal clock signal, which is located most close to the first delay unit, and said rearward pulse is generated by the first delay unit;
   a buffer having a delay time D1, for generating said internal clock signal from an external clock signal;
   a first delay circuit for delaying the pulses of the internal clock signal by a time A and supplying the pulses thus delayed to the first delay unit; and
   a second delay circuit for delaying the rearward pulses output from the first delay unit, by a time D2, and supplying the rearward pulses thus delayed, as a corrected internal clock signal,
   wherein the time D1, the time D2 and the time A have the relationship of: A=D1+D2, said write/read circuit is controlled by the internal clock signal output from said buffer, and said input circuit and said output circuit are controlled by the corrected internal clock signal output from said second delay circuit.

9. A memory system comprising:
   a memory cell array;
   a write/read circuit for writing data into and reading data from said memory cell array;
   an input circuit for receiving the data from a bus;
   an output circuit for supplying data to the bus;
   a plurality of delay units connected in series, each comprising: a forward pulse delay circuit for delaying a forward pulse by a predetermined time and supplying the forward pulse thus delayed to the succeeding delay unit; a rearward pulse delay circuit for delaying a rearward pulse by said predetermined time and supplying the rearward pulse thus delayed to the preceding delay unit; and a state-holding section which is set upon receipt of the forward pulse when no pulses of an internal clock signal are input to said delay units, and which is reset upon receipt of the rearward pulse when the pulses of the internal clock signals are input to said delay units, wherein said forward pulse is input to the first delay unit, a front edge of said rearward pulse is generated by that one of the delay units whose state-holding sections are reset by the pulses of the internal clock signal, which is located most close to the first delay unit, and said rearward pulse is generated by the first delay unit;
   a buffer having a delay time D1, for generating said internal clock signal from an external clock signal;
   a first delay circuit for delaying the pulses of the internal clock signal by a time A and supplying the pulses thus delayed to the first delay unit;
   a second delay circuit for delaying the rearward pulses output from the first delay unit, by a time D2, and supplying the rearward pulses thus delayed, as a corrected internal clock signal;
   a bus; and
   a control block for supplying data to and receiving data from said bus and for generating the external clock signal,
   wherein the time D1, the time D2 and the time A have the relationship of: A=D1+D2, said write/read circuit is controlled by the internal clock signal output from said buffer, and said input circuit and said output circuit are controlled by the corrected internal clock signal output from said second delay circuit.

10. A delay array comprising a plurality of delay units connected in series, each comprising delay circuits for delaying a forward pulse and a rearward pulse by predetermined delay times and for transferring the forward and rearward pulses thus delayed, not in synchronism with each other, and a state-holding section which is set upon receipt of the forward pulse and which is reset upon receipt of the rearward pulse,
   wherein said forward pulse is input to the first delay unit, a front edge of said rearward pulse is generated by that one of the delay units whose state-holding sections are reset by the pulses of the internal clock signal when the pulses of the internal clock signals are input to said delay units, which is located most close to the first delay unit, and said rearward pulse travels in a direction opposite to the direction in which the forward pulse travels and is output from the first delay unit.

11. A delay array comprising:
   a plurality of first delay units connected in series, each comprising: a forward pulse delay circuit for delaying a forward pulse by a first predetermined time and supplying the forward pulse thus delayed to the succeeding delay unit; a first rearward pulse delay circuit for delaying a first rearward pulse by said first predetermined time and supplying the first rearward pulse thus delayed to the preceding delay unit; and a state-holding section which is set upon receipt of the forward pulse when no pulses of an internal clock signal are input to said delay units, and which is reset upon receipt of the first rearward pulse when the pulses of the internal clock signals are input to said delay units; and a plurality of second delay units connected in series, each comprising: a second rearward pulse delay circuit for delaying a second rearward pulse by a second predetermined time and supplying the second rearward pulse thus delayed to the preceding delay unit, wherein said forward pulse is input to the first delay unit at the first stage; a front edge of the first rearward pulse is generated by that one of the delay units whose state-holding sections are reset by the pulses of the internal clock signal when the pulses of the internal clock signals are input to said delay units, which is located most close to the first delay unit; the first rearward pulse is generated by the first delay unit at the first stage; a front edge of said second rearward pulse is generated by the second delay unit which corresponds to the first delay unit which generates the front edge of the first rearward pulse; the second rearward pulse is generated by the second delay unit at the first stage; and each second delay unit has the same structure as that part of each first delay unit which transfers the first rearward pulse.

12. A delay array according to claim 11, wherein an edge of said first rearward pulse, other than the front edge, is generated by that one of the delay units whose state-holding sections are reset when the pulses of the internal clock signal ceases to be supplied to said delay units, which is located most close to the first delay unit.

13. A delay array according to claim 11, wherein the number of the first delay units differs from the number of the second delay units.

14. A delay array according to claim 11, wherein the number of the second delay units is smaller than the number of the first delay units.

15. A delay array according to claim 11, wherein, of said first delay units, j adjacent delay units constitute a first block, and of said second delay units, k adjacent delay units constitute a second block associated with the first block, where j and k are natural numbers and j>k; and the k delay units constituting the second block are controlled by control pulses output from k first delay units included in the first block.

16. A delay array according to claim 15, wherein said first delay units constitute r blocks, each consisting of j first delay units, and are provided in a total number of n (=r×j); and said second delay units constitute r blocks, each consisting of k second delay units, and are provided in a total number of m (=r×k).

17. A clock control circuit comprising:

a plurality of first delay units connected in series, each comprising: a forward pulse delay circuit for delaying a forward pulse by a first predetermined time and supplying the forward pulse thus delayed to the succeeding delay unit; a first rearward pulse delay circuit for delaying a first rearward pulse by the first predetermined time and supplying the first rearward pulse thus delayed to the preceding delay unit; and a state-holding section which is set upon receipt of the forward pulse when no pulses of an internal clock signal are input to said delay units, and which is reset upon receipt of the first rearward pulse when the pulses of the internal clock signals are input to said delay units;

a plurality of second delay units connected in series, each comprising: a second rearward pulse delay circuit for delaying a second rearward pulse by a second predetermined time and supplying the second rearward pulse thus delayed to the preceding delay unit, a buffer having a delay time D1, for generating said internal clock signal from an external clock signal;

a first delay circuit for delaying the pulses of the internal clock signal by a time A and supplying the pulses thus delayed to the first delay unit;

a second delay circuit for delaying the first rearward pulses output from the first delay unit, by a time $(j-1) \times D1 + j \times D2$, and supplying the first rearward pulses thus delayed, as a first corrected internal clock signal; and a third delay circuit for delaying the second rearward pulses output from said second delay unit, by a time $(k-1) \times D1 + k \times D2$, and supplying the second rearward pulses thus delayed, as a second internal clock signal;

wherein said forward pulse is input to the first delay unit at the first stage; a front edge of the first rearward pulse is generated by that one of the delay units whose state-holding sections are reset by the pulses of the internal clock signal when the pulses of the internal clock signals are input to said delay units, which is located most close to the first delay unit; the first rearward pulse is generated by the first delay unit at the first stage; a front edge of said second rearward pulse is generated by the second delay unit which corresponds to the first delay unit which generates the front edge of the first rearward pulse; the second rearward pulse is generated by the second delay unit at the first stage; each second delay unit has the same structure as that part of each first delay unit which transfers the first rearward pulse; and the time D1, the time D2 and the time A have the relationship of: $A = D1 + D2$.

18. A clock control circuit comprising:

a plurality of first delay units connected in series, each comprising: a forward pulse delay circuit for delaying a forward pulse by a first predetermined time and supplying the forward pulse thus delayed to the succeeding delay unit; a first rearward pulse delay circuit for delaying a first rearward pulse by the first predetermined time and supplying the first rearward pulse thus delayed to the preceding delay unit; and a state-holding section which is set upon receipt of the forward pulse when no pulses of an internal clock signal are input to said delay units, and which is reset upon receipt of the first rearward pulse when the pulses of the internal clock signals are input to said delay units;

a plurality of second delay units connected in series, each comprising: a second rearward pulse delay circuit for delaying a second rearward pulse by a second predetermined time and supplying the second rearward pulse thus delayed to the preceding delay unit, a buffer having a delay time $k \times D1$, for generating said internal clock signal from an external clock signal;

a first delay circuit for delaying the pulses of the internal clock signal by a time A and supplying the pulses thus delayed to the first delay unit;

a second delay circuit for delaying the first rearward pulses output from the first delay unit, by a time $(j-k) \times D1 + j \times D2$, and supplying the first rearward pulses thus delayed, as a first corrected internal clock signal; and a third delay circuit for delaying the second rearward pulses output from said second delay unit, by a time $k \times D2$, and supplying the second rearward pulses thus delayed, as a second internal clock signal;

wherein said forward pulse is input to the first delay unit at the first stage; a front edge of the first rearward pulse is generated by that one of the delay units whose state-holding sections are reset by the pulses of the internal clock signal when the pulses of the internal clock signals are input to said delay units, which is located most close to the first delay unit; the first rearward pulse is generated by the first delay unit at the first stage; a front edge of said second rearward pulse is generated by the second delay unit which corresponds to the first delay unit which generates the front edge of the first rearward pulse; the second rearward pulse is generated by the second delay unit at the first stage; each second delay unit has the same structure as that part of each first delay unit which transfers the first rearward pulse; and the time D1, the time D2 and the time A have the relationship of: $A = D1 + D2$.

19. A clock control circuit according to claim 17, further comprising a control pulse generating circuit for generating a control pulse for initializing said forward pulse delay circuit of each first delay unit, within a period between the time the pulses of the internal clock signal are input to the first delay unit and the time the forward pulse is supplied to the first delay unit at the first stage.

20. A clock control circuit according to claim 18, wherein the number of the first delay units differs from the number of the second delay units.

21. A clock control circuit according to claim 18, wherein the number of the second delay units is smaller than the number of the first delay units.

22. A clock control circuit according to claim 17, wherein, of said first delay units, j adjacent delay units constitute a first block, and of said second delay units, k adjacent delay units constitute a second block associated with the first block, where j and k are natural numbers and j>k; and the k delay units constituting the second block are controlled by control pulses output from k first delay units included in the first block.

23. A clock control circuit according to claim 22, wherein said first delay units constitute r blocks, each consisting of j first delay units, and are provided in a total number of n ($=r \times j$); and said second delay units constitute r blocks, each consisting of k second delay units, and are provided in a total number of m ($=r \times k$).

24. A clock control circuit according to claim 23, wherein the second delay circuit of each second delay unit provides $k/j$ ($=m/n$) times the delay time provided by the delay circuit of each first delay unit.

25. A clock control circuit according to claim 23, wherein $k=j/2$, the delay circuit of each second delay unit provides half the delay time provided by the delay circuit of each first delay unit.

26. A clock control circuit according to claim 23, wherein $k=1$, and the delay circuit of each second delay unit provides $1/j$ ($=1/n$) times the delay time provided by the delay circuit of each first delay unit.

* * * * *

UNITED STATES PATENT AND TRADEMARK OFFICE
CERTIFICATE OF CORRECTION

PATENT NO.   : 5,867,432
DATED        : February 2, 1999
INVENTOR(S)  : Haruki Toda It is certified that error appears in the above-identified patent and that said Letters Patent is hereby corrected as shown below:

On the front page, insert the following:

-- [30]   Foreign Application Priority Data
    Apr. 23, 1996 [JP]   Japan ....... 8-100976
    Apr. 17, 1997 [JP]   Japan ....... 9-100490--.

Signed and Sealed this

Twenty-first Day of December, 1999

*Attest:*

Q. TODD DICKINSON

*Attesting Officer*      *Acting Commissioner of Patents and Trademarks*